(12) United States Patent
Han et al.

(10) Patent No.: US 11,908,899 B2
(45) Date of Patent: Feb. 20, 2024

(54) MOSFET AND MEMORY CELL HAVING IMPROVED DRAIN CURRENT THROUGH BACK BIAS APPLICATION

(71) Applicant: Zeno Semiconductor, Inc., Sunnyvale, CA (US)

(72) Inventors: Jin-Woo Han, San Jose, CA (US); Yuniarto Widjaja, Cupertino, CA (US); Zvi Or-Bach, San Jose, CA (US); Dinesh Maheshwari, Fremont, CA (US)

(73) Assignee: Zeno Semiconductor, Inc., Sunnyvale, CA (US)

(*) Notice: Subject to any disclaimer, the term of this patent is extended or adjusted under 35 U.S.C. 154(b) by 106 days.

(21) Appl. No.: 17/535,473

(22) Filed: Nov. 24, 2021

(65) Prior Publication Data
US 2022/0085168 A1 Mar. 17, 2022

Related U.S. Application Data

(60) Division of application No. 16/714,443, filed on Dec. 13, 2019, now Pat. No. 11,201,215, which is a
(Continued)

(51) Int. Cl.
*H01L 29/10* (2006.01)
*H01L 21/8238* (2006.01)
(Continued)

(52) U.S. Cl.
CPC ........ *H01L 29/1087* (2013.01); *G11C 11/404* (2013.01); *G11C 16/04* (2013.01); *G11C 16/10* (2013.01); *G11C 16/26* (2013.01); *H01L 21/761* (2013.01); *H01L 21/823892* (2013.01); *H01L 27/0218* (2013.01); *H01L 27/092* (2013.01);
(Continued)

(58) Field of Classification Search
CPC ....... G11C 11/404; G11C 16/04; G11C 16/10; G11C 16/26; H10B 63/30; H01L 21/761; H01L 21/823892; H01L 27/0218; H01L 27/092; H01L 27/0924; H01L 27/1203; H01L 27/1211; H01L 29/0847; H01L 29/1037; H01L 29/1083; H01L 29/1087;
(Continued)

(56) References Cited

U.S. PATENT DOCUMENTS

| 4,300,212 A | 11/1981 | Simko |
| 4,959,812 A | 9/1990 | Momodomi et al. |

(Continued)

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

(Continued)

*Primary Examiner* — Fazli Erdem
(74) *Attorney, Agent, or Firm* — Law Office of Alan W. Cannon

(57) ABSTRACT

A semiconductor metal-oxide-semiconductor field effect transistor (MOSFET) transistor with increased on-state current obtained through intrinsic bipolar junction transistor (BJT) of MOSFET has been described. Methods of operating the MOS transistor are provided.

13 Claims, 71 Drawing Sheets

Related U.S. Application Data continuation of application No. 15/724,989, filed as application No. PCT/US2016/029436 on Apr. 27, 2016, now Pat. No. 10,553,683.

(60) Provisional application No. 62/240,057, filed on Oct. 12, 2015, provisional application No. 62/203,859, filed on Aug. 11, 2015, provisional application No. 62/174,684, filed on Jun. 12, 2015, provisional application No. 62/154,718, filed on Apr. 30, 2015, provisional application No. 61/154,337, filed on Feb. 20, 2009.

(51) Int. Cl.

| | | |
|---|---|---|
| *H01L 29/786* | (2006.01) | |
| *H10B 63/00* | (2023.01) | |
| *G11C 13/00* | (2006.01) | |
| *G11C 11/404* | (2006.01) | |
| *G11C 16/04* | (2006.01) | |
| *G11C 16/10* | (2006.01) | |
| *G11C 16/26* | (2006.01) | |
| *H01L 21/761* | (2006.01) | |
| *H01L 27/02* | (2006.01) | |
| *H01L 27/092* | (2006.01) | |
| *H01L 27/12* | (2006.01) | |
| *H01L 29/08* | (2006.01) | |
| *H01L 29/423* | (2006.01) | |
| *H01L 29/78* | (2006.01) | |
| *H01L 21/265* | (2006.01) | |
| *H01L 29/06* | (2006.01) | |
| *H01L 29/32* | (2006.01) | |
| *H01L 29/788* | (2006.01) | |
| *H01L 29/792* | (2006.01) | |
| *H03K 19/0948* | (2006.01) | |
| *H03K 19/20* | (2006.01) | |
| *H03K 19/21* | (2006.01) | |

(52) U.S. Cl.
CPC ...... *H01L 27/0924* (2013.01); *H01L 27/1203* (2013.01); *H01L 27/1211* (2013.01); *H01L 29/0847* (2013.01); *H01L 29/1037* (2013.01); *H01L 29/1083* (2013.01); *H01L 29/1095* (2013.01); *H01L 29/42356* (2013.01); *H01L 29/78* (2013.01); *H01L 29/785* (2013.01); *H01L 29/78603* (2013.01); *H01L 29/78645* (2013.01); *H01L 29/78648* (2013.01); *H10B 63/30* (2023.02); *G11C 13/004* (2013.01); *G11C 13/0069* (2013.01); *G11C 16/0408* (2013.01); *G11C 16/0466* (2013.01); *G11C 2213/79* (2013.01); *H01L 21/26513* (2013.01); *H01L 29/0649* (2013.01); *H01L 29/32* (2013.01); *H01L 29/4238* (2013.01); *H01L 29/42328* (2013.01); *H01L 29/42344* (2013.01); *H01L 29/7881* (2013.01); *H01L 29/792* (2013.01); *H03K 19/0948* (2013.01); *H03K 19/20* (2013.01); *H03K 19/21* (2013.01)

(58) Field of Classification Search
CPC ........... H01L 29/1095; H01L 29/42356; H01L 29/78645; H01L 29/78648
USPC ...................................................... 257/314
See application file for complete search history.

(56) References Cited

U.S. PATENT DOCUMENTS

| | | |
|---|---|---|
| 4,975,764 A | 12/1990 | Hsu |
| 5,304,833 A | 4/1994 | Shigeki et al. |
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,277,689 B1 | 8/2001 | Wong |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,433,391 B1 | 8/2002 | En et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,835,979 B1 | 12/2004 | Liu et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,030,435 B2 | 4/2006 | Gnadinger |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,208,795 B2 | 4/2007 | Carver et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,376,006 B2 | 5/2008 | Bednorz et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,709,875 B2 | 5/2010 | Villaret et al. |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |

(56) References Cited

U.S. PATENT DOCUMENTS

| | | |
|---|---|---|
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,281,022 B2 | 3/2016 | Louie et al. |
| 9,368,625 B2 | 6/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,496,053 B2 | 11/2016 | Han et al. |
| 9,514,803 B2 | 12/2016 | Widjaja et al. |
| 9,524,970 B2 | 12/2016 | Widjaja |
| 9,536,595 B2 | 1/2017 | Louie et al. |
| 9,548,119 B2 | 1/2017 | Han et al. |
| 9,576,962 B2 | 2/2017 | Widjaja et al. |
| 9,589,963 B2 | 3/2017 | Widjaja |
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,578 B2 | 7/2017 | Louie et al. |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,799,392 B2 | 10/2017 | Han et al. |
| 9,812,203 B2 | 11/2017 | Widjaja |
| 9,812,456 B2 | 11/2017 | Widjaja |
| 9,831,247 B2 | 11/2017 | Han et al. |
| 9,847,131 B2 | 12/2017 | Widjaja |
| 9,865,332 B2 | 1/2018 | Louie et al. |
| 9,881,667 B2 | 1/2018 | Han et al. |
| 9,893,067 B2 | 2/2018 | Widjaja et al. |
| 9,905,564 B2 | 2/2018 | Widjaja et al. |
| 9,922,711 B2 | 3/2018 | Widjaja |
| 9,922,981 B2 | 3/2018 | Widjaja |
| 9,928,910 B2 | 3/2018 | Widjaja |
| 9,947,387 B2 | 4/2018 | Louie et al. |
| 9,960,166 B2 | 5/2018 | Widjaja |
| 9,978,450 B2 | 5/2018 | Widjaja |
| 10,008,266 B1 | 6/2018 | Widjaja |
| 10,026,479 B2 | 7/2018 | Ouie et al. |
| 10,032,514 B2 | 7/2018 | Widjaja |
| 10,032,776 B2 | 7/2018 | Widjaja et al. |
| 10,056,387 B2 | 8/2018 | Widjaja |
| 10,074,653 B2 | 9/2018 | Widjaja |
| 10,079,236 B2 | 9/2018 | Widjaja |
| 10,103,148 B2 | 10/2018 | Louie et al. |
| 10,103,149 B2 | 10/2018 | Han et al. |
| 10,109,349 B2 | 10/2018 | Widjaja |
| 10,115,451 B2 | 10/2018 | Han et al. |
| 10,141,046 B2 | 11/2018 | Han et al. |
| 10,141,315 B2 | 11/2018 | Widjaja et al. |
| 10,157,663 B2 | 12/2018 | Louie et al. |
| 10,163,907 B2 | 12/2018 | Widjaja et al. |
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,354,718 B2 | 7/2019 | Louie et al. |
| 10,373,685 B2 | 8/2019 | Louie et al. |
| 10,388,378 B2 | 8/2019 | Widjaja |
| 10,403,361 B2 | 9/2019 | Widjaja |
| 10,453,847 B2 | 10/2019 | Widjaja et al. |
| 10,461,083 B2 | 10/2019 | Han et al. |
| 10,461,084 B2 | 10/2019 | Widjaja |
| 10,468,102 B2 | 11/2019 | Widjaja |
| 10,497,443 B2 | 12/2019 | Widjaja |
| 10,504,585 B2 | 12/2019 | Louie et al. |
| 10,515,968 B2 | 12/2019 | Widjaja |
| 10,522,213 B2 | 12/2019 | Han et al. |
| 10,529,424 B2 | 1/2020 | Widjaja |
| 10,546,860 B2 | 1/2020 | Louie et al. |
| 10,553,281 B2 | 2/2020 | Widjaja |
| 10,553,683 B2 | 2/2020 | Han et al. |
| 10,580,482 B2 | 3/2020 | Han et al. |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,006 B2 | 8/2020 | Widjaja |
| 10,748,904 B2 | 8/2020 | Widjaja et al. |
| 10,783,952 B2 | 9/2020 | Louie et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,839,905 B2 | 11/2020 | Louie et al. |
| 10,854,745 B2 | 12/2020 | Han et al. |
| 10,861,548 B2 | 12/2020 | Widjaja |
| 10,867,676 B2 | 12/2020 | Widjaja |
| 10,916,297 B2 | 2/2021 | Han et al. |
| 10,923,183 B2 | 2/2021 | Han et al. |
| 10,978,455 B2 | 4/2021 | Widjaja et al. |
| 10,991,697 B2 | 4/2021 | Louie et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,031,401 B2 | 6/2021 | Han et al. |
| 11,037,929 B2 | 6/2021 | Widjaja |
| 11,063,048 B2 | 7/2021 | Widjaja |
| 11,100,994 B2 | 8/2021 | Louie et al. |
| 11,133,313 B2 | 9/2021 | Widjaja |
| 11,183,498 B2 | 11/2021 | Widjaja et al. |
| 11,201,215 B2 | 12/2021 | Han et al. |
| 11,211,125 B2 | 12/2021 | Widjaja |
| 11,217,300 B2 | 1/2022 | Louie et al. |
| 2002/0018366 A1 | 2/2002 | Von Schwerin et al. |
| 2002/0048193 A1 | 4/2002 | Tanikawa et al. |
| 2003/0168677 A1 | 9/2003 | Hsu |
| 2003/0168680 A1 | 9/2003 | Hsu |
| 2004/0041208 A1 | 3/2004 | Bhattacharyya |
| 2005/0024968 A1 | 2/2005 | Lee et al. |
| 2005/0026353 A1 | 2/2005 | Bhattacharyya |
| 2005/0032313 A1 | 2/2005 | Forbes |

(56) References Cited

U.S. PATENT DOCUMENTS

| | | |
|---|---|---|
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0001165 A1 | 1/2007 | Ranica et al. |
| 2007/0004149 A1 | 1/2007 | Tews |
| 2007/0013030 A1 | 1/2007 | Ranica et al. |
| 2007/0023809 A1 | 2/2007 | Villaret et al. |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0198551 A1* | 7/2014 | Louie .................. G11C 15/046 365/49.1 |
| 2014/0252451 A1 | 9/2014 | Han et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0200005 A1 | 7/2015 | Han et al. |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0049190 A1 | 2/2016 | Han et al. |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148674 A1 | 5/2016 | Louie et al. |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025164 A1 | 1/2017 | Han et al. |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0076784 A1 | 3/2017 | Louie et al. |
| 2017/0092351 A1 | 3/2017 | Han et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |
| 2018/0012646 A1 | 1/2018 | Han et al. |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |
| 2018/0096721 A1 | 4/2018 | Louie et al. |
| 2018/0122457 A1 | 5/2018 | Han et al. |
| 2018/0158825 A1 | 6/2018 | Widjaja et al. |
| 2018/0158912 A1 | 6/2018 | Han et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0204611 A1 | 7/2018 | Louie et al. |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0358360 A1 | 12/2018 | Han et al. |
| 2018/0374854 A1 | 12/2018 | Widjaja |
| 2019/0006367 A1 | 1/2019 | Widjaja |
| 2019/0006516 A1 | 1/2019 | Han et al. |
| 2019/0027220 A1 | 1/2019 | Widjaja |
| 2019/0027476 A1 | 1/2019 | Louie et al. |
| 2019/0043554 A1 | 2/2019 | Han et al. |
| 2019/0066768 A1 | 2/2019 | Han et al. |
| 2019/0067289 A1 | 2/2019 | Widjaja et al. |
| 2019/0080746 A1 | 3/2019 | Louie et al. |
| 2019/0096889 A1 | 3/2019 | Widjaja et al. |
| 2019/0131305 A1 | 5/2019 | Widjaja et al. |

(56) References Cited

U.S. PATENT DOCUMENTS

| | | |
|---|---|---|
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295629 A1 | 9/2019 | Louie et al. |
| 2019/0295646 A1 | 9/2019 | Widjaja |
| 2020/0051633 A1 | 2/2020 | Widjaja |
| 2020/0075091 A1 | 3/2020 | Louie et al. |
| 2020/0083373 A1 | 3/2020 | Han et al. |
| 2020/0090734 A1 | 3/2020 | Han et al. |
| 2020/0091155 A1 | 3/2020 | Widjaja |
| 2020/0111792 A1 | 4/2020 | Louie et al. |
| 2020/0118627 A1 | 4/2020 | Widjaja |
| 2020/0118628 A1 | 4/2020 | Widjaja |
| 2020/0135863 A1 | 4/2020 | Han et al. |
| 2020/0168267 A1 | 5/2020 | Han et al. |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0227478 A1 | 7/2020 | Han et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335156 A1 | 10/2020 | Louie et al. |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0057027 A1 | 2/2021 | Louie et al. |
| 2021/0074358 A1 | 3/2021 | Widjaja |
| 2021/0083110 A1 | 3/2021 | Han et al. |
| 2021/0151097 A1 | 5/2021 | Han et al. |
| 2021/0183432 A1 | 6/2021 | Han et al. |
| 2021/0217754 A1 | 7/2021 | Louie et al. |
| 2021/0225844 A1 | 7/2021 | Widjaja et al. |
| 2021/0249078 A1 | 8/2021 | Widjaja |
| 2021/0257025 A1 | 8/2021 | Widjaja |
| 2021/0257365 A1 | 8/2021 | Widjaja |
| 2021/0288051 A1 | 9/2021 | Han et al. |
| 2021/0327880 A1 | 10/2021 | Widjaja |
| 2021/0358547 A1 | 11/2021 | Louie et al. |
| 2021/0375870 A1 | 12/2021 | Widjaja |
| 2021/0398981 A1 | 12/2021 | Widjaja |

OTHER PUBLICATIONS

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHZ random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHZ Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D Dram Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "a survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p. and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor-Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.

(56) References Cited

OTHER PUBLICATIONS

Kim, et al. "Silicon on replacement insulator (SRI) floating body cell (FBC) memory." VLSI Technology (VLSIT), 2010 Symposium on. IEEE, 2010, pp. 165-166.

Kim, et al. "Optical charge-pumping: A universal trap characterization technique for nanoscale floating body devices." VLSI Technology (VLSIT), 2011 Symposium on. IEEE, 2011, pp. 190-191.

Kim, et al. "Investigation of 1T DRAM cell with non-overlap structure and recessed channel." Silicon Nanoelectronics Workshop (SNW), 2010. IEEE, 2010, pp. 1-2.

Kim, et al. Resistive-Memory Embedded Unified Ram (R-URAM, 2009, pp. 2670-2674.

Lu, et al., "A Floating-Body/Gate DRAM Cell Upgraded for Long Retention Time", IEEE Elec. Dev. Letters, vol. 32, No. 6, pp. 731-733, Jun. 2011.

Lu, et al., "A Simplified Superior Floating-Body/Gate DRAM Cell", IEEE Elec. Dev. Letters, vol. 30, No. 3, Mar. 2009, pp. 282-284.

Lee, et al. "A Novel Capacitorless 1T DRAM Cell for Data Retention Time Improvement." Nanotechnology, IEEE Transactions on, vol. 10, No. 3, 2011, pp. 462-466.

Leiss, et al., "dRAM Design Using the Taper-Isolated Dynamic RAM Cell." Solid-State Circuits, IEEE Journal of 17.2 (1982): 337-344.

Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.

Mahatme, et al. "Total ionizing dose effects on ultra thin buried oxide floating body memories." Reliability Physics Symposium (IRPS), 2012 IEEE International, 2012, pp. 1-5.

Moon, et al. "An optically assisted program method for capacitorless 1T-DRAM." Electron Devices, IEEE Transactions on, vol. 57, No. 7, 2010, pp. 1714-1718.

Moon, et al. "Multi-functional universal device using a band-engineered vertical structure." Electron Devices Meeting (IEDM), 2011 IEEE International. IEEE, 2011, pp. 24-26.

Moon, et al. "Fin-width dependence of BJT-based 1T-DRAM implemented on FinFET." Electron Device Letters, vol. 31, No. 9 (2010): 909-911.

Moon, et al. "Ultimately scaled 20nm unified-RAM." Electron Devices Meeting (IEDM), 2010 IEEE International. IEEE, 2010, pp. 12-2.

Nicoletti, et al. "The Dependence of Retention Time on Gate Length in UTBOX FBRAM With Different Source/Drain Junction Engineering." Electron Device Letters, vol. 33, No. 7, 2012, pp. 940-942.

Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.

Pellizzer et al., A 90nm Phase Change Memory Technology for Stand-Alone Non-Volatile Memory Applications, pp. 1-1, 2006.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica et al. Scaled 1T-Bulk devices built with CMOS 90nm technology for low-cost eDRAM applications. Pascale. mazoyer@st.com, 2005, 38-39.

Reisch, "On bistable behavior and open-base breakdown of bipolar transistors in the avalanche regime-modeling and applications." Electron Devices, IEEE Transactions on 39.6 (1992): 1398-1409.

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.

Campardo G. et al., VLSI Design of Non-Volatile Memories, 2005.

Han et al. Programming/Erasing Characteristics of 45 nm NOR-Type Flash Memory Based on SOI FinFET Structure. vol. 47, Nov. 2005, pp. S564-S567.

Headland. Hot electron injection, Feb. 19, 2004.

Lanyon, et al., "Bandgap Narrowing in Moderately to Heavily Doped Silicon", ppl 1014-1018, No. 7, vol. ED-26, 1979.

Lin, et al., A new 1T Dram Cell with enhanced Floating Body Effect, pp. 1-5, 2006.

Oh, et al., a 4-Bit Double SONOS memory (DSM) with 4 Storage Nodes Per Cell for Ultimate Multi-Bit Operation, pp. 1-2, 2006.

Ohsawa et al., An 18.5ns 128Mb SOI DRAM with a Floating body Cell, IEEE International Solid-State Circuits Conference, 2005, pp. 458-459, 609.

Ohsawa, et al. Autonomous refresh of floating body cell (FBC), 2008, pp. 801-804.

Ohsawa, et al. Autonomous refresh of floating-body cell due to current Anomaly of Impact Ionization, 2009, pp. 2302-2311.

Ohsawa et al., Memory Design Using One-Transistor Gain Cell on SOI, Tech. Digest, IEEE International Solid-State Circuits, vol. 37, No. 11, 2002, pp. 1510-1522.

Ohsawa, et al., "A Novel Capacitor-less DRAM Cell: Floating Body Cell", CRC Press, Taylor & Francis Group, 2012, pp. 1-7.

Okhonin, et al. A Capicitor-Less IT-DRAM Cell, vol. 23, No. 2, Feb. 2002, pp. 85-87.

Okhonin et al. A Soi Capacitor-less 1T-DRAM Concept. 2001, pp. 153-154.

Okhonin, et al., Principles of Transient Charge Pumping on Partially Depleted SOI MOSFETs, IEEE Electron Device Letters, vol. 23, No. 5, May 2002, pp. 279-281.

Rodriguez, et al. "A-RAM: Novel capacitor-less DRAM memory." In SOI Conference, 2009 IEEE International, pp. 1-2. IEEE, 2009.

Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.

Rodriguez, et al. "A-RAM memory cell: concept and operation." Electron Device Letters, IEEE, vol. 31, No. 9 (2010), pp. 972-974.

Robert F. Pierret. Semiconductor Device Fundamentals, ISBN: 0-201-54393-1, 1996, by Addison-Wesley Publishing Company, Inc. PNPN Devices 463-476.

Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.

Rothemund, et al., The importance of being modular, vol. 485, May 2012 pp. 584-585.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

Sakui, K., et al. "A new static memory cell based on the reverse base current effect of bipolar transistors." Electron Devices, IEEE Transactions on 36.6 (1989): 1215-1217.

Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.

Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.

Shin, et al. "A novel double HBT-based capacitorless 1T DRAM cell with Si/SiGe heterojunctions." Electron Device Letters, vol. 32, No. 7, 2011, pp. 850-852.

Sze, et al. Physics of Semiconductor Devices, 2007, pp. 1-4.

Tack, et al. "The multistable charge-controlled memory effect in SOI MOS transistors at low temperatures." Electron Devices, IEEE Transactions on 37.5 (1990): 1373-1382.

Terada, et al. "A new VLSI memory cell using capacitance coupling (CC cell)." Electron Devices, IEEE Transactions on 31.9 (1984): pp. 319-1324.

Ventrice, et al. "Analytical model of deeply-scaled thyristors for memory applications." Microelectronics and Electron Devices (WMED), 2012 IEEE Workshop on. IEEE, 2012, pp. 1-4.

Villaret, et al. "Further insight into the physics and modeling of floating-body capacitorless DRAMs." Electron Devices, IEEE Transactions on 52.11 (2005): pp. 2447-2454.

(56) References Cited

OTHER PUBLICATIONS

Waser, Rainer, Resistive non-volatile memory devices (Invited Paper), 2009, pp. 1925-1928.

Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.

Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.

Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.

Villaret et al., "Mechanisms of charge modulation in the floating body of triple-well nMOSFET capacitor-less DRAMs", Microelectronic Engineering 72 (2004) 434-439.

International Preliminary Report on Patentability re PCT/US2016/029436, dated Oct. 31, 2017.

\* cited by examiner

MOSFET AND MEMORY CELL HAVING IMPROVED DRAIN CURRENT THROUGH BACK BIAS APPLICATION

CROSS-REFERENCE

This application is a division of co-pending U.S. patent application Ser. No. 16/714,443, filed Dec. 13, 2019, which is a continuation of U.S. patent application Ser. No. 15/724,989, filed Oct. 4, 2017, now U.S. Pat. No. 10,553,683, which claims the benefit under 35 USC 371(c) of PCT Application No. PCT/US2016/029436, filed 27 Apr. 2016, which claims the benefit of U.S. Provisional Application No. 61/154,337, filed Apr. 29, 2015; U.S. Provisional Application No. 62/154,718, filed Apr. 30, 2015; U.S. Provisional Application No. 62/174,684, filed Jun. 12, 2015; U.S. Provisional Application No. 62/203,859, filed Aug. 11, 2015, and U.S. Provisional Application No. 62/240,057, filed Oct. 12, 2015, which applications and patent are each hereby incorporated herein, in their entireties, by reference thereto and to which applications we claim priority under 35 U.S.C. Sections 120, 371 and 119, respectively.

FIELD OF THE INVENTION

This invention relates to semiconductor metal-oxide-semiconductor field effect transistor (MOSFET) transistor with increased on-state current obtained through bipolar junction transistor (BJT) of MOSFET and semiconductor non-volatile memory cell having reduced operating voltage by utilizing inherent bipolar junction transistor (BJT). More particularly, the on-state drain current is increased due to the turned-on BJT when the MOSFET is turned on but the off-state drain current is unchanged due to the turned-off BJT when the MOSFET is turned off.

BACKGROUND OF THE INVENTION

Because PN junctions are created in source-to-channel and the drain-to-channel of a MOSFET, a BJT is inherently formed during manufacture of the MOSFET. The inherent BJT is connected in parallel to the MOSFET, where emitter, base, and collector of the BJT are formed from the source, channel, and drain of the MOSFET, respectively. The n-channel MOSFET would have npn-type BJT and the p-channel MOSFET would have pnp-type BJT.

In a conventional MOSFET, the intrinsic BJT rarely contributes to the drain current. Currently, the manufacturing process and operation scheme for MOSFETs are designed to nullify the effect of the inherent BJT. Clearly, a manufacturing process and operation scheme that would utilize the inherent BJT to enhance the MOSFET performance would be desirable.

SUMMARY OF THE INVENTION

A semiconductor device structure to increase on-state drain current but the off-state drain current is unchanged. A non-volatile memory cell having reduced operating voltage by utilizing inherent BJT is also disclosed. Methods of operating the semiconductor device and non-volatile memory cell are provided.

In one aspect of the present invention, a semiconductor device configured to function as a semiconductor memory device or a transistor with increased on-state drain current, includes a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; and a gate positioned in between the source region and the drain region; wherein the semiconductor device is configured to function as a memory device having at least two stable states, or as a transistor with increased on-state drain current, but with no change in off-state drain current, depending on biases that are applied to the semiconductor device.

In at least one embodiment, whether the semiconductor device functions as the memory device having at least two stable states, or as the transistor with increased on-state drain current, but with no change in off-state drain current is governed by an amount of voltage applied to the buried layer.

In at least one embodiment, a relatively low voltage applied to the buried layer governs the semiconductor device to function as a MOSFET (metal-oxide-semiconductor field effect transistor) and wherein a relatively high voltage applied to the buried layer governs the semiconductor device to function as the memory device having at least two stable states.

In at least one embodiment, a relatively intermediate high voltage applied to the buried layer higher than the relatively low voltage and lower than the relatively high voltage, but sufficient to turn on a vertical bipolar junction transistor (BJT) formed by the buried layer, the body and the source region, turns on a lateral BJT formed by the source region, the body and the drain region, resulting in increased on-state drain current.

In at least one embodiment, the on-state drain current comprises the sum of current from a MOS transistor formed by the source region, the gate and the drain region and current from the lateral BJT.

In at least one embodiment, the semiconductor device further includes a buried layer tap connected to the buried layer.

In at least one embodiment, the buried layer tap has the second conductivity type.

In at least one embodiment, the buried layer, the body, the source region, the drain region and the gate comprise a first buried layer, a first body, a first source region, a first drain region and a first gate, respectively, the semiconductor device further comprising: a well formed in the substrate and having the second conductivity type; a second buried layer having the first second conductivity type; a second body having the second conductivity type; a second source region and a second drain region each having the first conductivity type and being separated by the second body; and a second gate positioned in between the second source region and the second drain region.

In at least one embodiment, the semiconductor device further includes a second buried layer tap connected to the second buried layer.

In at least one embodiment, the second buried layer tap has the first conductivity type.

In at least one embodiment, the well comprises a first well, the semiconductor device further comprising: a second well formed in the substrate and having the second conductivity type; and a third well formed between the second well and the first buried layer and having the first conductivity type.

In at least one embodiment, the semiconductor device further includes: a well formed in the substrate and having the second conductivity type; and a second buried layer between the buried layer and the well, the second buried layer having the first conductivity type.

In at least one embodiment, the semiconductor device further includes a buried layer tap connected to the second buried layer.

In at least one embodiment, the buried layer tap has the first conductivity type.

In at least one embodiment, the semiconductor device includes a first vertical thyristor formed by the buried layer, the second buried layer, the body and the source region; and a second vertical thyristor formed by the buried layer, the second buried layer, the body and the drain region.

In at least one embodiment, switching between on and off of the MOS transistor 20 is controlled by voltage applied to the gate, and switching between on and off of the lateral BJT is controlled by voltage applied to the gate and to the second buried layer.

In at least one embodiment, the semiconductor device further includes a body contact configured to be tied to or isolated from the body.

In at least one embodiment, whether the body contact is tied to or isolated from the body is modulated by voltage applied to the buried layer.

In at least one embodiment, the semiconductor device further includes an insulating layer between the body contact and the source region.

In at least one embodiment, the insulating layer does not contact the buried layer.

In at least one embodiment, the semiconductor device further includes second insulating layers that insulate the body from adjacent semiconductor devices.

In at least one embodiment, the second insulating layers extend beneath a surface of the buried layer.

In at least one embodiment, the second insulating layers do not contact the buried layer.

In at least one embodiment, the second insulating layers extend beneath a lower surface of the buried layer.

In at least one embodiment, the gate is connected to the buried layer tap.

In at least one embodiment, the body comprises a fin structure extending perpendicularly from the substrate.

In at least one embodiment, the source region and the drain region are included in the fin structure.

In at least one embodiment, the gate extends down to align with a junction between the body and the buried layer.

In at least one embodiment, the fin structure is tapered to increase capacitive coupling efficiency between the gate and the body.

In at least one embodiment, the buried layer comprises a buried oxide layer.

In another aspect of the present invention, a semiconductor device configured to function as a semiconductor memory device or a transistor with increased on-state drain current, includes: a substrate having a first conductivity type selected from p-type conductivity type and n-type conductivity type; a buried insulating layer;

a body having the first conductivity type; a source region and a drain region each having the second conductivity type and being separated by the body; a charge injector region separated from the source region and the drain region; and a gate positioned in between the source region and the drain region; wherein the semiconductor device is configured to function as a memory device having at least two stable states, or as a transistor with increased on-state drain current, but with no change in off-state drain current, depending on biases that are applied to the semiconductor device.

In at least one embodiment, wherein whether the semiconductor device functions as the memory device having at least two stable states, or as the transistor with increased on-state drain current, but with no change in off-state drain current is governed by an amount of voltage applied to the charge injector region.

In at least one embodiment, a relatively low voltage applied to the charge injector region governs the semiconductor device to function as a MOSFET (metal-oxide-semiconductor field effect transistor) and wherein a relatively high voltage applied to the buried layer governs the semiconductor device to function as the memory device having at least two stable states.

In at least one embodiment, a relatively intermediate high voltage applied to the charge injector region higher than the relatively low voltage and lower than the relatively high voltage, but sufficient to turn on a bipolar junction transistor (BJT) formed by the charge injector region, the body and the source region, turns on a lateral BJT formed by the source region, the body and the drain region, resulting in increased on-state drain current.

In at least one embodiment, the body is ultrathin, comprising a thickness in the range of from 2 nm to 10 nm.

In at least one embodiment, the body is thin, comprising a thickness in the range of from 10 nm to 200 nm.

In at least one embodiment, a first length of the gate between the source region and the drain region is greater than a second length of the gate between the source region and the charge injector region.

In at least one embodiment, the charge injector region comprises a first charge injection region, the semiconductor device further comprising a second charge injector region.

In at least one embodiment, the gate extends between the source region and the drain region, but not between the source region and the first injector region and not between the drain region and the second injector region.

In at least one embodiment, at least one of the source region, drain region and charge injector regions has a first junction depth less than a second junction depth of at least one other of the source region, drain region and charge injector regions.

In at least one embodiment, the source region has the first junction depth and the drain region and at least one of the charge injector regions has the second junction depth.

In at least one embodiment, the semiconductor device further includes a second gate.

In at least one embodiment, the semiconductor device further includes a charge trap layer adjacent at least one of the source region and the drain region.

In at least one embodiment, the charge trap layer directly contacts at least one of the source region and the drain region.

In at least one embodiment, the charge trap layer indirectly contacts at least one of the source region and the drain region via a thin interfacial oxide layer.

In at least one embodiment, the semiconductor device further includes a metal silicide junction located at at least one of: between the source region and the body, and between the drain region and the body.

In at least one embodiment, the semiconductor device further includes an energy band offset region located at at least one of: between the source region and the body, and between the drain region and the body.

In at least one embodiment, the energy band offset region comprises a valence band offset material.

In at least one embodiment, the semiconductor device further includes a recombination center located at at least one of: between the source region and the body, and between the drain region and the body.

In at least one embodiment, the recombination center is formed by doping with deep level impurities.

In at least one embodiment, the deep level impurities comprise at least one of gold or platinum.

In at least one embodiment, the recombination center is formed by introducing crystallinity damage through ion implantation.

In at least one embodiment, ions used for the ion implantation are selected from at least one of the group consisting of: Si ions, Ge ions and Ar ions.

In at least one embodiment, the semiconductor device further includes a control gate positioned above the gate.

In at least one embodiment, the semiconductor device further includes a select gate spaced apart from the gate.

In at least one embodiment, the select gate is positioned in between the drain region and the gate, and an insulating gap region is formed between the select gate and the gate.

In at least one embodiment, a cross-sectional area of the source region is greater than a cross-sectional area of the drain region.

In at least one embodiment, the semiconductor device further includes a control gate spaced apart from the gate.

In at least one embodiment, the control gate is positioned in between the drain region and the gate, and an insulating gap region is formed between the control gate and the gate.

In at least one embodiment, the control gate overlaps the insulating gap region and at least partially overlaps the gate.

In at least one embodiment, a cross-sectional area of the source region is greater than a cross-sectional area of the drain region.

In at least one embodiment, the semiconductor device further includes a resistive change element connected to one of the source region or the drain region.

According to another aspect of the present invention, a method of selectively operating a semiconductor device as a semiconductor memory device or a transistor with increased on-state drain current, includes: providing the semiconductor device comprising a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; and a gate positioned in between the source region and the drain region; and selectively operating the semiconductor device as the semiconductor memory device or the transistor, wherein the selectively operating comprises: applying a relatively low voltage to the buried layer to operate the semiconductor device as an ordinary transistor; applying a relatively high voltage to the buried layer to operate the semiconductor device as the semiconductor memory device, wherein the semiconductor memory device has at least two stable states; and applying an intermediate high voltage higher than the relatively low voltage but lower than the relatively high voltage to the buried layer to operate the semiconductor device as the transistor with increased on-state drain current.

In at least one embodiment, the relatively high voltage is sufficiently high to turn on a vertical bipolar junction transistor (BJT) formed by the buried layer, the body and one of the source region or the drain region.

In at least one embodiment, the intermediate high voltage summed with a voltage applied to the gate is sufficiently high to turn on a vertical bipolar junction transistor (BJT) formed by the buried layer, the body and one of the source region or the drain region.

In at least one embodiment, the turn on of the vertical BJT acts as a base current for a lateral BJT formed by the source region, the body and the drain region, turning on the lateral BJT and resulting in increased on-state drain current.

In at least one embodiment, the on-state drain current comprises a sum of current through a MOS transistor formed by the source region, the gate, the drain region and the body; and current through the lateral BJT.

In at least one embodiment, an off-state current, when the intermediate high voltage is applied, is the same as when zero voltage is applied to the buried layer.

In at least one embodiment, the method further includes applying zero voltage to the gate and applying the intermediate high voltage to the drain region, resulting in turning off a MOS transistor formed by the source region, the gate, the drain region and the body; and turning on a lateral bipolar junction transistor (BJT) formed by the source region, the body and the drain region.

In at least one embodiment, switching between on and off of the MOS transistor is controlled by voltage applied to the gate.

In at least one embodiment, the method further includes modulating voltage applied to the buried layer to adjust and trim a skew of the transistor.

In at least one embodiment, the method further includes modulating voltage applied to the buried layer to compensate for change in temperature of the semiconductor device in order to comply with shifts in gate and drain voltages required to turn on the lateral BJT.

In at least one embodiment, the semiconductor device further comprises a body contact that can be selectively connected to or isolated from the body; wherein connection to or isolation of the body contact to or from the body is modulated by an amount of voltage applied to the buried layer.

In at least one embodiment, application of a voltage greater than or equal to a separating threshold voltage to the buried layer forms a depletion region sufficient to isolate the body contact from the body.

In at least one embodiment, application of a voltage greater than or equal to a separating threshold voltage to the buried layer extends a boundary of the depletion region beyond a bottom of an insulating layer separating the body contact from the body.

In at least one embodiment, the method further includes providing a recombination region in the semiconductor device to reduce transient time between on and off states of the semiconductor device.

In another aspect of the present invention, a complementary metal-oxide-semiconductor (MOS) device includes: a substrate having a first conductivity type selected from p-type conductivity type and n-type conductivity type; a first buried layer having a second conductivity type selected from the p-type conductivity type and the n-type conductivity type and being different from the first conductivity type; a first body having the first conductivity type; a first source region and a first drain region each having the second conductivity type and being separated by the first body; a first gate positioned in between the first source region and the first drain region; a well formed in the substrate and having the second conductivity type; a second buried layer having the first second conductivity type; a second body having the second conductivity type; a second source region and a second drain region each having the first conductivity type and being separated by the second body; and a second gate positioned in between the second source region and the second drain region.

In at least one embodiment, the complementary metal-oxide-semiconductor (MOS) device is configured to function as a memory device having at least two stable states, or as a transistor with increased on-state drain current, but with no change in off-state drain current, depending on biases that are applied to the semiconductor device.

In at least one embodiment, the complementary metal-oxide-semiconductor (MOS) device further includes: a first a buried layer tap connected to the first buried layer; and a second buried layer tap connect to the second buried layer.

In at least one embodiment, the first buried layer tap has the second conductivity type and the second buried layer tap has the first conductivity type.

In at least one embodiment, the well comprises a first well, the complementary metal-oxide-semiconductor (MOS) device further including: a second well formed in the substrate and having the second conductivity type; and a third well formed between the second well and the first buried layer and having the first conductivity type.

In another aspect of the present invention, a metal-oxide-semiconductor (MOS) device includes: a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; a gate positioned in between the source region and the drain region; a well formed in the substrate and having the second conductivity type; and a second buried layer between the buried layer and the well, the second buried layer having the first conductivity type.

In at least one embodiment, the metal-oxide-semiconductor (MOS) device is configured to function as a memory device having at least two stable states, or as a transistor with increased on-state drain current, but with no change in off-state drain current, depending on biases that are applied to the semiconductor device.

In at least one embodiment, the metal-oxide-semiconductor (MOS) device further includes a buried layer tap connected to the second buried layer.

In at least one embodiment, the buried layer tap has the first conductivity type.

In at least one embodiment, the metal-oxide-semiconductor (MOS) device includes a first vertical thyristor formed by the buried layer, the second buried layer, the body and the source region; and a second vertical thyristor formed by the buried layer, the second buried layer, the body and the drain region.

In another aspect of the present invention, a metal-oxide-semiconductor (MOS) device includes: a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; a gate positioned in between the source region and the drain region; a body contact connected to the body; and an insulating layer positioned between the body contact and a portion of the body.

In at least one embodiment, the metal-oxide-semiconductor (MOS) device is configured to selectively connect the body contact to the body or isolate the body contact from the body.

In at least one embodiment, the metal-oxide-semiconductor (MOS) device is configured to function as a memory device having at least two stable states, or as a transistor with increased on-state drain current, but with no change in off-state drain current, depending on biases that are applied to the semiconductor device.

In another aspect of the present invention, a metal-oxide-semiconductor (MOS) device includes: a substrate having a first conductivity type selected from p-type conductivity type and n-type conductivity type; a buried oxide layer; a body having the first conductivity type; a source region, a drain region and a charge injector region each having the second conductivity type and being separated by the body; and a gate positioned in between the source region and the drain region.

In at least one embodiment, the metal-oxide-semiconductor (MOS) device is configured to function as a memory device having at least two stable states, or as a transistor with increased on-state drain current, but with no change in off-state drain current, depending on biases that are applied to the semiconductor device.

In at least one embodiment, the gate is further positioned in between the source region and the charge injector region and between the drain region and the charge injector region.

In at least one embodiment, the body is ultrathin, comprising a thickness in the range of from 2 nm to 10 nm.

In at least one embodiment, the body is thin, comprising a thickness in the range of from 10 nm to 200 nm.

In another aspect of the present invention, a complementary metal-oxide-semiconductor (MOS) device includes: a substrate having a first conductivity type selected from p-type conductivity type and n-type conductivity type; a buried layer; a first body having the first conductivity type; a first source region and a first drain region each having the second conductivity type and being separated by the first body; a first gate positioned in between the first source region and the first drain region; a second body having the second conductivity type; a second source region and a second drain region each having the first conductivity type and being separated by the second body; a second gate positioned in between the second source region and the second drain region; and an insulating layer separating a first portion of the buried layer underlying the first body from a second portion of the buried layer underlying the second body.

In at least one embodiment, the complementary metal-oxide-semiconductor (MOS) device is configured to function as a memory device having at least two stable states, or as a transistor with increased on-state drain current, but with no change in off-state drain current, depending on biases that are applied to the semiconductor device.

In another aspect of the present invention, a complementary metal-oxide-semiconductor (MOS) device includes: a substrate having a first conductivity type selected from p-type conductivity type and n-type conductivity type; a buried layer; a body having the first conductivity type; a source region and a drain region each having the second conductivity type and being separated by the body; a gate positioned in between the source region and the drain region; and a charge trap layer adjacent at least one of the source region and the drain region.

In at least one embodiment, the charge trap layer directly contacts at least one of the source region and the drain region.

In at least one embodiment, the charge trap layer indirectly contacts at least one of the source region and the drain region via a thin interfacial oxide layer.

In another aspect of the present invention, a complementary metal-oxide-semiconductor (MOS) device includes: a substrate having a first conductivity type selected from p-type conductivity type and n-type conductivity type; a buried layer;

a body having the first conductivity type; a source region and a drain region each having the second conductivity type and being separated by the body; a gate positioned in between the source region and the drain region; and a metal silicide junction located at at least one of: between the source region and the body, and between the drain region and the body.

In another aspect of the present invention, a complementary metal-oxide-semiconductor (MOS) device includes: a substrate having a first conductivity type selected from p-type conductivity type and n-type conductivity type; a buried layer; a body having the first conductivity type; a source region and a drain region each having the second conductivity type and being separated by the body; a gate positioned in between the source region and the drain region; and an energy band offset region located at at least one of: between the source region and the body, and between the drain region and the body.

In at least one embodiment, the energy band offset region comprises a valence band offset material.

In another aspect of the present invention, a complementary metal-oxide-semiconductor (MOS) device includes: a substrate having a first conductivity type selected from p-type conductivity type and n-type conductivity type; a buried layer; a body having the first conductivity type; a source region and a drain region each having the second conductivity type and being separated by the body; a gate positioned in between the source region and the drain region; and a metal silicide junction located at at least one of: between the source region and the body, and between the drain region and the body.

In another aspect of the present invention, a complementary metal-oxide-semiconductor (MOS) device includes: a substrate having a first conductivity type selected from p-type conductivity type and n-type conductivity type; a buried layer; a body having the first conductivity type; a source region and a drain region each having the second conductivity type and being separated by the body; a gate positioned in between the source region and the drain region; and a recombination center located at at least one of: between the source region and the body, and between the drain region and the body.

In at least one embodiment, the recombination center is formed by doping with deep level impurities.

In at least one embodiment, the recombination center is formed by introducing crystallinity damage through ion implantation.

In another aspect of the present invention, an inverter gate includes transistors configured to provide increased on-state current, the inverter gate including: a substrate having a first conductivity type selected from p-type conductivity type and n-type conductivity type; a first buried layer having a second conductivity type selected from the p-type conductivity type and the n-type conductivity type and being different from the first conductivity type; a first body having the first conductivity type; a first source region and a first drain region each having the second conductivity type and being separated by the first body; a first gate positioned in between the first source region and the first drain region; a first well formed in the substrate and having the second conductivity type; a second well formed in the substrate and having the first conductivity type; a second buried layer having the first second conductivity type; a second body having the second conductivity type; a second source region and a second drain region each having the first conductivity type and being separated by the second body; a second gate positioned in between the second source region and the second drain region; a first buried well tap connected to the first well and having the second conductivity type; and a second buried well tap connected to the second well and having the first conductivity type.

In another aspect of the present invention, a two input NAND gate includes: two p-channel transistors in parallel and two n-channel transistors in series, wherein each p-channel transistor comprises: a substrate having a first conductivity type selected from p-type conductivity type and n-type conductivity type; a first buried layer having a second conductivity type selected from the p-type conductivity type and the n-type conductivity type and being different from the first conductivity type; a first body having the first conductivity type; a first source region and a first drain region each having the second conductivity type and being separated by the first body; a first gate positioned in between the first source region and the first drain region; and a first well formed in the substrate and having the second conductivity type; and wherein each n-channel transistor comprises: a second well formed in the substrate and having the first conductivity type; a second buried layer having the first second conductivity type; a second body having the second conductivity type; a second source region and a second drain region each having the first conductivity type and being separated by the second body; and a second gate positioned in between the second source region and the second drain region; wherein each transistor is configured to function as a transistor with increased on-state drain current, but with no change in off-state drain current.

In at least one embodiment, the n-channel transistors in series are separated by an isolation region and connected through a conductive layer.

In another aspect of the present invention, a two input NOR gate includes: two p-channel transistors in series and two n-channel transistors in parallel; wherein each p-channel transistor comprises: a substrate having a first conductivity type selected from p-type conductivity type and n-type conductivity type; a first buried layer having a second conductivity type selected from the p-type conductivity type and the n-type conductivity type and being different from the first conductivity type; a first body having the first conductivity type; a first source region and a first drain region each having the second conductivity type and being separated by the first body; a first gate positioned in between the first source region and the first drain region; and a first well formed in the substrate and having the second conductivity type; and wherein each n-channel transistor comprises: a second well formed in the substrate and having the first conductivity type; a second buried layer having the first second conductivity type; a second body having the second conductivity type; a second source region and a second drain region each having the first conductivity type and being separated by the second body; and a second gate positioned in between the second source region and the second drain region; wherein each transistor is configured to function as a transistor with increased on-state drain current, but with no change in off-state drain current.

In at least one embodiment, the p-channel transistors in series are separated by an isolation region and connected through a conductive layer.

In another aspect of the present invention, a boosted transistor in combination with a metal-oxide-semiconductor (MOS) transistor is provided, the boosted transistor including: a substrate having a first conductivity type selected from p-type conductivity type and n-type conductivity type; a first buried layer having a second conductivity type selected from the p-type conductivity type and the n-type conductivity type and being different from the first conductivity type; a body having the first conductivity type; a first source region and a first drain region each having the second conductivity type and being separated by the first body; a first gate positioned in between the first source region and the first drain region; and wherein metal-oxide-semiconductor (MOS) transistor includes: the substrate; the buried layer; a well having the second conductivity type; a second source region and a second drain region each having the first conductivity type and being separated by the well; and a second gate positioned in between the second source region and the second drain region.

In at least one embodiment, bias applied to the buried layer of the boosted transistor is also applied to the well of the metal-oxide-semiconductor (MOS) transistor.

In another aspect of the present invention, a semiconductor device configured to function as a semiconductor memory device or a transistor with increased on-state drain current includes: a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; a gate positioned in between the source region and the drain region; and a select gate spaced apart from the gate.

In at least one embodiment, the select gate is positioned in between the drain region and the gate, and an insulating gap region is formed between the select gate and the gate.

In at least one embodiment, the gate is floating and stores non-volatile data in the absence of power.

In at least one embodiment, applying a voltage to the buried layer region enhances current flow to the gate.

In another aspect of the present invention, a semiconductor device configured to function as a semiconductor memory device or a transistor with increased on-state drain current includes: a substrate having a first conductivity type selected from p-type conductivity type and n-type conductivity type; a buried layer having a second conductivity type selected from the p-type conductivity type and the n-type conductivity type and being different from the first conductivity type; a body having the first conductivity type; a source region and a drain region each having the second conductivity type and being separated by the body; a gate positioned in between the source region and the drain region; and a control gate spaced apart from the gate.

In at least one embodiment, the control gate is positioned in between the drain region and the gate, and an insulating gap region is formed between the control gate and the gate.

In at least one embodiment, the control gate overlaps the insulating gap region and at least partially overlaps the gate.

In at least one embodiment, the gate is floating and stores non-volatile data in the absence of power.

In at least one embodiment, applying a voltage to the buried layer region enhances current flow to the gate.

These and other advantages and features of the invention will become apparent to those persons skilled in the art upon reading the details of the devices and methods as more fully described below.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION OF THE INVENTION

Before the present MOSFETS, memory cells and arrays are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the region" includes reference to one or more regions and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1:
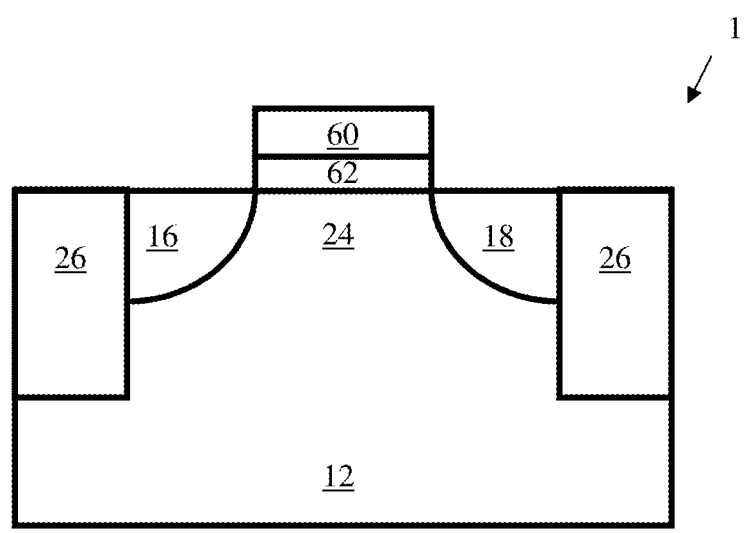
FIG. 1 is a schematic, cross-sectional illustration of a conventional MOS device.

FIG. 1 illustrates a prior art complimentary metal-oxide semiconductor (CMOS) 1 in which n-channel and p-channel MOSFETs are fabricated on the same chip having a substrate 12. A BJT is inherently formed during manufacture of the MOSFET. The intrinsic BJT is connected in parallel to the MOSFET, where emitter, base, and collector of the intrinsic BJT are formed from the source 16, channel 24, and drain 18 of the MOSFET 1, respectively. The MOSFET 1 further includes a gate 60, gate insulator 62 and insulators 26. The intrinsic BJT of MOSFET 1 rarely contributes to the drain current. Currently, the manufacturing process and operation scheme for conventional MOSFETs are designed to nullify the effect of the inherent BJT.

Figure 2:
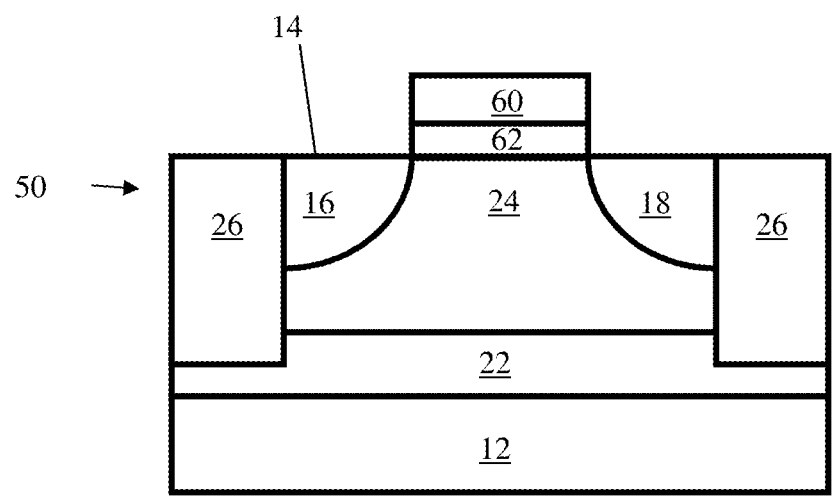
FIG. 2 is a schematic, cross-sectional illustration of a MOS device according to the present invention.

Referring to FIG. 2, a semiconductor device 50 according to an embodiment of the present invention is shown. Semiconductor device 50 may function as a semiconductor memory device or a transistor with increased on-state drain current, but with no change in the off-state drain current, depending on the bias applied to the semiconductor device 50.

Semiconductor device 50 includes a substrate 12 of a first conductivity type such as p-type, for example. Substrate 12 is typically made of silicon, but may also comprise, for example, germanium, silicon germanium, gallium arsenide, and/or other semiconductor materials. In some embodiments of the invention, substrate 12 can be the bulk material of the semiconductor wafer. In another embodiment shown in FIG. 3, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to 12A. To simplify the description, the substrate 12 will usually be drawn as the semiconductor bulk material as it is in FIG. 2.

Semiconductor device 50 also includes a buried layer 22 of a second conductivity type, such as n-type, for example; a body 24 of the first conductivity type, such as p-type, for example; and source/drain regions 16 and 18 of the second conductivity type, such as n-type, for example. Buried layer 22 may be formed by an ion implantation process on the material of substrate 12. Alternatively, buried layer 22 can be grown epitaxially on top of substrate 12 or formed through a solid state diffusion process.

The body 24 of the first conductivity type is bounded on top by source 16, drain 18, and insulating layer 62 (or by surface 14 in general), on the sides by insulating layers 26, and on the bottom by buried layer 22. Body 24 may be the portion of the original substrate 12 above buried layer 22 if buried layer 22 is implanted. Alternatively, body 24 may be epitaxially grown on top of the buried layer 22 through a solid state diffusion process.

A source 16 and drain 18 having a second conductivity type, such as n-type, for example, are provided in body 24, so as to bound a portion of the top of the body 24 in a manner discussed above, and is exposed at surface 14. Source 16 and drain 18 may be formed by an implantation process on the material making up substrate 12, according to any implantation process known and typically used in the art. Alternatively, a solid state diffusion or a selective epitaxial growth process could be used to form source 16 and drain 18.

A gate 60 is positioned in between the source 16 and the drain 18, above body 24. The gate 60 is insulated from the body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 3:
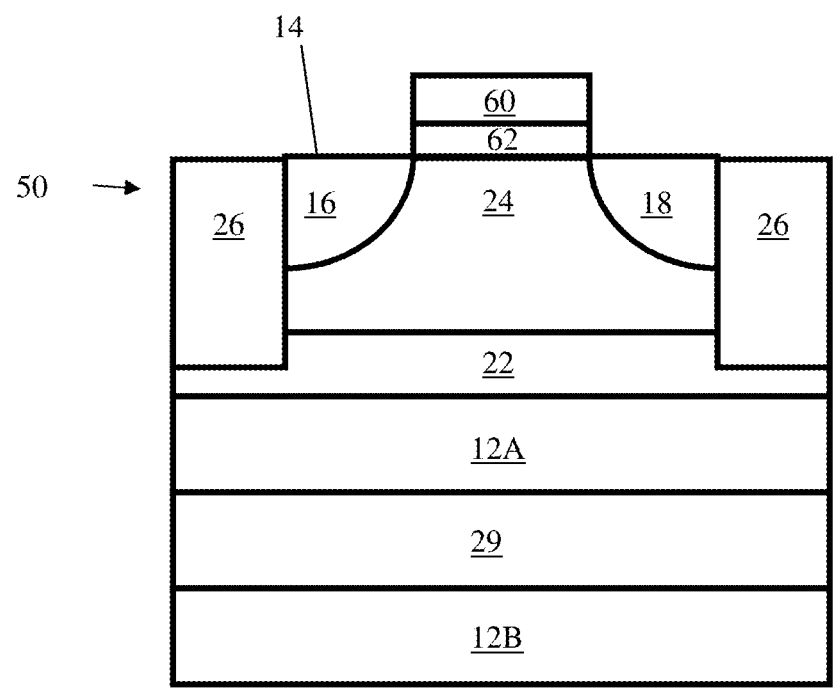
FIG. 3 is a schematic, cross-sectional illustration of a MOS device according to another embodiment of the present invention.

Insulating layers 26 (like, for example, shallow trench isolation (STI)), may be made of silicon oxide, for example, though other insulating materials may be used. Insulating layers 26 insulate semiconductor device 50 from adjacent semiconductor devices 50. The bottom of insulating layer 26 may reside inside the buried layer 22 allowing buried layer 22 to be continuous as shown in FIGS. 2 and 3. Alternatively, the bottom of insulating layer 26 may reside below the buried layer 22 (not shown). This requires a shallower insulating layer 26B (where the bottom of insulating layer 26B resides inside the buried layer 22), which insulates the body 24, but allows the buried layer 22 to be continuous in the perpendicular direction of the cross-sectional view shown in FIG. 2 and FIG. 3. For simplicity, only semiconductor device 50 with continuous buried layer 22 in all directions will be shown from hereon.

Figure 4:
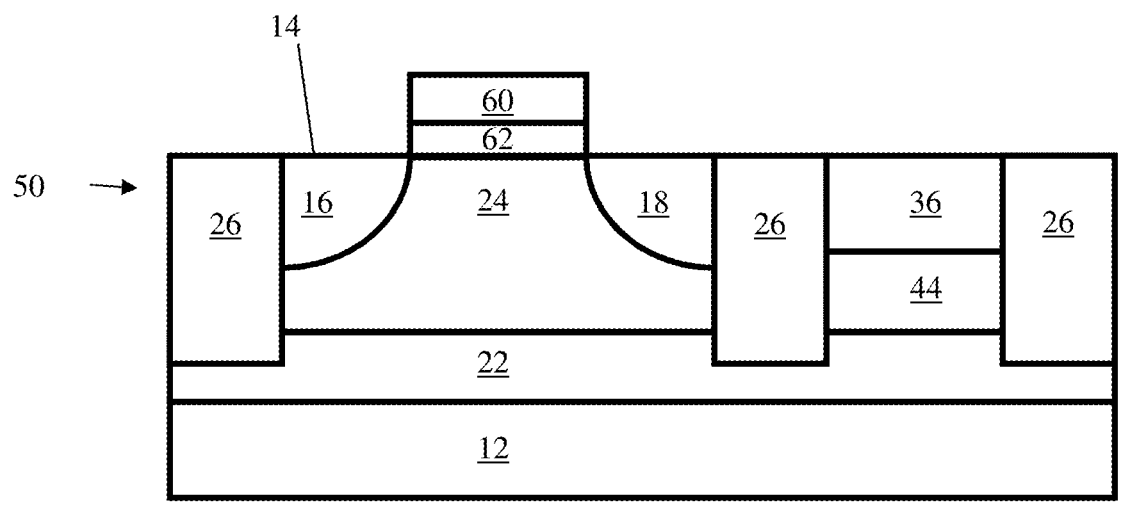
FIG. 4 is a schematic, cross-sectional illustration of a MOS device with buried layer tap region according to an embodiment of the present invention.

FIG. 4 illustrates a cross-sectional illustration of a semiconductor device 50 shown in FIG. 2 with buried layer 22 connected to buried layer tap 36 according to an embodiment of the present invention. The buried layer tap 36 having a second conductivity type, such as n-type, for example, is connected to the buried layer 22 through the buried tap body 44 having a second conductivity type, such as n-type. The buried tap body 44 may be formed by an implantation process following the same process step of the well formation of complementary type of MOS transistor such as p-channel device. The buried tap 36 may be formed by an implantation process or selective epitaxial growth process following the same process step of the source and drain formation of complementary type of MOS transistor such as p-channel device. For example, if buried tap body 44 and buried tap 36 are formed by an ion implantation process, the implant energy (which determines the depth of the implant) for buried tap body 44 is higher than the implant energy for buried layer tap 36.

The operation of the semiconductor device 50 will be described using an n-channel device as an example. The operation of a p-channel device follows the same principle, but the polarity of the applied voltages will be opposite that of the n-channel device (using the source voltage as the reference).

Figure 5:
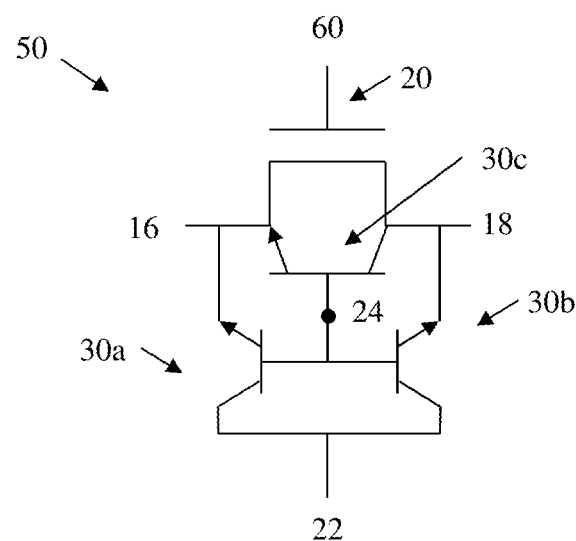
FIG. 5 illustrates an equivalent circuit representing a MOS device according to an embodiment of the present invention.

FIG. 5 illustrates an equivalent circuit representation of semiconductor device 50. Inherent in semiconductor device 50 are metal-oxide-semiconductor (MOS) transistor 20, formed by source 16, gate 60, drain 18, and body 24, and vertical BJTs 30a and 30b, formed by buried layer 22, body 24, and source 16 or drain 18, respectively. Also inherent in semiconductor device 50 is lateral BJT 30c, formed by source 16, body 24, and drain 18.

Figure 6:
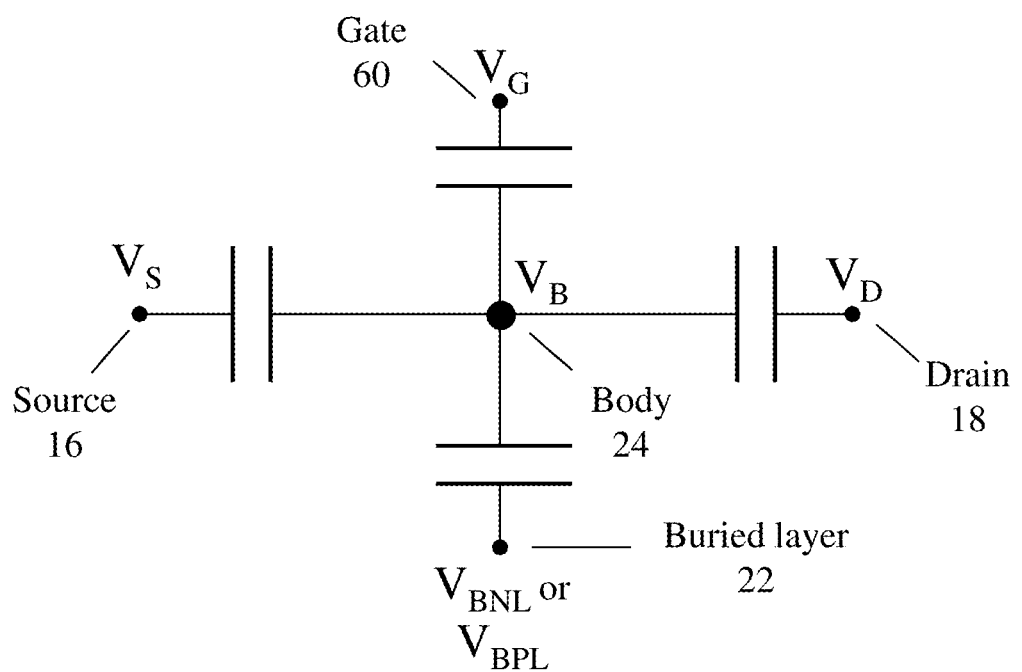
FIG. 6 illustrates an equivalent capacitor circuit model representing a MOS device according to an embodiment of the present invention.

FIG. 6 schematically illustrates an equivalent capacitor circuit representation of semiconductor device 50 shown in FIGS. 2-5. The body 24 potential ($V_B$) is capacitively coupled with gate oxide capacitance, source side junction capacitance, drain side junction capacitance, and buried layer junction capacitance. Therefore, the body 24 potential ($V_B$) can be perturbed by the gate 60 voltage, source 16 voltage, drain 18 voltage, and buried layer 22 voltage ($V_{BNL}$ for buried n-layer and $V_{BPL}$ for buried p-layer voltage).

Semiconductor device 50 may function as a memory device having at least two stable states and as a transistor with increased on-state drain current, but with no change in the off-state drain current, depending on the applied bias to the semiconductor memory device 50. In one embodiment, the properties of the semiconductor device 50 are governed by the voltage applied to the buried layer 22.

Figure 7:
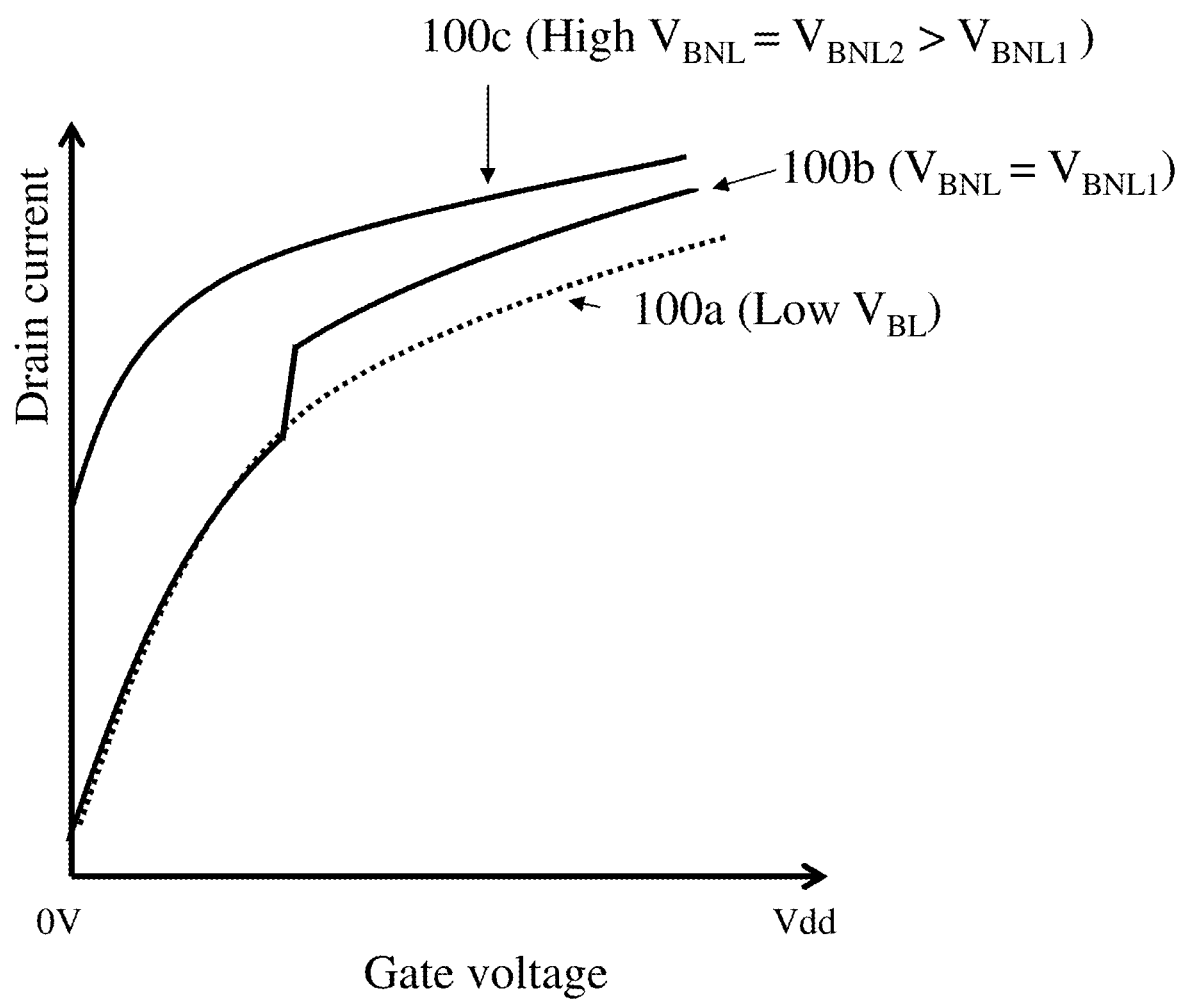
FIG. 7 illustrates drain current versus gate voltage characteristics for various voltages applied to a buried layer, representing a MOS device according to an embodiment of the present invention.

FIG. 7 schematically illustrates drain 18 current versus gate 60 voltage characteristics for various buried layer 22 voltage. In this plot, it is important to note that the applied drain 18 voltage is assumed to be a voltage that does not exceed that which would cause an impact ionization process near the junction between the body 24 and the drain 18. If the voltage applied to the drain region 18 is sufficiently high to cause impact an ionization process near the junction between the body 24 and the drain 18, an increase in the current flow (from the drain region 18 to the source region 16) may also be observed, as described for example in "Hysteresis I-V Effects in Short-Channel Silicon MOS-FETs", Boudou, A. and Doyle, B. S., IEEE Electron Device Letters, vol. EDL-8, no. 7, July 1987, or the kink effect observed in the silicon-on-insulator (SOI) wafer as described for example in "Single-Transistor Latch in SOI MOSFETs", Chen, C.-E. D., et al, IEEE Electron Device Letters, vol. 9, no. 12, December 1988, which are hereby incorporated herein, in their entireties, by reference thereto. Because the voltage applied to the drain region 18 to cause impact ionization process is typically higher than the operating voltage of the transistor, this may result in degradation of the transistor performance and reliability over time.

If the buried layer 22 is biased at low voltage such as zero volts, the drain 18 current versus the gate 60 voltage characteristic 100a shows ordinary MOSFET characteristics.

At high voltage $V_{BNL2}$ applied to the buried layer 22, the semiconductor device 50 will function as a memory device having at least two stable states. If the constant voltage applied to the buried layer 22 is sufficiently high that if body 24 potential is greater than the potential required to turn-on vertical BJT 30a, regardless of the gate 60 and the drain 18 voltages, electron hole pairs are generated near a junction between the body 24 and the buried layer 22 even at the gate voltage of zero. The resulting hot electrons flow into the buried layer 22 while the resulting hot holes will subsequently flow into the body region 24. When the following condition is met: β×(M−1)≈1—where β is the forward common-emitter current gain of the bipolar transistors 30a or 30b and M is the impact ionization coefficient—the amount of holes injected into the body region 24 compensates for the charge lost due to p-n junction forward bias current between the body region 24 and the source line region 16 or bit line region 18 and due to holes recombination. This process maintains the charge (i.e. holes) stored in the body region 24 which will keep the n-p-n bipolar transistors 30a and 30b on for as long as a positive bias is applied to the buried well region 22. The state where the body potential is sufficiently high and is maintained by the hole current generated at the junction of body 24 and buried layer 22 is referred to as the logic-1 state of the memory device 50. As shown in the drain 18 current versus gate 60 voltage characteristics for high buried layer 22 voltage 100c of FIG. 7, the lateral BJT 30c current flows even at the zero gate voltage, when the memory device 50 is in logic-1 state.

If body 24 is neutrally charged (the voltage on body 24 being equal to the voltage on grounded drain region 18), a state corresponding to logic-0, no (or low) current will flow through the n-p-n bipolar devices 30a and 30b. The bipolar devices 30a and 30b will remain off and no impact ionization occurs. Consequently memory cells in the logic-0 state will remain in the logic-0 state.

Several operations can be performed to semiconductor device 50 operating as a memory device such as holding, read, write logic-1 and write logic-0 operations, and have been described for example in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto.

If the buried layer 22 is biased at a positive voltage (but less positive than the positive voltage which results in the drain 18 current versus gate 60 voltage characteristics 100c), gate 60 and drain 18 voltages can elevate body 24 potential to be greater than a potential required to turn-on vertical BJT 30a by capacitive coupling. When the vertical BJT 30a is turned on, electrons from source 18 (emitter) flow to the buried layer 22 (collector) of the vertical BJT 30a. The constant voltage applied to the buried layer 22 is enough to cause impact ionization process, and electron hole pairs are generated near a junction between the body 24 and the buried layer 22. The generated electrons are collected by the positively biased buried layer 22, while the generated holes flow into the body 24. These generated holes act as a base current of the lateral BJT 30c, which turns on the lateral BJT 30c. As a result, the on-state drain current becomes the sum of MOS transistor 20 current and lateral BJT 30c current. As shown in the drain 18 current versus gate 60 voltage characteristics for high buried layer 22 voltage 100b of FIG. 7, the on-state drain current is boosted compared to the on-state drain current with the buried layer 22 biased at zero. If desired, the on-state drain current can be further boosted by increasing the voltage applied to the buried layer 22. However, the off-state drain current can be the same as the off-state drain current with the buried layer 22 biased at zero, because the body 24 potential at the gate voltage of zero becomes smaller than the threshold voltage for turning on the vertical BJT 30c. Therefore, at a positive bias $V_{BNL1}$ (less positive than the positive voltage $V_{BNL2}$ which results in a memory device having at least two stable states), semiconductor device 50 functions as a transistor with increased on-state drain current, but with no change in the off-state drain current. Also notice that the drain 18 current versus gate 60 voltage characteristics of 100c exhibits a steep slope (<60 mV/dec) when at the gate 60 voltage when the lateral BJT 30c is first activated.

Figure 8:
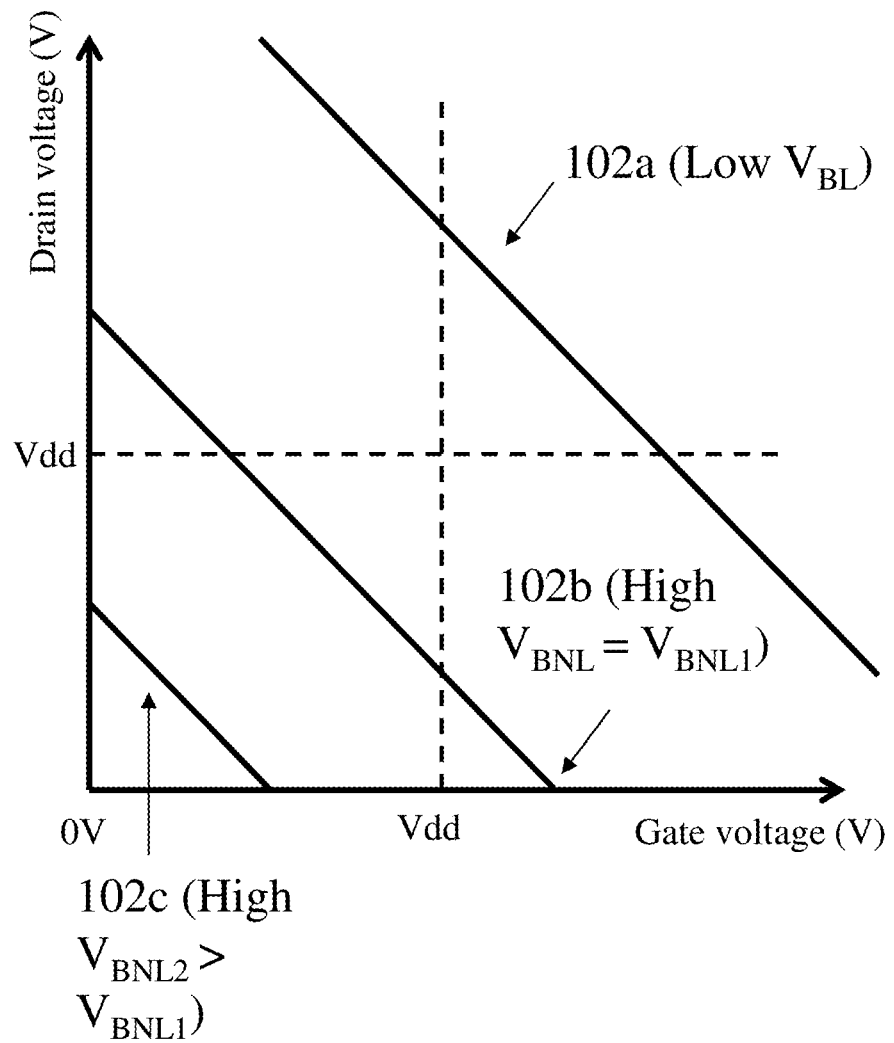
FIG. 8 illustrates minimum gate and drain voltage to activate an intrinsic lateral BJT for different voltages applied to a buried layer, representing a MOS device according to an embodiment of the present invention.

When the constant voltage applied to the buried layer 22 is less than a voltage to cause an impact ionization process near the junction between the buried layer 22 and the body 24, no lateral BJT 30c action take place at any body 24 potentials. For a constant voltage applied to the buried layer 22 that is greater than or equal to that required to cause an impact ionization process, FIG. 8 represent the drain 18 voltage and gate 60 voltage that start to form body 24 potential to turn on the vertical BJT 30a. In other words, the lines (102a, 102b, and 102c) indicate the minimum gate 60 and drain 18 voltages to activate the lateral BJT 30c at a given buried layer 22 voltage. The voltages at upper and right region of the line causes the lateral BJT 30c to be turned on. A line may locate above power supply voltage Vdd for a low voltage applied to the buried layer 22 (for example, line 102a). In this case, no lateral BJT 30c would be activated within the normal operation voltage ranging from 0V to Vdd. For a very high voltage applied to the buried layer 22, a line may locate inside Vdd (for example, line 102c). In this case, the lateral BJT 30c is activated even at gate 60 voltage of zero. For some high voltage applied to the buried layer 22, a line (for example, line 102b) may intersect to the Vdd lines (dotted lines). In this case, the lateral BJT 30c is activated even at gate 60 voltage of Vdd, but the lateral BJT 30c can be turned off at gate 60 voltage of zero. Therefore, various operations can be attained according to the desired characteristics.

Several operations can be performed by MOS device 50 having increased on-state drain current, but with no change in the off-state drain current. When a supply voltage (Vdd) such as 1.0 volt is applied to the gate 60 and the drain 18, depending on the voltage applied to the buried layer 22, both MOS transistor 20 and lateral BJT 30c can be turned on, which results in higher on-state drain current than the conventional MOSFET, or MOS transistor 20 can be turned on while the lateral BJT 30c is turned off, which results in the same on-state drain current compared to the conventional MOSFET. When zero volts is applied to the gate 60 and Vdd such as 1.0 volt is applied to the drain 18, MOS transistor 20 can be turned off while the lateral BJT 30c is turned on, which results in a high off-state drain leakage current, or both MOS transistor 20 and lateral BJT 30c can be turned off, which results in lowest off-state drain current. According to an embodiment of the present invention, aforementioned various operational states can be determined by different levels of voltage applied to the buried layer 22. The switching between on and off of MOS transistor 20 is associated with a voltage applied to gate 60. The switching between on and off of lateral BJT 30c is associated with a voltage applied to gate 60 and buried layer 22.

In one particular non-limiting embodiment, $V_{BNL2}$ is about +2.0 volts, $V_{BNL1}$ is about +1.5 volts, and low $V_{BL}$ is a positive voltage lower than $V_{BNL1}$. However, these voltage levels may vary, while maintaining the relationship that $V_{BNL2}$ is more positive than $V_{BNL1}$. These voltage levels may depend for example on the doping profile and the depth of the buried layer region 22.

Figure 9:
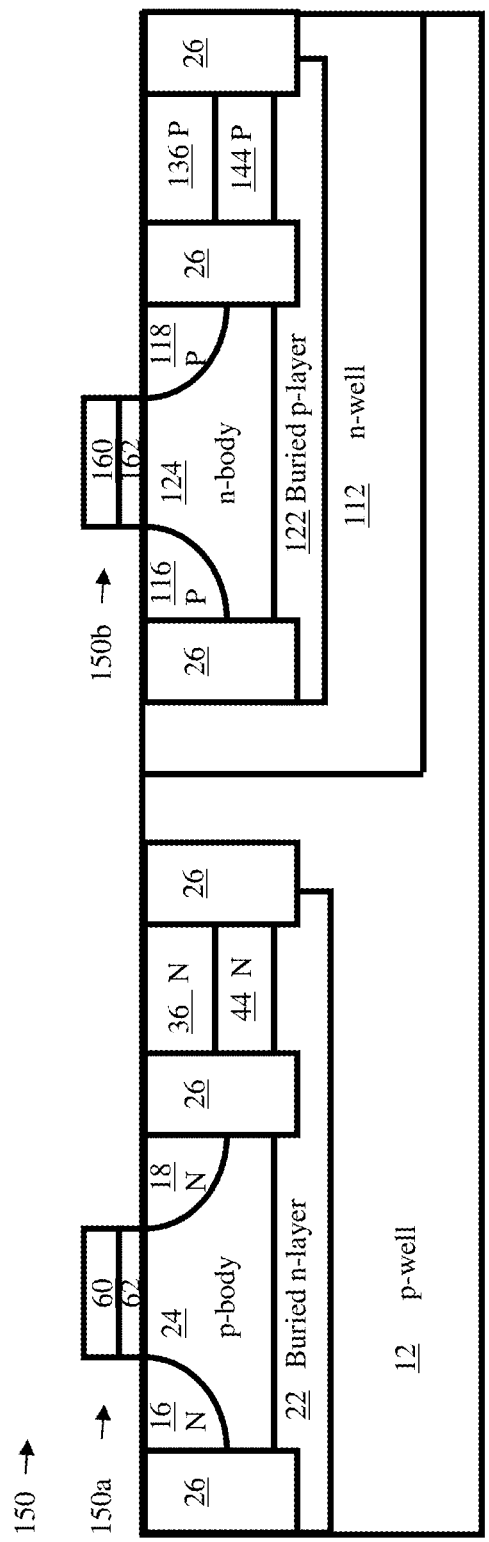
FIG. 9 is a schematic, cross-sectional illustration of a CMOS device implemented in standard dual well process according to an embodiment of the present invention.

FIG. 9 is a cross-sectional illustration of a complementary MOS device 150 configured with n-channel 150a and p-channel 150b devices on the same wafer implemented in a standard dual well process. The n-channel MOS device 150a is positioned inside p-well 12 while the p-channel MOS device 150b is positioned inside n-well 112. Source 116, drain 118, buried layer 122, and buried layer tap 136 of the p-channel device 150b are configured to have opposite conductivity type compared to corresponding components of the n-channel device 150a and as explained in reference to FIG. 2. Ion implantation process conditions to form a buried p-layer 122 and n-well 112 in the p-channel 150b device are designed to avoid shorting between buried p-layer 122 and p-well 12. A two-step ion implantation process, where a p-type ion implantation is followed by n-type ion implantation or vice versa, may be necessary in the p-channel 150b device. Extra n-type ion implantation to form buried n-well 112 is conditioned to compensate the high doping concentration of the tail profile of the buried p-layer 122 to prevent shorting between buried p-layer 122 and p-well 12.

The physical mechanism, operations, and characteristics of the n-channel 150a and p-channel 150b device are analogous to the MOS device 50 explained from FIG. 5 through FIG. 8. However, when the source is assumed to be a reference, the operation voltages of n-channel and p-channel device are of opposite polarity from each other.

Figure 10:
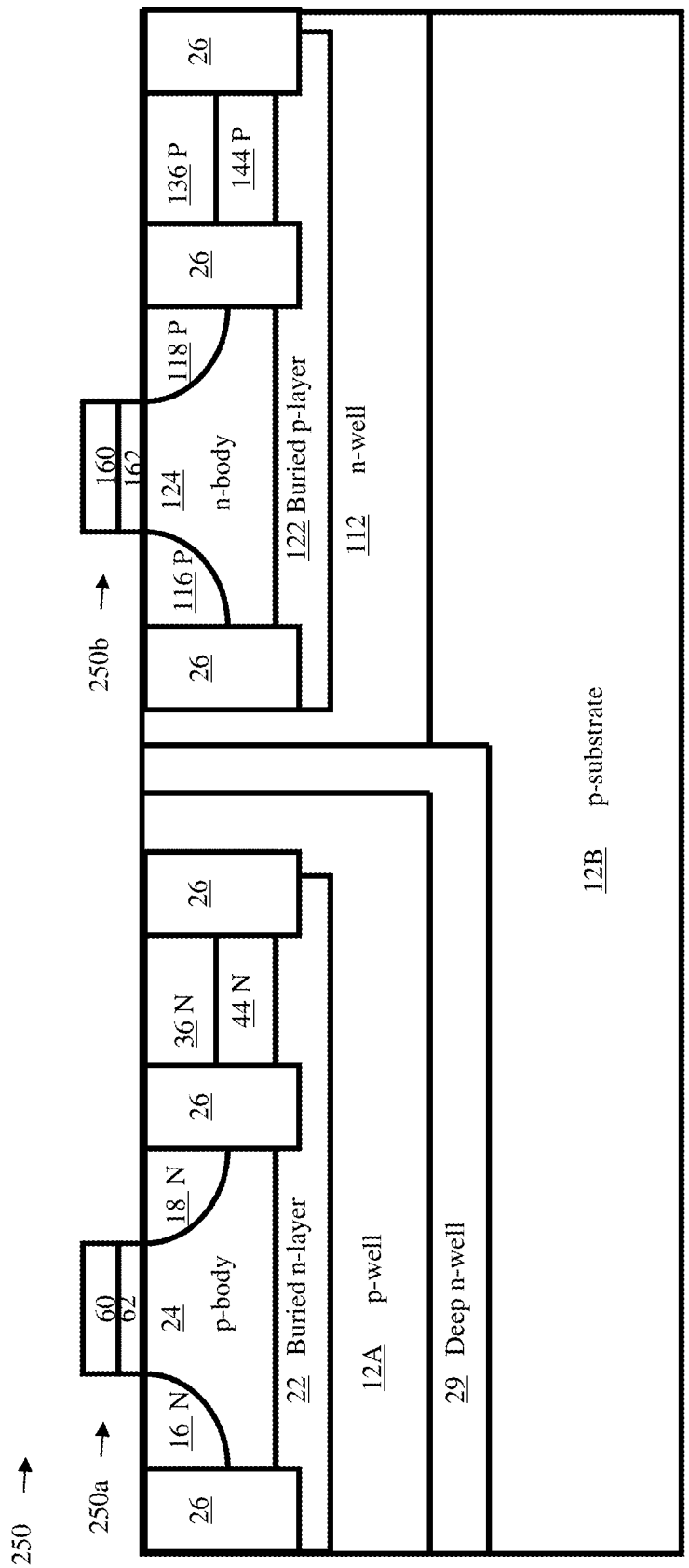
FIG. 10 is a schematic, cross-sectional illustration of a CMOS device implemented in standard triple well process according to another embodiment of the present invention.

FIG. 10 is a cross-sectional illustration of a complementary MOS device 250 configured with n-channel 250a and p-channel 250b devices on the same wafer implemented in a standard triple well process. The n-channel MOS device 250a is positioned inside p-well 12A that is inside the deep n-well 29 while the p-channel MOS device 250b is positioned inside n-well 112. Source 116, drain 118, buried layer 122, and buried layer tap 136 of the p-channel device 250b are configured to have opposite conductivity type of the n-channel device 250a and that explained in regard to FIG. 2. Ion implantation process conditions to form a buried n-layer 22 and p-well 12A in the n-channel 250a device are designed to avoid shorting between buried n-layer 22 and deep n-well 29. Ion implantation process conditions to form a buried p-layer 122 and n-well 112 in the p-channel 250b device are designed to avoid shorting between buried p-layer 122 and p-well 12A. Two-step ion implantation processes, where n-type ion implantation is followed by p-type ion implantation or vice versa, may be necessary in both n-channel 250a and p-channel 250b devices. In n-channel device 250a, extra p-type ion implantation is conditioned to compensate the high doping concentration of the tail profile of the buried n-layer 22 to prevent shorting between buried n-layer 22 and deep n-well 29. In p-channel device 250b, extra n-type ion implantation is conditioned to compensate the high doping concentration of the tail profile of the buried p-layer 122 to prevent shorting between buried p-layer 122 and p-substrate 12B.

The physical mechanism, operations, and characteristics of the n-channel 250a and p-channel 250b device are analogous to the MOS device 50 explained from FIG. 5 through FIG. 8. However, when the source is assumed to be a reference, the operation voltages of n-channel and p-channel device are of opposite polarity to each other.

Figure 11:
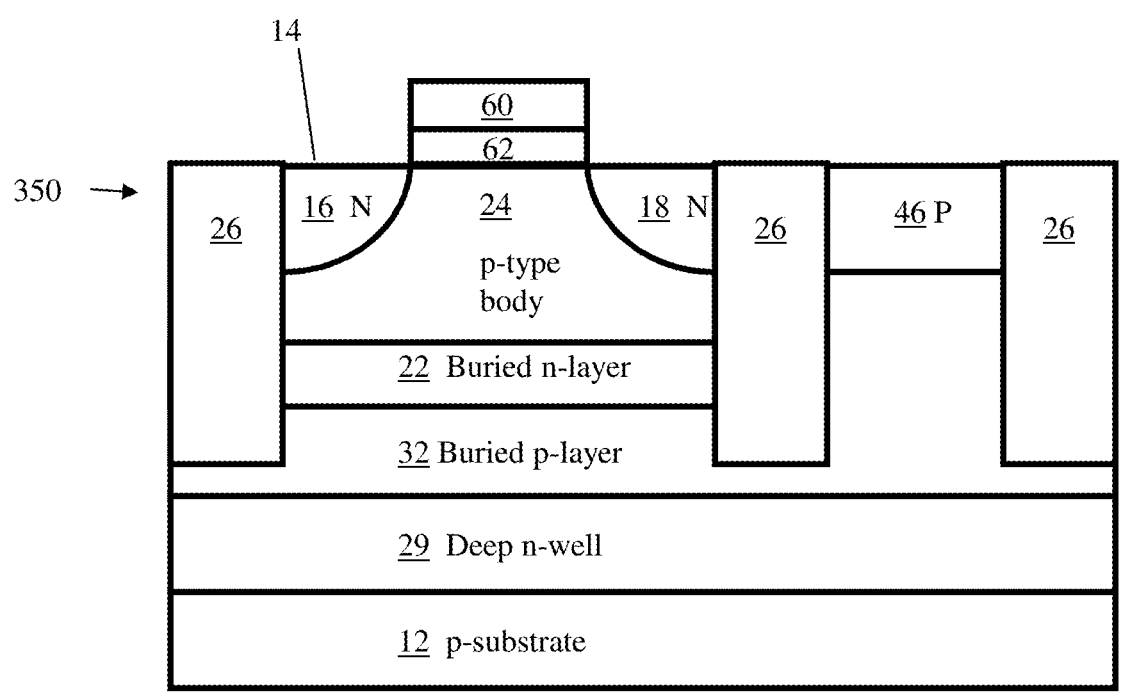
FIG. 11 is a schematic, cross-sectional illustration of a MOS device according to another embodiment of the present invention.

Referring to FIG. 11, a MOS device 350 according to another embodiment of the present invention is shown. MOS device 350 includes a substrate 12 of a first conductivity type such as p-type, for example. The MOS device 350 includes a deep well 29 of the second conductivity type, such as n-type. MOS device 350 also includes a first buried layer 32 of a first conductivity type, such as p-type, for example; a second buried layer 22 of a second conductivity type, such as n-type, for example; a body 24 of the first conductivity type, such as p-type, for example; and source/drain 16 and 18 of the second conductivity type, such as n-type, for example. Buried layers 22 and 32 may be formed by an ion implantation process on the material of substrate 12. Alternatively, buried layer 22 and 32 can be grown epitaxially on top of substrate 12 or formed through a solid state diffusion process.

The body 24 of the first conductivity type and the second buried layer 22 of the second conductivity type are bounded on top by source 16, drain 18, and insulating layer 62 (or by surface 14 in general), on the sides by insulating layers 26, and on the bottom by the first buried layer 32 of the first conductivity type. While the body 24 and the second buried layer 22 are not directly connected to any terminals, the first buried layer 32 is connected to the buried layer tap 46 according to the present invention. The buried layer tap 46 having a first conductivity type, such as p-type, for example, is connected to the first buried layer 32.

Figure 12:
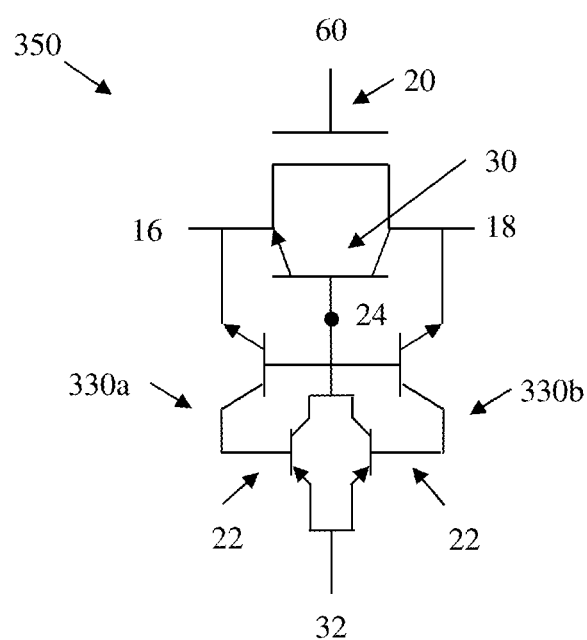
FIG. 12 illustrates an equivalent circuit of the MOS device shown in FIG. 11.

FIG. 12 illustrates an equivalent circuit representation of MOS device 350. Inherent in MOS device 350 are metal-oxide-semiconductor (MOS) transistor 20, formed by source 16, gate 60, drain 18, and body 24, and vertical pnpn thyristors 330a and 330b, formed by first buried layer 32, second buried layer 22, body 24, and source 16 or drain 18, respectively. Also inherent in MOS device 350 is lateral BJT 30, formed by source 16, body 24, and drain 18.

Figure 13:
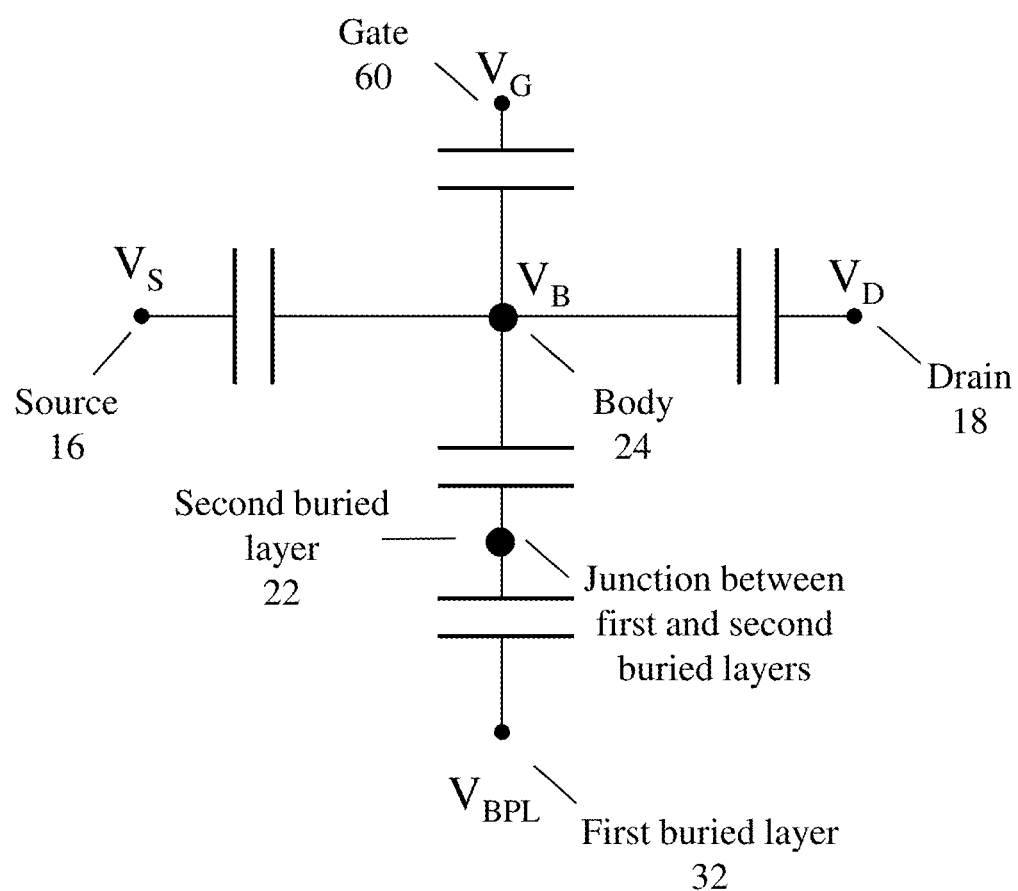
FIG. 13 illustrates an equivalent capacitor circuit model representing the MOS device shown in FIG. 11.

FIG. 13 schematically illustrates an equivalent capacitor circuit representation of MOS device 350 shown in FIG. 11. The body 24 potential ($V_B$) is capacitively coupled with gate 60 oxide capacitance, source 16 side junction capacitance, drain 18 side junction capacitance, first buried layer 32 junction capacitance, and second buried layer 22 junction capacitance. Therefore, the body 24 potential ($V_B$) can be perturbed by the gate 60 voltage, source 16 voltage, drain 18 voltage, and first buried layer 32 voltage.

Several operations can be performed by MOS device 350. When a supply voltage (Vdd) such as 1.0 volt is applied to the gate 60 and the drain 18, both MOS transistor 20 and lateral BJT 30 can be turned on, which results in higher on-state drain current than the conventional MOSFET, or MOS transistor 20 can be turned on while the lateral BJT 30 are turned off, which results in the same on-state drain current compared to the conventional MOSFET. When zero volts are applied to the gate 60 and Vdd such as 1.0 volt is applied to the drain 18, MOS transistor 20 can be turned off while the lateral BJT 30 is turned on, which results in a high off-state drain leakage current, or both MOS transistor 20 and lateral BJT 30c can be turned off, which results in lowest off-state drain current. According to an embodiment of the present invention, aforementioned various operational states can be determined by different levels of voltages applied to the first buried layer 32. The switching between on and off of MOS transistor 20 is associated with a voltage applied to gate 60. The switching between on and off of lateral BJT 30 is associated with a voltage applied to gate 60 and first buried layer 32.

Drain 18 current versus gate 60 voltage characteristics of MOS device 350 for various first buried layer 32 voltages may also be illustrated by the drain current versus gate voltage relationship shown in FIG. 7 and the drain voltage versus gate voltage relationship shown in FIG. 8. If the first buried layer 32 is biased at low voltage such as zero volts, the drain 18 current versus the gate 60 voltage characteristic 100a shows ordinary MOSFET characteristics.

If the constant voltage applied to the first buried layer 32 is very high for body 24 potential to be greater than the potential required to turn-on vertical thyristor 330a, regardless of the gate 60 and the drain 18 voltages, the electron hole pairs are generated near a junction between the body 24 and the second buried layer 22 even at the gate voltage of zero. As a result, the lateral BJT 30 current flows even at the zero gate voltage due to the hole supply.

If the first buried layer 32 is biased at a positive voltage (but less positive than the positive voltage which results in the drain 18 current versus gate 60 voltage characteristics 100c), gate 60 and drain 18 voltages can elevate body 24 potential to be greater than a potential required to turn-on thyristor 330a by capacitive coupling. When the vertical thyristor 330a is turned on, electrons from source 18 (emitter) flow toward the second buried layer 22 of the vertical thyristor 330a. If the electrical potential induced the second buried layer 22 is enough to cause an impact ionization process, the electron hole pairs are generated near a junction between the body 24 and the second buried layer 22. The generated holes flows into the body 24. These generated holes act as a base current of the lateral BJT 30, which turns on the lateral BJT 30. As a result, the on-state drain current becomes a sum of MOS 20 current and lateral BJT 30 current. Therefore, the on-state drain current is boosted compared to the on-state drain current with the buried layer 22 biased at zero. If desired, the on-state drain current could be further boosted by increasing the voltage applied to the first buried layer 32. However, the off-state drain current remains the same as the off-state drain current with the first buried layer 32 biased at zero, because the body 24 potential at the gate voltage of zero becomes smaller than the threshold voltage for turning on the vertical thyristor 330a. Also notice that the drain 18 current versus gate 60 characteristics 100c exhibits a steep slope (<60 mV/dec) when at the gate 60 voltage when the lateral BJT 30 is first activated.

In one embodiment of the present invention, a fixed low or zero voltage applied to the first buried layer 32 is selected to turn off the lateral BJT 30c at any gate 60 and drain 18 voltages. In this case, the MOS device 350 may be used as a regular transistor.

In another embodiment of the present invention, a fixed high voltage applied to the first buried layer 32 is selected to turn on the lateral BJT 30c at the gate voltage of zero. In this case, the MOS device 350 may be used as a single-transistor-latch or single-transistor memory.

In another embodiment of the present invention, the fixed voltage applied to the first buried layer 32 is selected to turn on the lateral BJT 30c at the gate voltage of Vdd but turn off the lateral BJT 30c at the gate voltage of zero. In this case, the MOS device 350 results in boosted on-state drain current but the off-state drain current remains the same as the off-state drain current of a regular transistor.

In another embodiment of the present invention, the high voltage applied to the first buried layer 32 is modulated to adjust and trim a skew of the transistor.

In another embodiment of the present invention, the voltage applied to the first buried layer 32 is modulated according to the change of device temperature in order to comply with the shift of gate 60 and drain 18 voltages to turn on the lateral BJT 30c.

Figure 14:
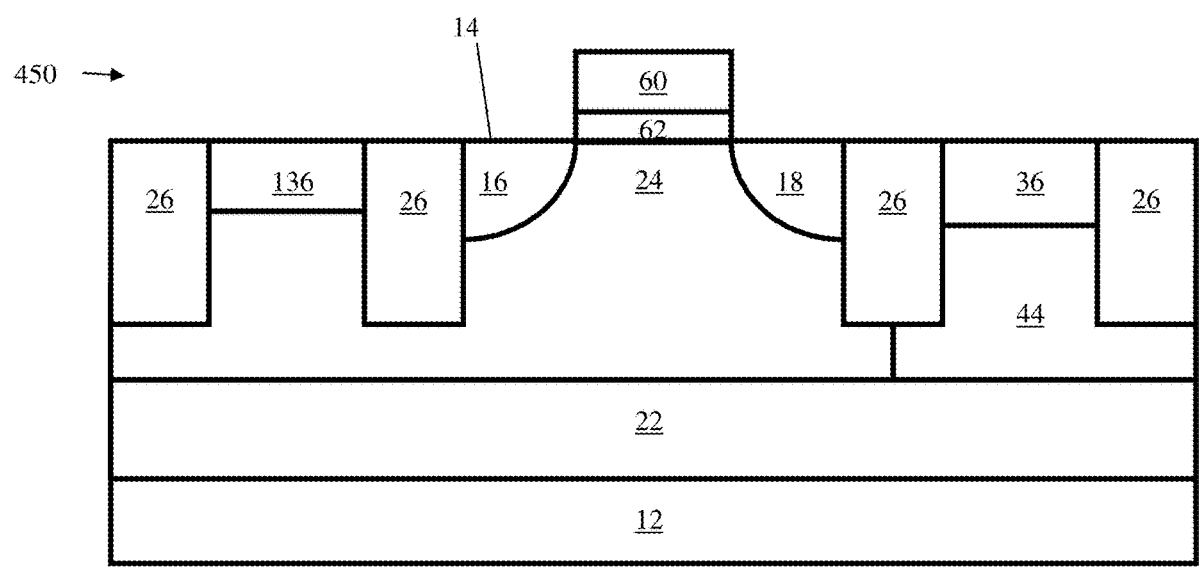
FIG. 14 is a schematic, cross-sectional illustration of a MOS device with body tap and buried layer tap region according to an embodiment of the present invention.
Figure 15A:
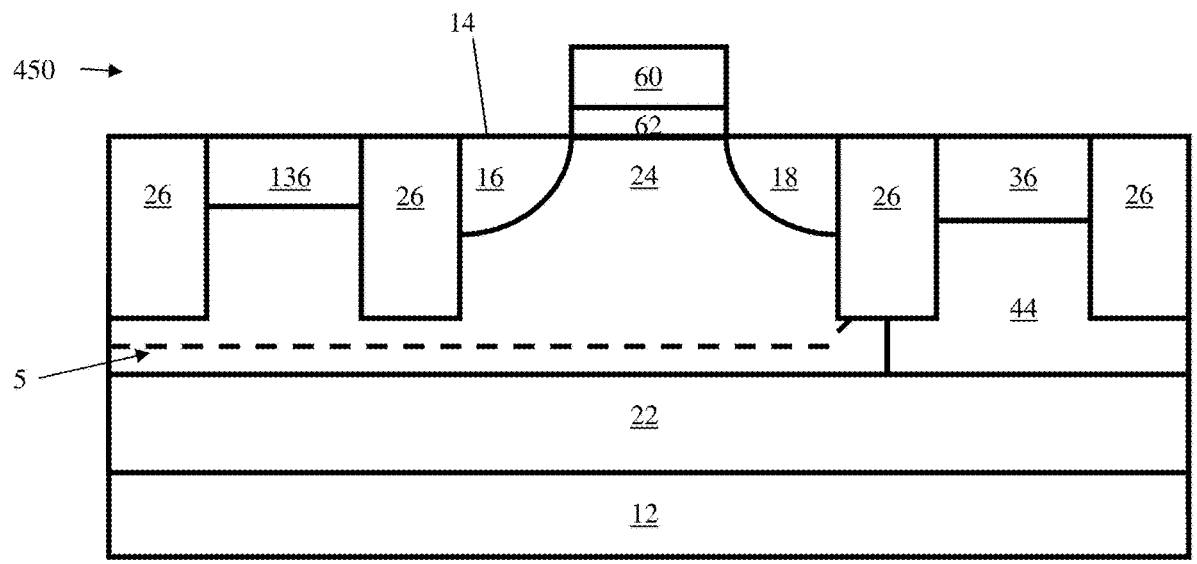
FIGS. 15A-15B are schematic, cross-sectional illustrations of a MOS device with body tap and buried layer tap region with the depletion region boundary according to an embodiment of the present invention.
Figure 15B:
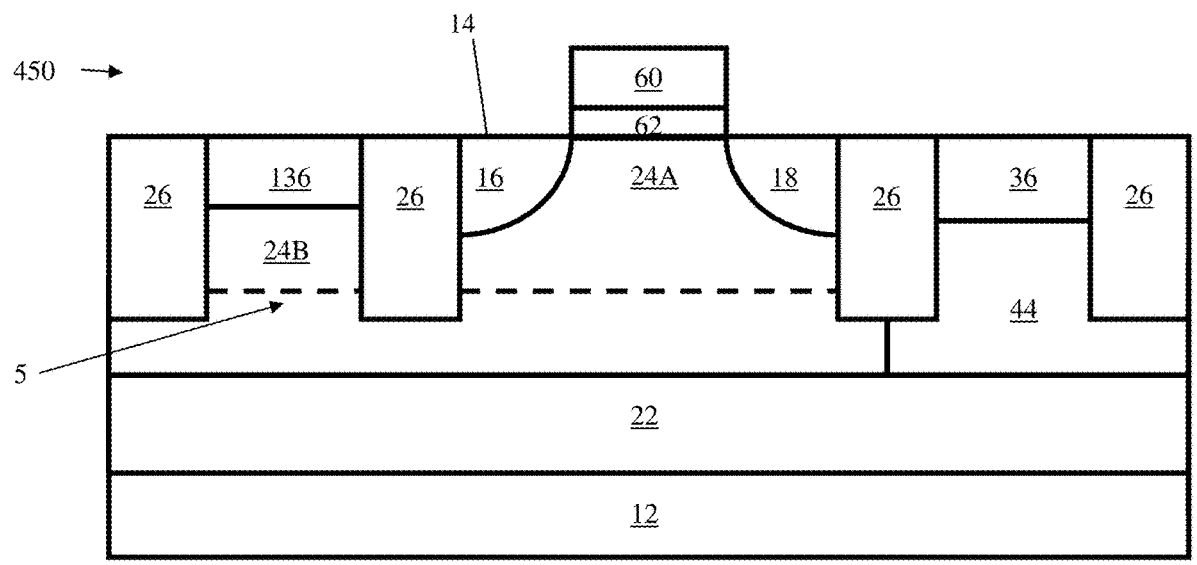
Figure 16:
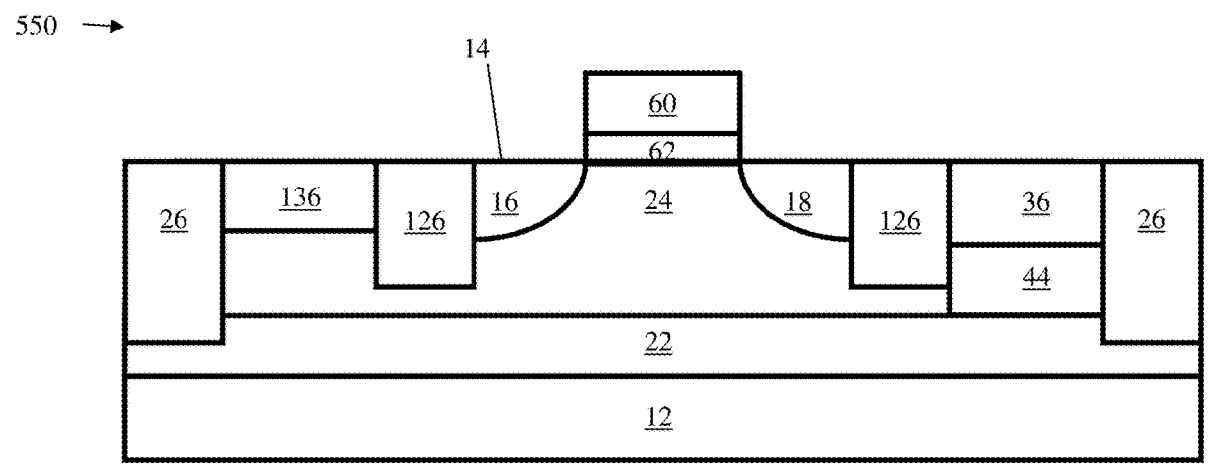
FIG. 16 is a schematic, cross-sectional illustration of a MOS device with body tap and buried layer tap region having dual STI depth according to an embodiment of the present invention.

FIGS. 14-16 illustrate MOS device 450 according to another embodiment of the present invention. MOS device 450 comprises a body contact 136 that can be tied or isolated to body 24 of the MOS device 450. The isolation or connection of body contact 136 to the body 24 is modulated by the back bias voltage applied to the buried layer 22. It should be understood that the FIGS. 14-16 can be complementary types based on either dual well or triple well process as explained in FIG. 9 and FIG. 10. Furthermore, the MOS device 450 can be extended to the thyristor type as explained in the FIGS. 11-13.

Referring to FIG. 14, the body 24 of the MOS device 450 is connected to the body contact 136 with an insulating layer 26 in between. One difference between the MOS device 450 and the MOS device 50 is that the buried layer 22 is formed not to contact the bottom of the insulating layer 26. Therefore the body 24 of the MOS device 450 is connected to the body contact 136. More specifically, the body 24 and the body contact 136 can be 'electrically' tied (FIG. 15A) or separated (FIG. 15B) by the depletion region boundary 5 in the body 24 side formed between the body 24 and the buried layer 22. FIGS. 15A-15B show the MOS device 450 shown in FIG. 14 with depletion region boundary 5 in the body 24 side formed between the body 24 and the buried layer 22. However the other depletion region boundaries formed in between the body 24 and the source 16, and the body 24 and the drain 18, are not shown in FIGS. 15A-15B. Also, the depletion region boundary 5 in the buried layer 22 side formed between the body 24 and the substrate 12 is not shown.

When about zero volts is applied to the buried layer 22, the depletion region boundary 5 does not isolate the body 24 from the body contact 136, as shown in FIG. 15A. As reverse voltage applied to the buried layer 22 (a positive voltage for n-type buried layer 22 or a negative voltage for p-type buried layer 22) increases, the depletion region boundary 5 moves upward and approaches to the bottom of the insulating layers 26. When the depletion region boundary reaches the bottoms of the insulating layer as well as when it extends above the bottoms, the body 24 is separated into the body 24A in transistor region and the body 24B in the body tapping region by the insulating layer 26 and the depletion region boundary 5 as illustrated in FIG. 15B. The minimum reverse voltage applied to the buried layer 22 that separates (isolates) the body contact 136 from the body 24 is referred to as the separating threshold voltage. As reverse voltage applied to the buried layer 22 further exceeds the separating threshold voltage, the body 24A is kept isolated from the body contact 136, as shown in FIG. 15B.

The body contact 136 may be grounded throughout the operation. When the MOS device 450 is to be turned off, zero or a voltage less than separating threshold voltage is applied to the buried layer 22, and as a result the body 24 is connected to the body contact 136. As a result, the excess of majority carriers in the body 24 can be swept out toward to the body contact 136. When the MOS device 450 is turned on, a voltage greater than separating threshold voltage is applied to the buried layer 22, so that the body 24 is isolated from the body contact 136 in a manner as described above. As a result, on-state drain current is enhanced by the sum of MOS transistor 20 and the lateral BJT 30c due to the same mechanism explained throughout FIG. 2 to FIG. 8.

As the bottom of the insulating layer 26 does not reside inside the buried layer 22 in FIG. 14 and FIGS. 15A-15B, the voltages applied to the body contact 136 and the buried layer 22 can be shared with the neighboring MOS devices 450.

Figure 17A:
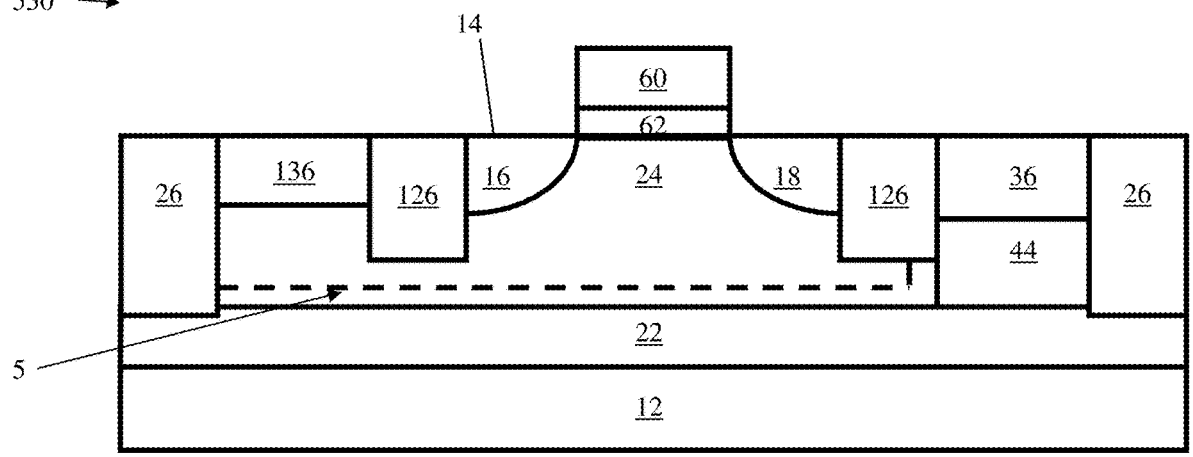
FIGS. 17A-17B are schematic, cross-sectional illustrations of a MOS device with body tap and buried layer tap region having dual STI depth with the depletion region boundary according to an embodiment of the present invention.
Figure 17B:
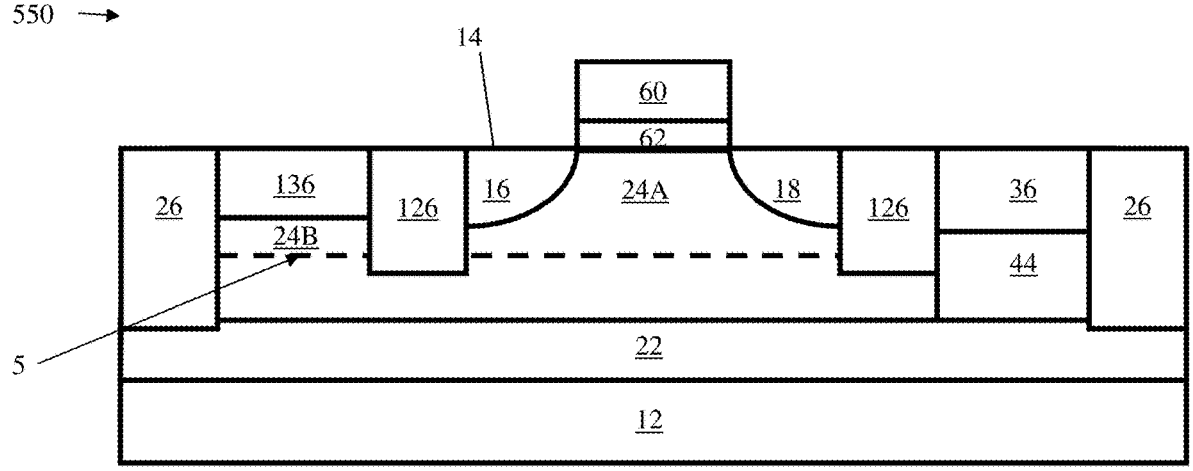

FIGS. 16 and 17A-17B illustrate MOS device 550 according to another embodiment of the present invention, which comprises body contact 136 with an insulating layer 126 in between body contact 136 and source 16. MOS device 550 allows for sharing of the buried layer 22 voltage, but the potential of the body 24 remains isolated. Insulating layers 126 are disposed between the transistor region 16/24/18 and the body tapping region 136, as well as between the buried layer tapping region 36 and the transistor region 16/24/18, while additional insulating layers 26 are the same as ordinary isolating layers such as shallow trench isolation that are used to isolate adjacent devices. The depth of the insulating layer 126 is shallower than the insulating layer 26, which may be fabricated by the dual STI process. The bottom of insulating layer 26 resides inside the buried layer 22 allowing buried layer 22 to be continuous as shown in FIGS. 16 and 17A-17B. However, the bottom of the insulating layer 126 is formed not to contact the buried layer 22, so the body 24 of the MOS device 550 is connected to the body contact 136, but the voltage applied to the body contact 136 does not affect neighboring MOS devices 550. The device turn-on and turn-off operation follows the same mechanism as MOS device 450 illustrated in FIGS. 14 and 15.

Figure 18A:
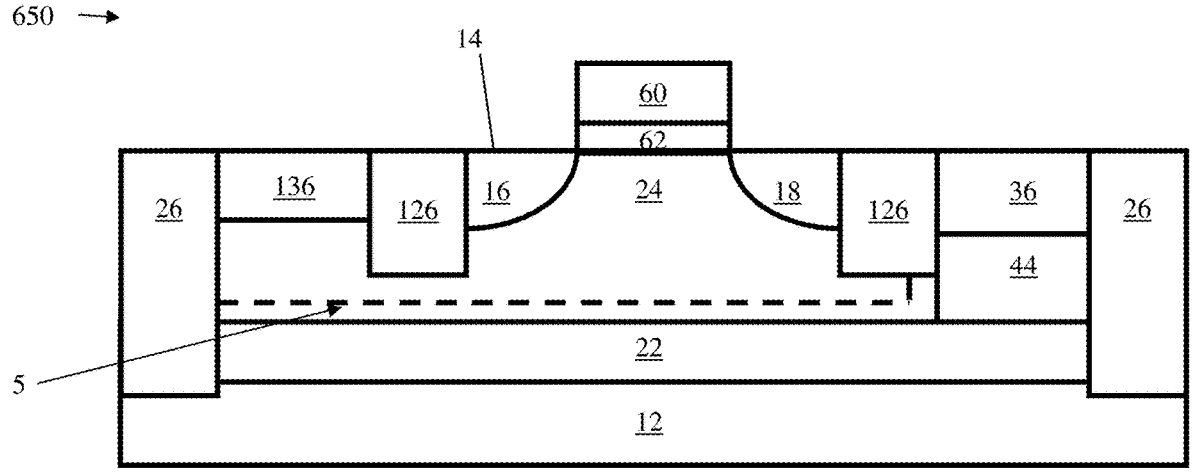
FIGS. 18A-18B are schematic, cross-sectional illustrations of a MOS device with body tap and buried layer tap region having another dual STI depth with the depletion region boundary according to an embodiment of the present invention.
Figure 18B:
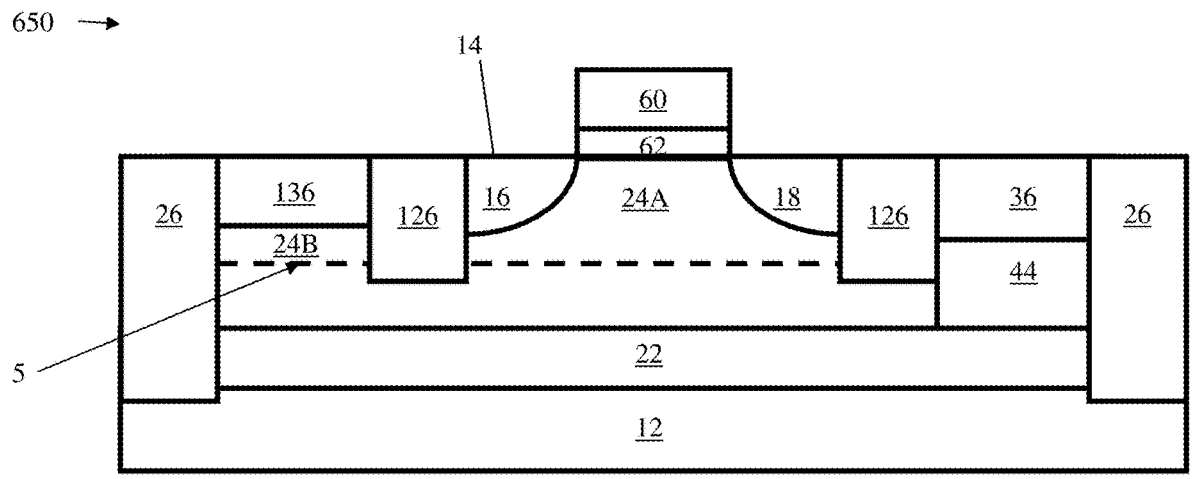

FIGS. 18A-18B illustrate MOS device 650 according to another embodiment of the present invention, where both buried layer 22 voltage and body 24 voltage are not shared between adjacent MOS devices 650. Source 16 and body 24 are connected to the body contact 136 with an insulating layer 126 in between. Insulating layers 126 are disposed between the transistor region and the body tapping region 136 or the buried layer tapping region 36, while additional insulating layers 26 are the same as ordinary isolating layers such as shallow trench isolation that is used to isolate adjacent devices. A depth of the insulating layer 126 is shallower than the insulating layer 26, which may be fabricated by the dual STI process. The bottom of insulating layer 26 resides below the buried layer 22 allowing buried layer 22 to be isolated within the device unit as illustrated in FIGS. 18A-18B. The bottom of the insulating layer 126 is formed not to contact the buried layer 22 so the body 24 of the MOS device 650 is connected to the body contact 136. Therefore, the voltages applied to the body contact 136 and the buried layer 22 through the buried layer tap 36 and the buried tap body 44 does not affect neighboring MOS devices 650. The device turn-on and turn-off operation follows the same mechanism as MOS device 450 illustrated in FIGS. 14 and 15A-15B.

Figure 19A:
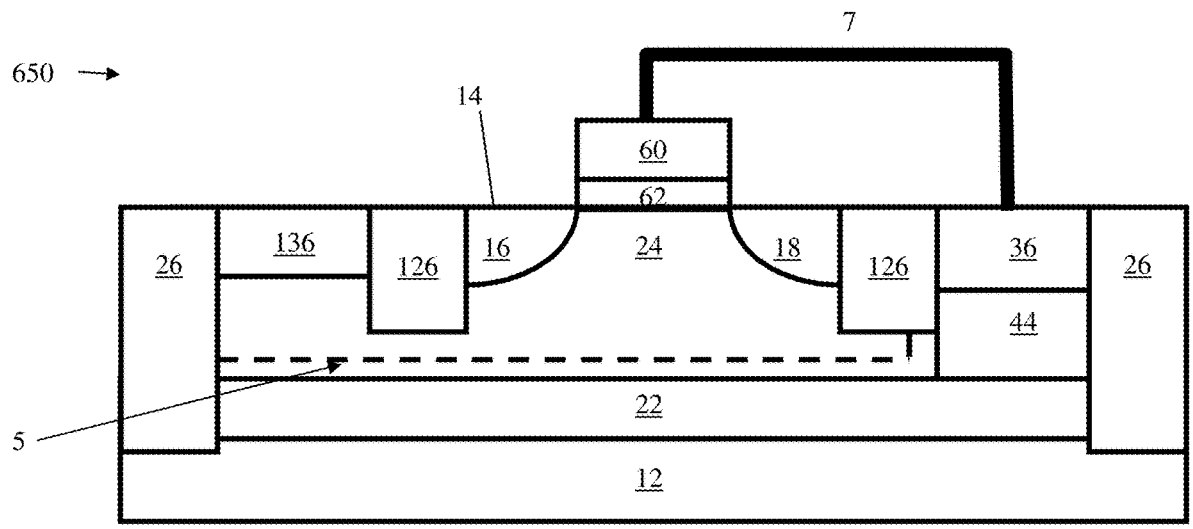
FIGS. 19A-19B are schematic, cross-sectional illustrations of a MOS device with body tap and buried layer tap region tied to gate having another dual STI depth with the depletion region boundary according to an embodiment of the present invention.
Figure 19B:
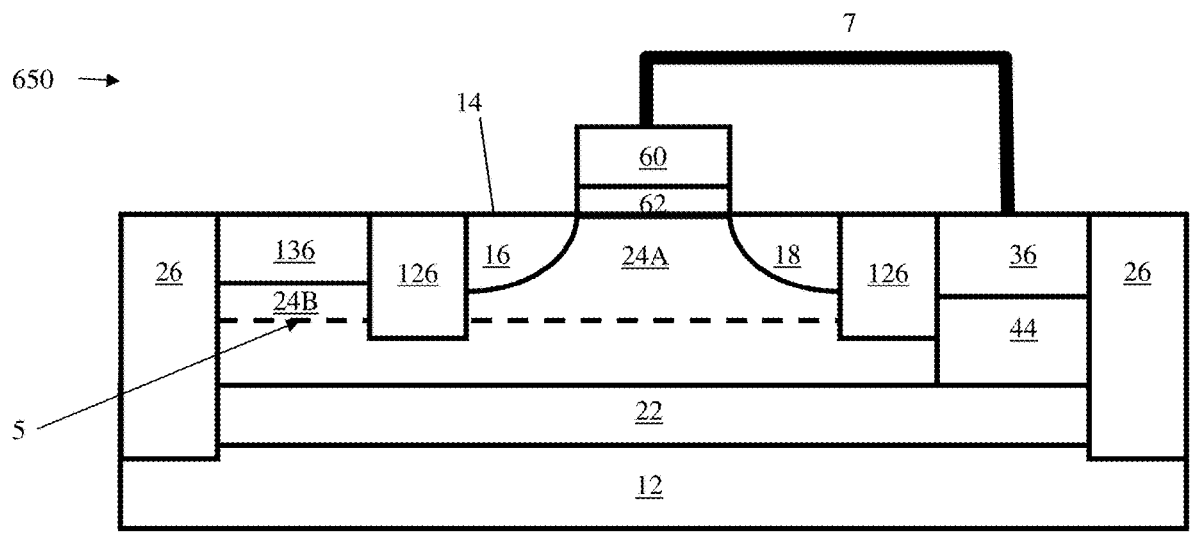

In MOS devices 50, 150, 250, 350, 450, 550, and 650, the voltages applied to the gate 60 and the buried layer 22 are independently controlled. FIGS. 19A-19B illustrate another embodiment of the present invention where the gate 60 and the buried layer 22 are tied. Referring to FIGS. 19A-19B, the gate 60 and the buried layer tap 36 of the MOS device 650 shown in FIGS. 18A-18B are connected. This connection may be accomplished by a metallization process. The buried layer 22 is therefore biased by the same voltage as that applied to the gate 60. When the gate 60 is biased zero to turn off the MOS device 650, the depletion region boundary 5 is not sufficiently formed to allow for the body 24 connected to body contact 136 to be isolated therefrom as shown in FIG. 19A, because the voltage applied to the buried layer 22 that is the same as that applied to gate 60 is less than the separating threshold voltage. As a result, the excess of majority carrier in the body 24 can be swept out to the body contact 136 as quickly as the gate voltage ramp down. The buried layer 22 and the insulating layer 126 may be configured for the depletion region boundary 5 to be formed to isolate the body region 24 at the buried layer 22 voltage of the drive voltage of the device. In such case, when the gate 60 is biased by drive voltage to turn on the MOS device 650, the depletion region boundary 5 is formed to separate the body 24 from the body contact 136 as shown in FIG. 19B. As a result, on-state drain current is boosted by a sum of MOS transistor 20 and the lateral BJT 30c due to the same mechanism explained throughout FIG. 2 to FIG. 8.

Figure 20A:
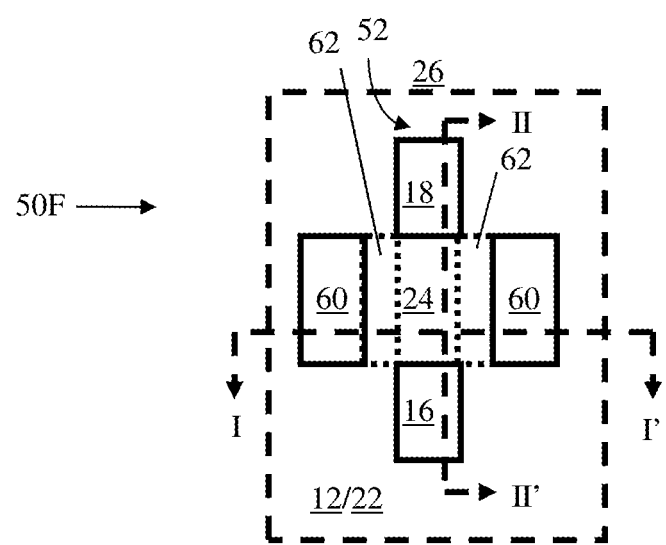
FIG. 20A is a schematic, top view of a MOS device comprising a fin structure according to an embodiment of the present invention.
Figure 20B:
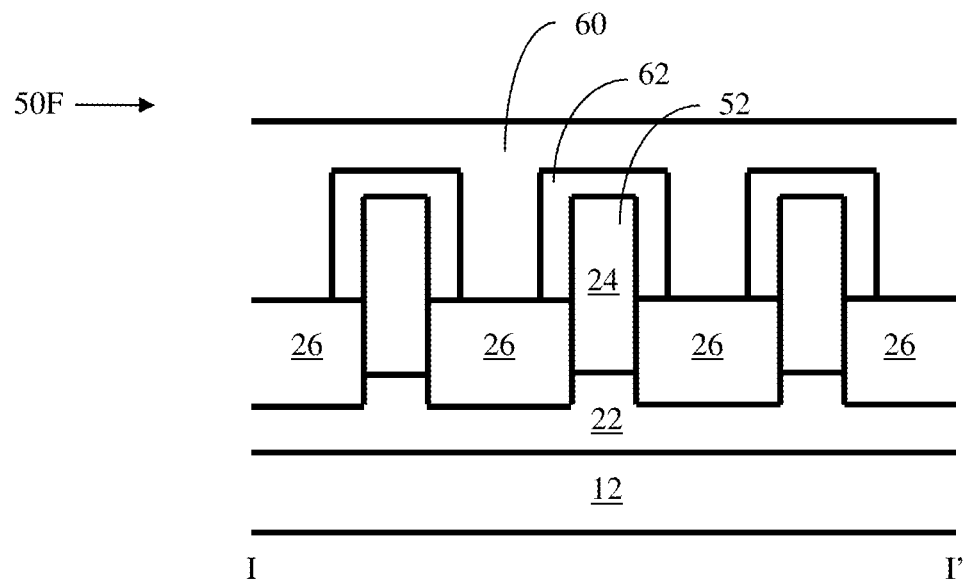
FIG. 20B is a schematic, cross-sectional view of the MOS device of FIG. 20A taken along line I-I'.
Figure 20C:
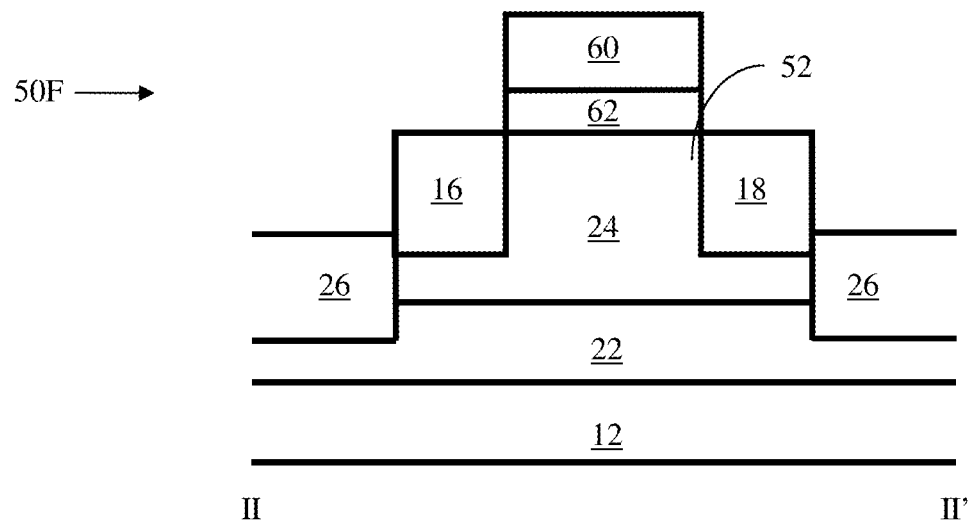
FIG. 20C is a schematic, cross-sectional view of the MOS device of FIG. 20A taken along line II-II'.

FIGS. 20A-20C illustrate a top view and cross-sectional views of MOS device 50F comprising a fin structure 52 according to another embodiment of the present invention. Fin structure 52 extends perpendicularly from the substrate 12 to form a three-dimensional structure and comprises body 24 having a first conductivity type with buried layer region 22 having a second conductivity type and located below the body 24. Substrate 12 is typically made of silicon, but may also comprise, for example, germanium, silicon germanium, gallium arsenide, and/or other semiconductor materials. In some embodiments of the invention, substrate 12 can be the bulk material of the semiconductor wafer.

The operation of MOS device 50F follows the same principle as MOS device 50 explained throughout FIGS. 2-8, where increased on-state current can be obtained through intrinsic bipolar junction transistor (BJT).

Figure 20D:
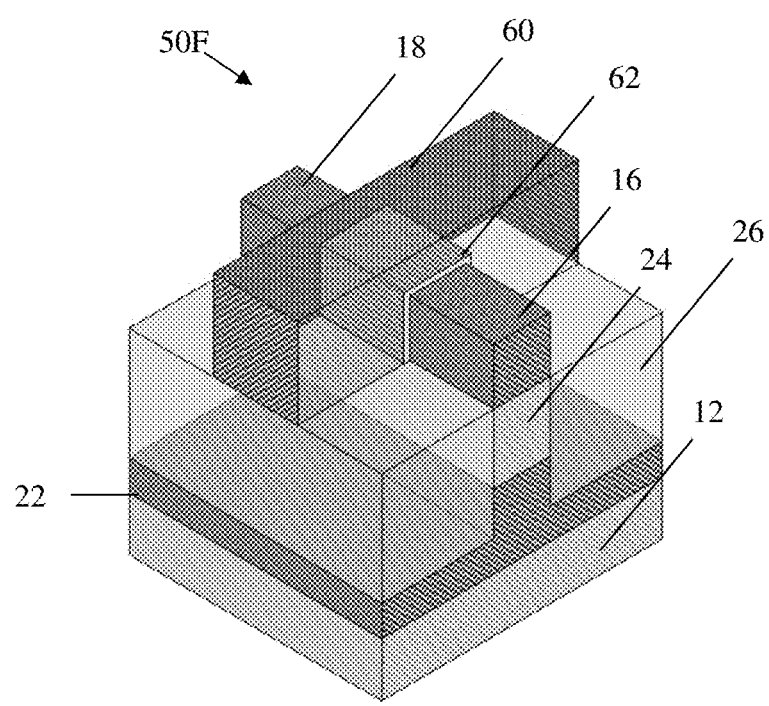
FIG. 20D is a schematic, three-dimensional view of the MOS device of FIG. 20A.

FIG. 20D illustrates a schematic three-dimensional view of MOS device 50F. Fin type MOS device 50F also includes a buried layer 22 of a second conductivity type, such as n-type, for example; a fin type body 24 of the first conductivity type, such as p-type, for example; and source/drain regions 16 and 18 of the second conductivity type, such as n-type, for example. Buried layer 22 may be formed by an ion implantation process on the material of substrate 12. Alternatively, buried layer 22 can be grown epitaxially on top of substrate 12 or formed through a solid state diffusion process.

The fin type body 24 of the first conductivity type is bounded on top by source 16, drain 18, and insulating layer 62, on the sides by insulating layer 26, and on the bottom by buried layer 22. Fin type body 24 may be the portion of the original substrate 12 above buried layer 22 if buried layer 22 is implanted. Alternatively, fin type body 24 may be epitaxially grown on top of the buried layer 22 through a solid state diffusion process.

A source 16 and drain 18 having a second conductivity type, such as n-type, for example, are provided in body 24, so as to bound a portion of the top of the fin type body 24 in a manner discussed above. Source 16 and drain 18 may be formed by an implantation process on the material making up substrate 12, according to any implantation process known and typically used in the art. Alternatively, a solid state diffusion or a selective epitaxial growth process could be used to form source 16 and drain 18.

A gate 60 is positioned in between the source 16 and the drain 18, above body 24. The gate 60 is insulated from the fin type body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate MOS device 50F from adjacent fin type MOS devices 50F. The bottom of insulating layer 26 may reside inside the buried layer 22 allowing buried layer 22 to be continuous as shown in FIGS. 20A-20D and 21A-21C. Alternatively, the bottom of insulating layer 26 may reside below the buried layer 22 (not shown). This requires a shallower insulating layer 26, which insulates the body 24, but allows the buried layer 22 to be continuous in direction of the I-I' cross-sectional view shown in FIG. 20B. For simplicity, only MOS device 50F with continuous buried layer 22 in all directions will be shown from hereon.

Figure 21A:
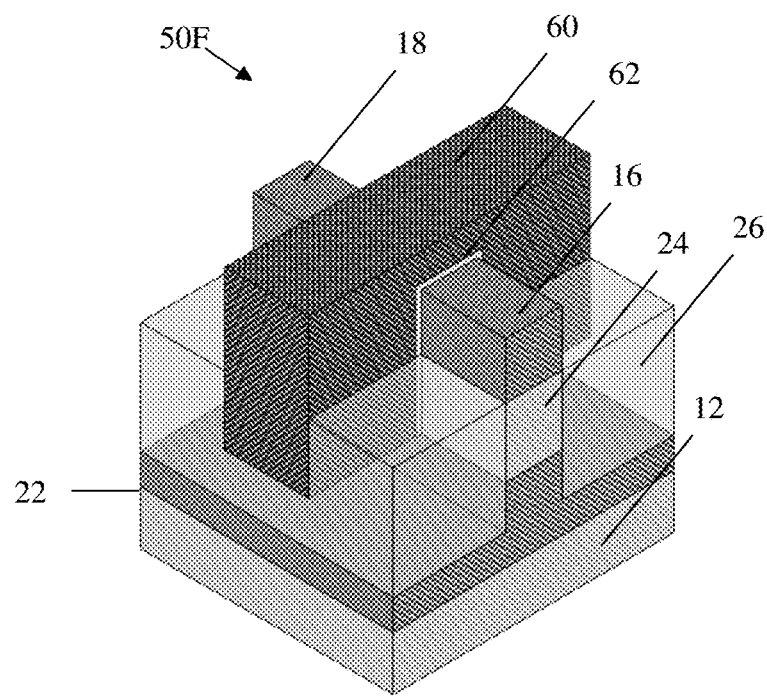
FIG. 21A is a schematic, illustration of a fin type MOS device according to another embodiment of the present invention.
Figure 22:
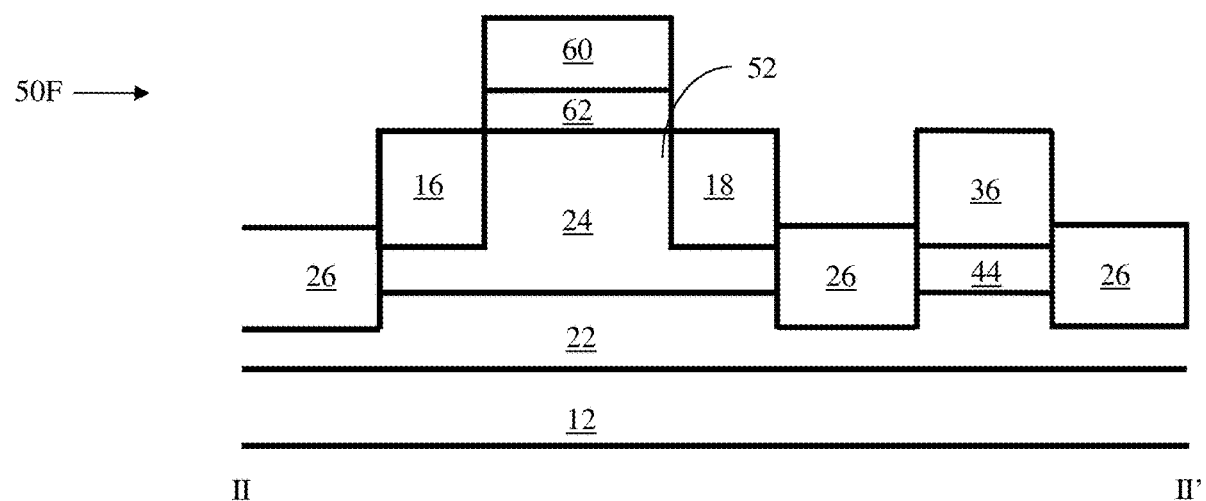
FIG. 22 is a schematic, cross-sectional illustration of a fin type MOS device with buried layer tap region according to an embodiment of the present invention.

FIG. 22 is across-sectional illustration of a fin type MOS device 50F shown in FIGS. 20A-20D and 21A with buried layer 22 connected to buried layer tap 36 according to an embodiment of the present invention. The buried layer tap 36 having a second conductivity type, such as n-type, for example, is connected to the buried layer 22 through the buried tap body 44 having a second conductivity type, such as n-type. The buried tap body 44 may be formed by an implantation process following the same process step of the well formation of complementary fin type of MOS transistor such as p-channel device. The buried tap 36 may be formed by an implantation process or selective epitaxial growth process following the same process step of the source and drain formation of complementary type of MOS transistor such as p-channel device.

FIG. 21A illustrates a fin type MOS device according to another embodiment of the present invention. In this embodiment, the bottom of the gate 60 is extended down to align to the junction between the body 24 and the buried layer 22. This increases the capacitive coupling efficiency between the gate 60 voltage and the body 24 potential.

Figure 21B:
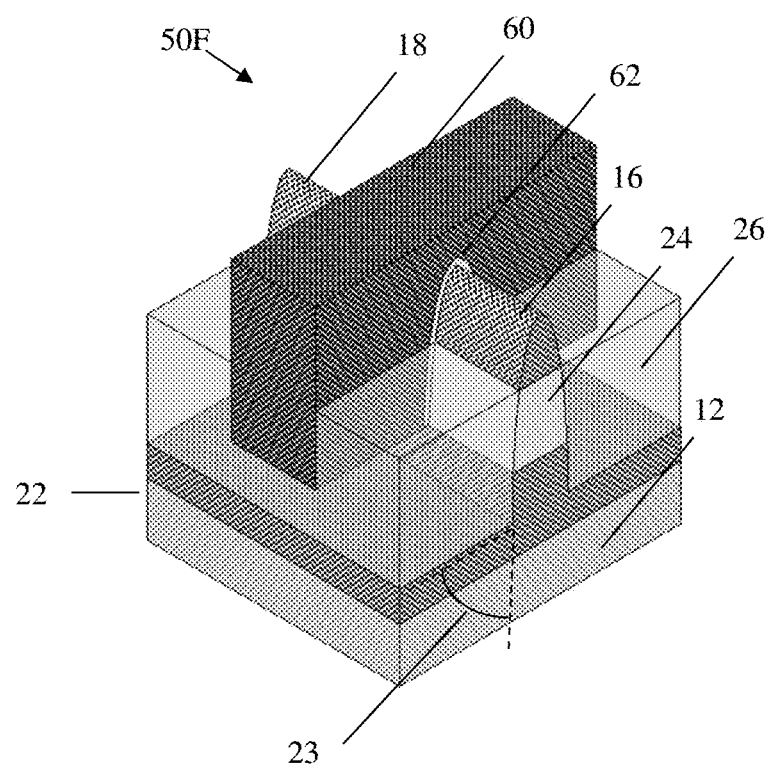
FIG. 21B is a schematic, illustration of a fin type MOS device according to another embodiment of the present invention.

FIG. 21B illustrates a fin type MOS device according to another embodiment of the present invention. In order to increase the capacitive coupling efficiency between the gate 60 voltage and the fin type body 24 potential, the fin type body 24 is tapered. The gate 60 voltage controllability to the junction potential between the fin type body 24 and the buried layer 22 may be increased due to the wider fin width near the junction and the angle between the gate 60 and the junction angle 23 between the fin type body 24 and the buried layer 22 becomes less than 90°.

Figure 21C:
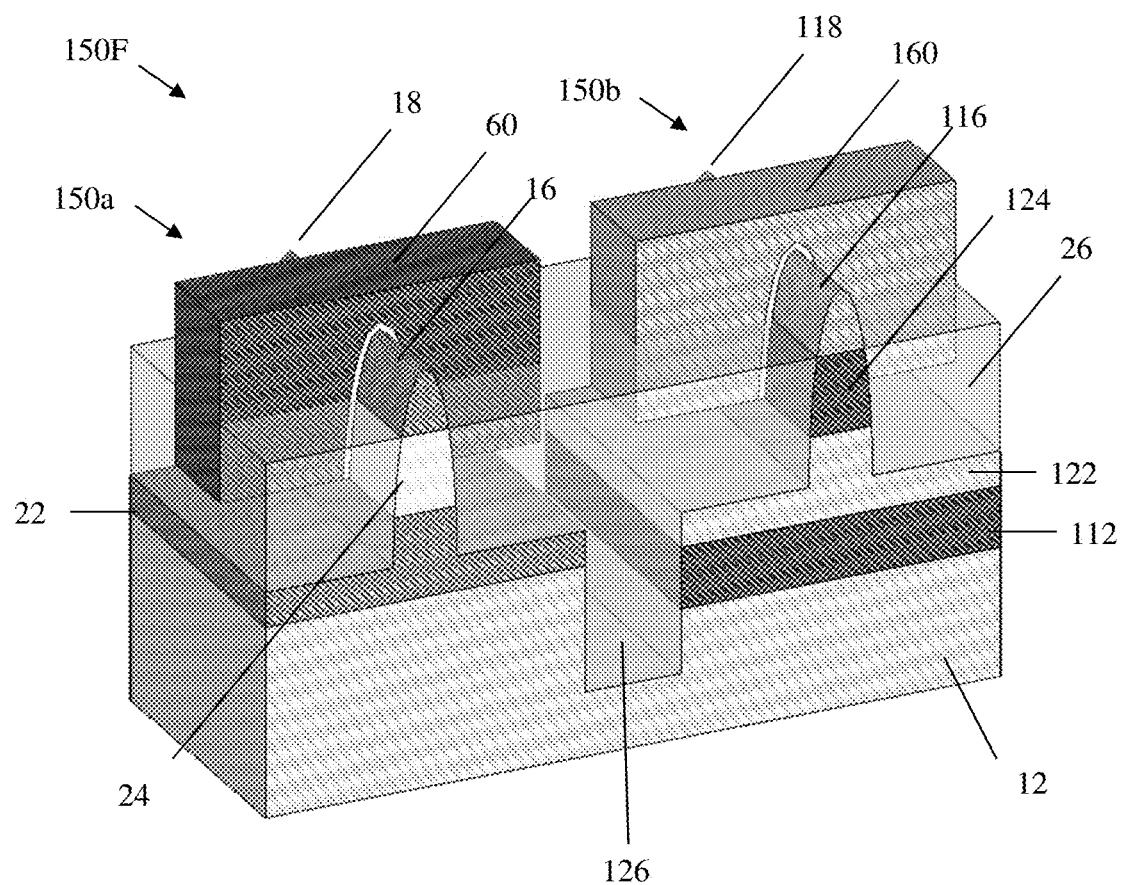
FIG. 21C is a schematic, illustration of a complementary fin type MOS device according to another embodiment of the present invention.

FIG. 21C illustrates a complementary fin type MOS device 150F comprising n-channel 150a and p-channel 150b devices on the same wafer implemented in a standard dual well process. The n-channel MOS device 150a is positioned inside p-type substrate 12 while the p-channel MOS device 150b is positioned inside n-well 112. Source 116, drain 118, buried layer 122, and buried layer tap (not shown) of the p-channel device 150b are configured to have opposite conductivity type of the n-channel device explained in FIGS. 20A-20C and 21B. Ion implantation process conditions to form a buried p-layer 122 and n-well 112 in the p-channel 150b device are designed to avoid shorting between buried p-layer 122 and p-well 12. A two-step ion implantation process, where a p-type ion implantation is followed by n-type ion implantation or vice versa, may be performed in the p-channel 150b device. Extra n-type ion implantation to form buried n-well 112 may be conditioned to compensate the high doping concentration of the tail profile of the buried p-layer 122 to prevent shorting between buried p-layer 122 and p-well 12. Furthermore, in order to prevent shorting between buried p-layer 122 and p-well 12, a dual-depth STI process may be introduced. The STI region 126 deeper than the insulating layer 26 may physically isolate the buried p-layer 122 and the p-well 12.

The effects and results of the n-channel 150a and p-channel 150b device are analogous to the MOS device 50 explained from FIG. 5 through FIG. 8. However, when the source is assumed to be a reference, the operation voltages of n-channel and p-channel device are opposite each other.

Figure 23:
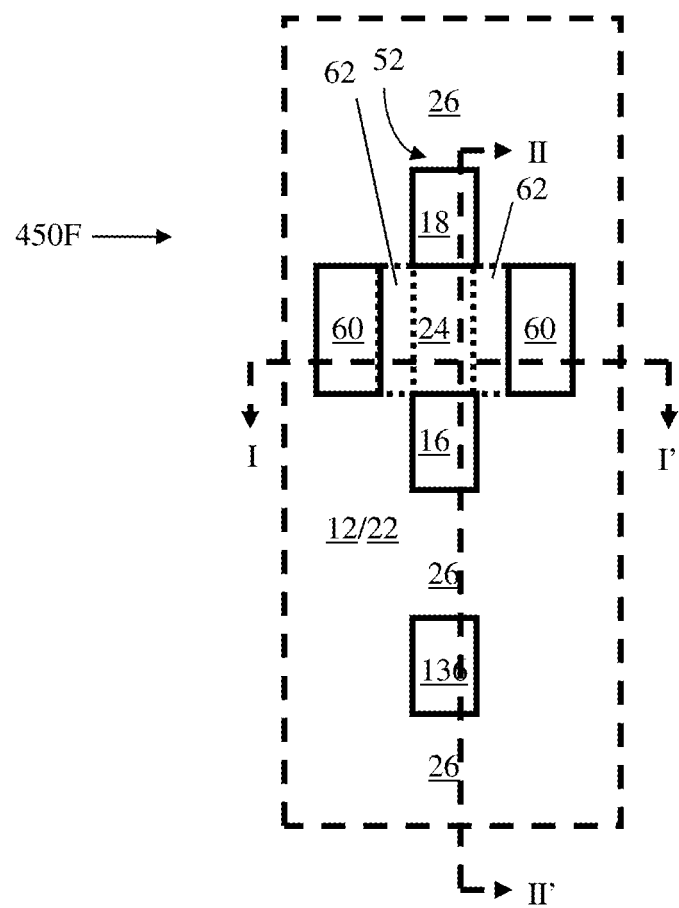
FIG. 23 is a schematic, top view of a MOS device comprising a fin structure having a body tap according to an embodiment of the present invention.
Figure 24:
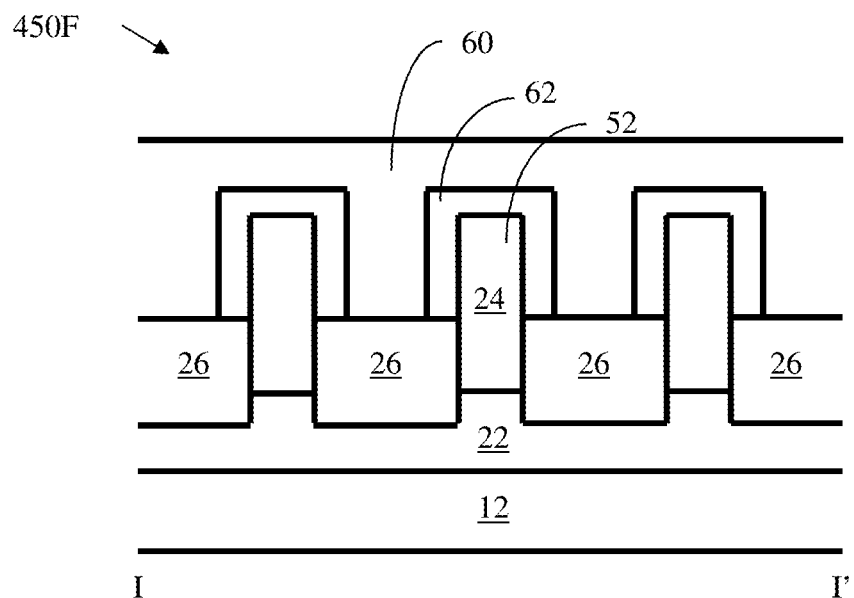
FIG. 24 is a schematic, cross-sectional view of the MOS device of FIG. 23 taken along line I-I'.
Figure 25:
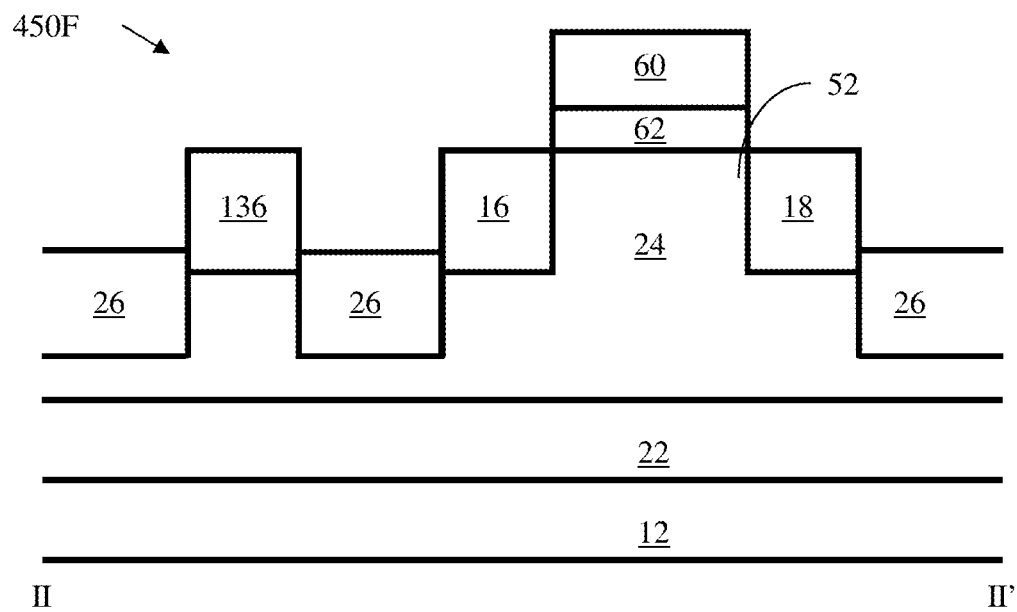
FIG. 25 is a schematic, cross-sectional view of the MOS device of FIG. 23 taken along line II-II'.

FIGS. 23-25 illustrate a top view and cross-sectional views of MOS device 450F comprising a fin structure 52 according to another embodiment of the present invention. The operation of MOS device 450F follows the same principle as MOS device 450 illustrated in FIGS. 14-16, where the body 24 connection to the body contact region 136 can be modulated by the back bias voltage applied to the buried layer region 22. Increased on-state current is also obtained through intrinsic bipolar junction transistor (BJT).

Figure 26A:
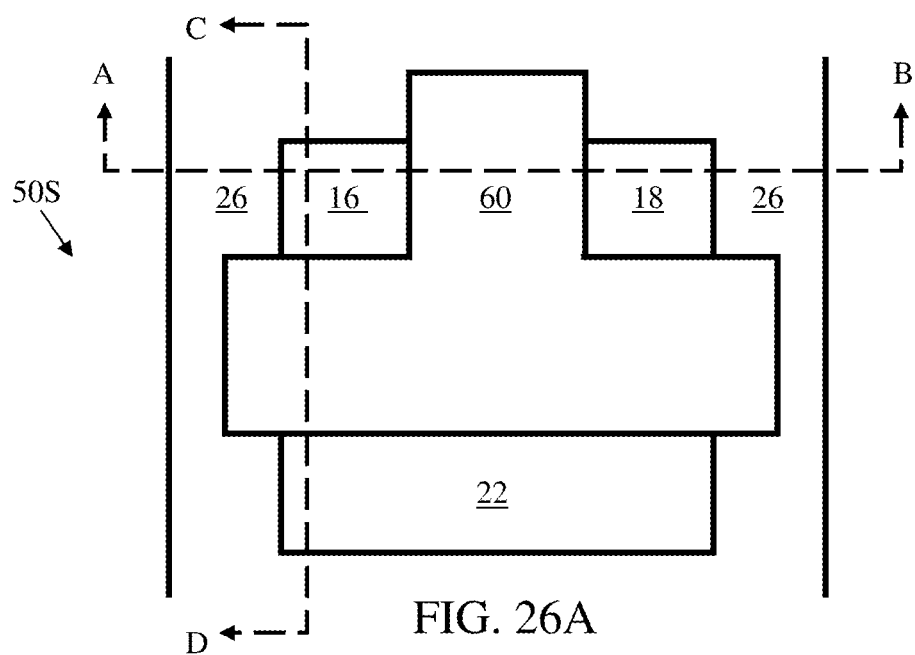
FIG. 26A is a schematic, top-view illustration of a MOS device having a buried insulator layer according to an embodiment of the present invention.
Figure 26B:
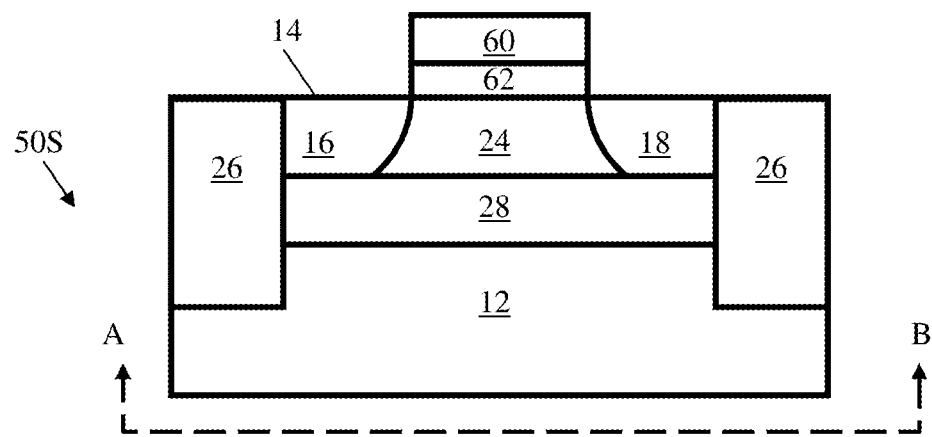
FIG. 26B is a schematic, cross-sectional view of the MOS device of FIG. 26A taken along line A-B.
Figure 26C:
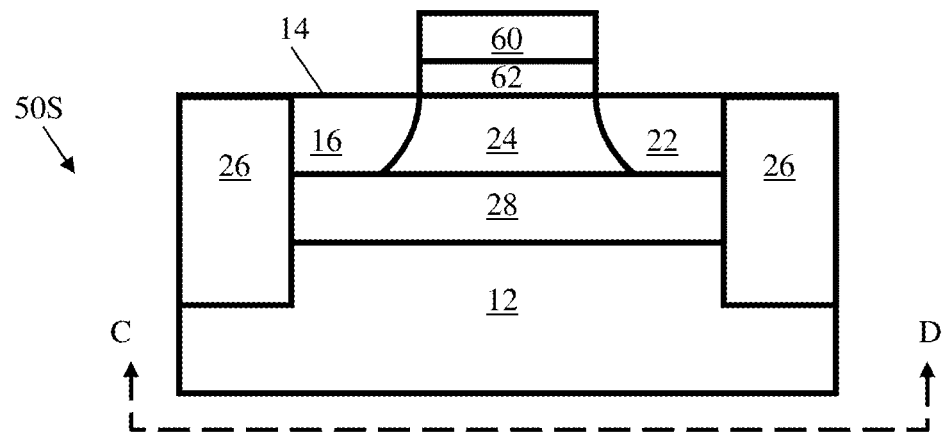
FIG. 26C is a schematic, cross-sectional view of the MOS device of FIG. 26A taken along line C-D.

FIGS. 26A-26C illustrate a schematic top view and cross section views of a MOS device 50S comprising a buried oxide (BOX) layer 28 according to another embodiment of the present invention. MOS device 50S may be fabricated on silicon-on-insulator (SOI), germanium-on-insulator (GOI), silicon-germanium-on-insulator (SiGeOI), strained silicon-on-insulator (sSOI), strained germanium-on-insulator (sGOI), or strained silicon-germanium-on-insulator (sSiGeOI) substrate. The MOS device 50S includes a substrate 12, a buried oxide layer 28, a body 24 of a first conductivity type, such as p-type conductivity for example, bounded on top by surface 14 and insulating layer 62, on the sides by source 16, drain 18, and charge injector 22 of a second conductivity type, and at the bottom by buried oxide layer 28. Source 16, drain 18, and charge injector 22 may be formed by an implantation process, according to any implantation process known and typically used in the art. Alternatively, a solid state diffusion or a selective epitaxial growth process could be used to form source 16, drain 18, and charge injector 22.

A gate 60 is positioned in between the source 16, the drain 18, and the charge injector 22 above the body 24. The gate 60 is insulated from the body 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 isolate body 24 of the MOS device 50S from body 24 of adjacent MOS devices 50S.

The thickness of the body 24 may be ultrathin, such as from 2 nm to 10 nm, to provide a fully depleted channel device. Alternatively, the thickness of the body 24 may be moderately thin, such as from 10 nm to 200 nm, to provide a partially depleted channel device.

Figure 27:
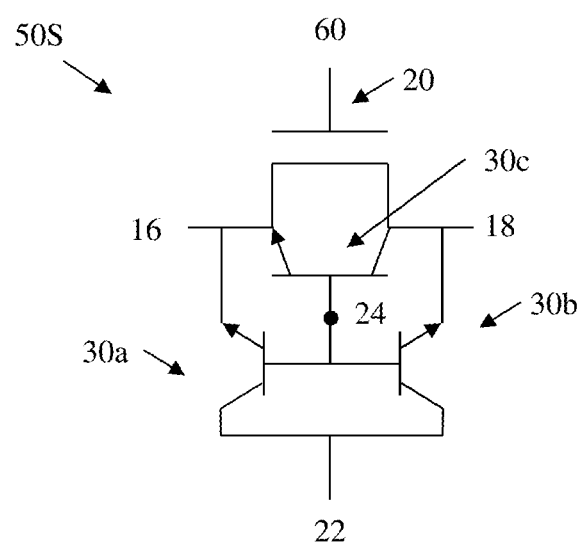
FIG. 27 illustrates an equivalent circuit representing the MOS device shown in FIG. 26.

FIG. 27 illustrates an equivalent circuit representation of MOS device 50S. Inherent in MOS device 50S are metal-oxide-semiconductor (MOS) transistor 20, formed by source 16, gate 60, drain 18, and body 24, and BJTs 30a and 30b, formed by charge injector 22, body 24, and source 16 or drain 18, respectively. The BJT formed by charge injector 22, body 24, and source 16 is herein specially referred as the current boosting device 30a. Also inherent in MOS device 50S is parallel BJT 30c, formed by source 16, body 24, and drain 18. During the operation of a MOS device 50S, the current boosting device 30a is used to amplify a drain 18 current of MOS device 50S.

The operation of the MOS device 50S follows the same principle as MOS device 50, where increased on-state current can be obtained through intrinsic bipolar junction transistor (BJT) 30c parallel to the MOS transistor 20 through an application of reverse bias voltage (for example, a positive voltage for n-type MOS device 50S) to the charge injector region 22.

Figure 28:
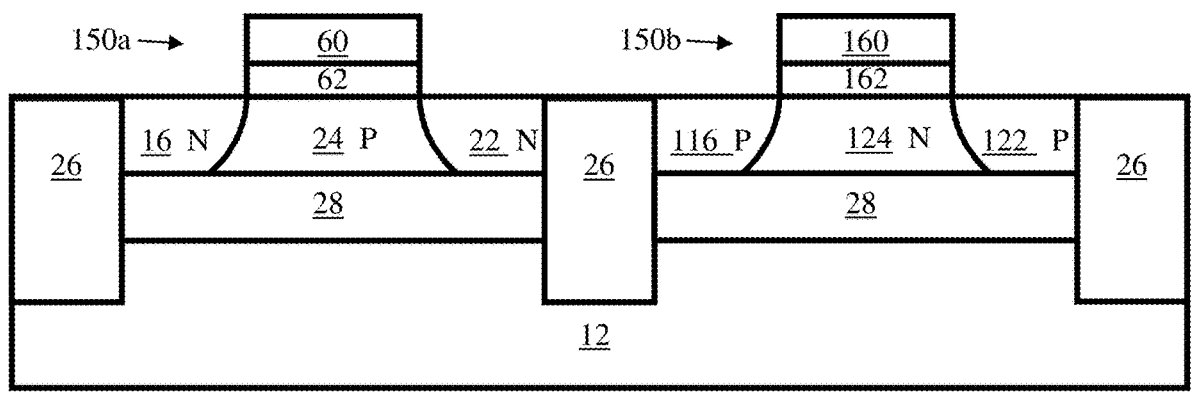
FIG. 28 is a schematic, cross-sectional illustration of a CMOS device according to another embodiment of the present invention.

FIG. 28 is a cross-sectional illustration of a complementary MOS device 150S configured with n-channel 150a and p-channel 150b devices on the same SOI wafer. Body 124, source 116, drain 118, and charge injector 122 of the p-channel device 150b are configured to have opposite conductivity type of corresponding features of the n-channel device 150a. The effects and results of the n-channel 150a and p-channel 150b devices are analogous to the MOS device 50S illustrated in FIG. 27. However, when the source is assumed to be a reference, the polarity of operation voltages of n-channel and p-channel device are opposite each other.

Figure 29:
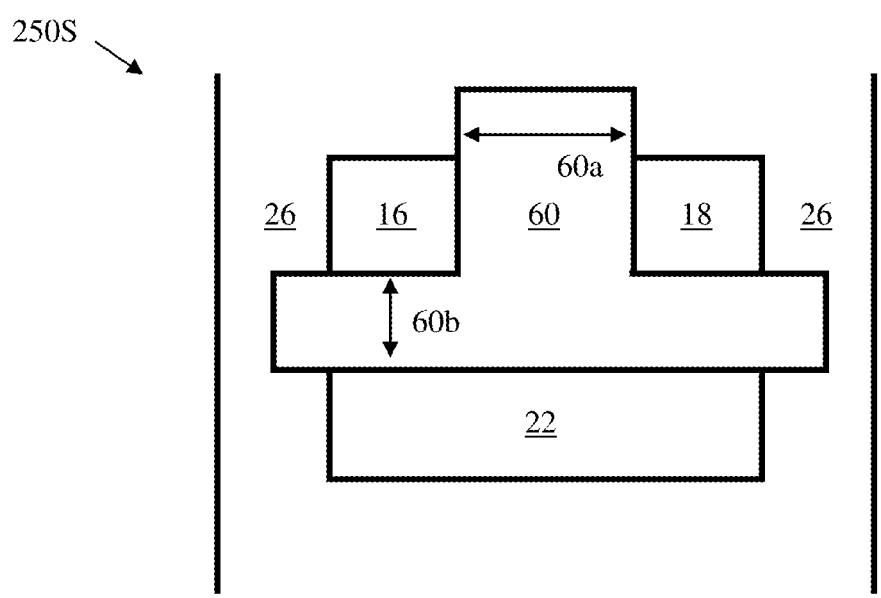
FIG. 29 is a schematic, top-view illustration of a MOS device having a buried insulator layer according to another embodiment of the present invention.

FIG. 29 illustrates a schematic top view of a MOS device 250S according to another embodiment of the present invention. The voltage applied to the charge injector 22 may be desired to be identical to Vdd applied to the drain 18. In this case, if the gate length across source to-drain 60a is the same as the gate length across source-to-charge injector 60b, the electric fields near the drain junction and the charge injector junction can both cause impact ionization. In order to prevent impact ionization near the drain junction, the gate length across source-to-drain 60a may be designed to be larger than the gate length across source-to-charge injector 60b.

Figure 30:
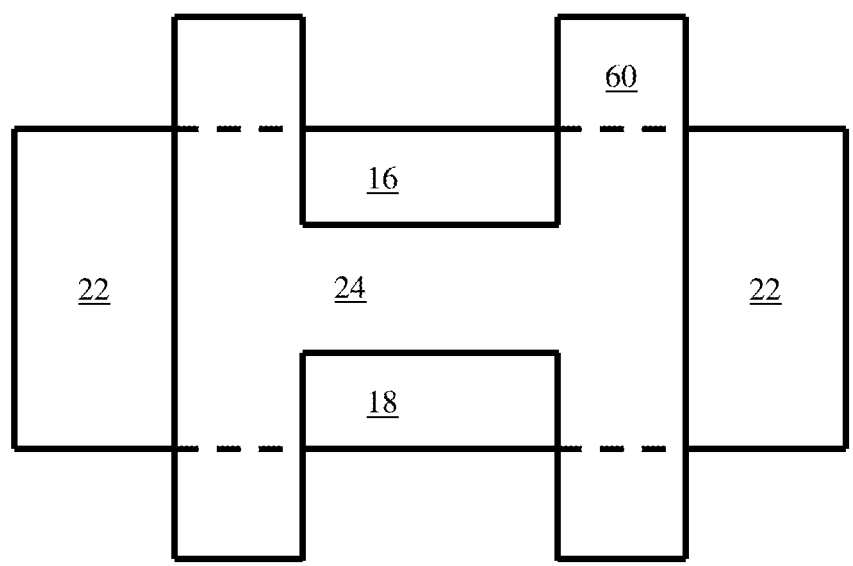
FIG. 30 is a schematic, top-view illustration of a MOS device having a buried insulator layer according to another embodiment of the present invention.

FIG. 30 illustrates a MOS device 350S according to another embodiment of the present invention. The MOS device 350S comprises two charge injector regions 22.

Figure 31A:
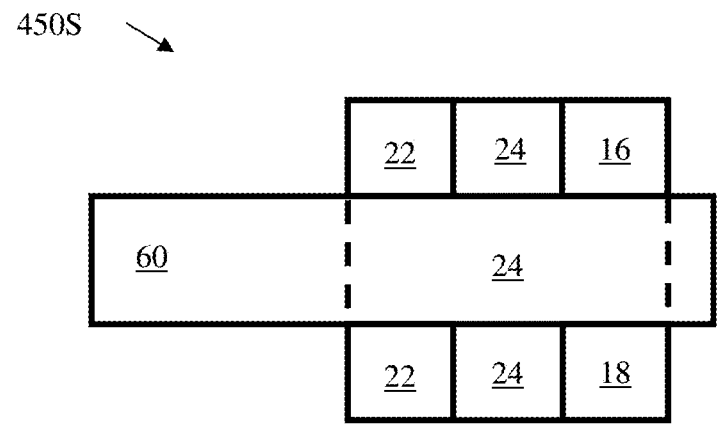
FIGS. 31A-31B are schematic, top-view illustrations of a MOS device having a buried insulator layer according to another embodiment of the present invention.
Figure 31B:
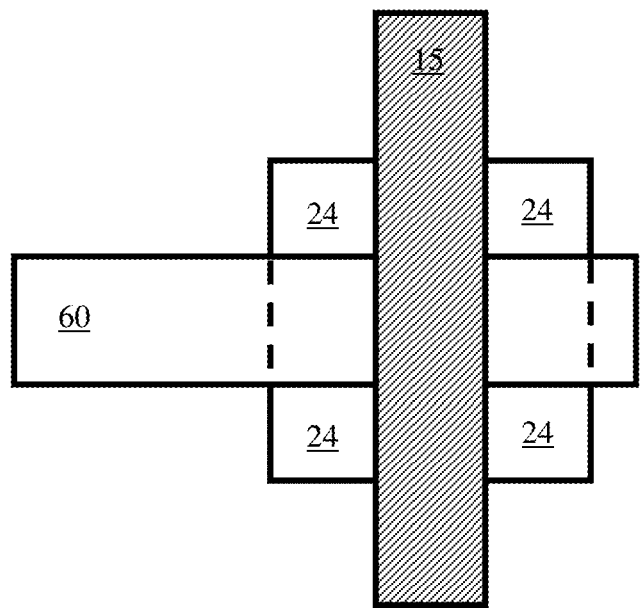

FIG. 31A illustrates a MOS device 450S according to another embodiment of the present invention. The MOS device 450S comprises charge injector regions 22 apart from the source 16 and the drain 18 but no gate is placed in between the source 16 and the charge injector 22, and no gate is placed between the drain 18 and the charge injector 22, while gate 60 is placed between the source 16 and drain 18. In order to form the charge injector 22, an additional masking step may be needed. An exemplary process step to form charge injector 22 is shown in FIG. 31B. After the gate 60 formation step, a lithography step is performed to form a blocking layer 15, such as photoresist for example. An ion implantation of a second conductivity (e.g. n-type implant) is used to form the source 16, drain 18, and charge injector 22, allowing the charge injector 22 to be spaced apart from the source 16 and the drain 18. The blocking layer 15 is then subsequently removed.

Figure 31C:
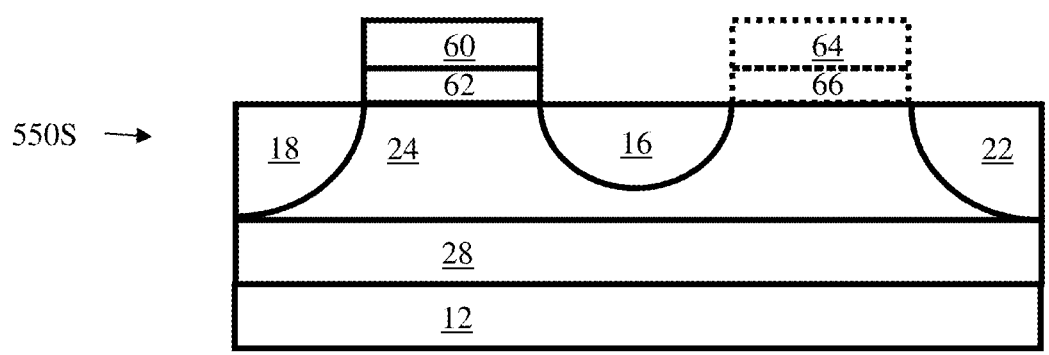
FIG. 31C is a schematic, cross-sectional illustration of a MOS device having a buried insulator layer according to another embodiment of the present invention.

FIG. 31C illustrates a MOS device 550S according to another embodiment of the present invention. The regions of second conductivity type in MOS device 550S may have different junction depths. In FIG. 31C, the source 16 is shown to be shallower than the drain 18 and the charge injector 22 to allow for the body 24 to be continuous across the MOS device 550S. Furthermore, the MOS device may or may not comprise another optional gate stack 64, 66. Furthermore, when the optional gate stack 64, 66 is present, the optional gate may or may not be left electrically floating.

The transient time for the transistor having increased on-state drain current, but with no change in the off-state drain current (for example, transistor 50, 150, 250, 350, 450, 550, 650, 50F, 150F, 450F, 50S, 150S, 250S, 350S, 450S, 550S) from the on-state (with increased drain current) to the off-state (with low off-state drain current) may be improved by limiting excess majority carrier lifetime. During on-state, the MOS device 50 requires that the body 24 has a large lifetime for body region excess majority carriers to boost the drive current. When the electrons are injected from the source 16 (emitter) to the body 24 (base), most of these electrons are swept in to the buried layer 22 (collector) with some recombining with the base region majority carriers. A small amount of recombination may occur, but a continuous supply of body 24 region majority-carriers is sustained to boost the on-state drive current. Therefore, the transient time for the transistor 50 from the on-state to the off-state may be improved by providing a recombination region made by several means that will be described below. However, if the population of these majority carriers is too limited, the operation of vertical BJT 30a is inhibited and subsequently no current boosting will occur. All of the described methods will only alter the majority carrier lifetime while the conductivity type and channel mobility may remain substantially unchanged.

Figure 32A:
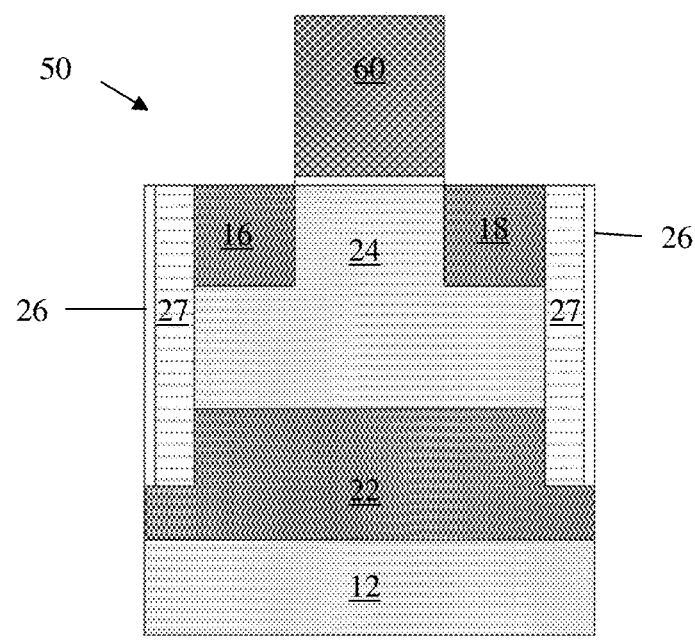
FIG. 32A is a schematic, cross-sectional illustration of a MOS device with charge trap layer lined in the trench isolation region according to an embodiment of the present invention.

FIG. 32A is a schematic, cross-sectional illustration of a MOS device 50 with charge trap layer 27 such as silicon nitride lined in the trench isolation region 26 according to an embodiment of the present invention. The charge trap layer 27 is either directly contacted to the sidewall of the body 24 region or indirectly contacted through the very thin interfacial oxide in between (not shown). The charge trap layer 27 such as silicon nitride contains substantial number of charge trap centers that may absorb the excess majority carrier.

Figure 32B:
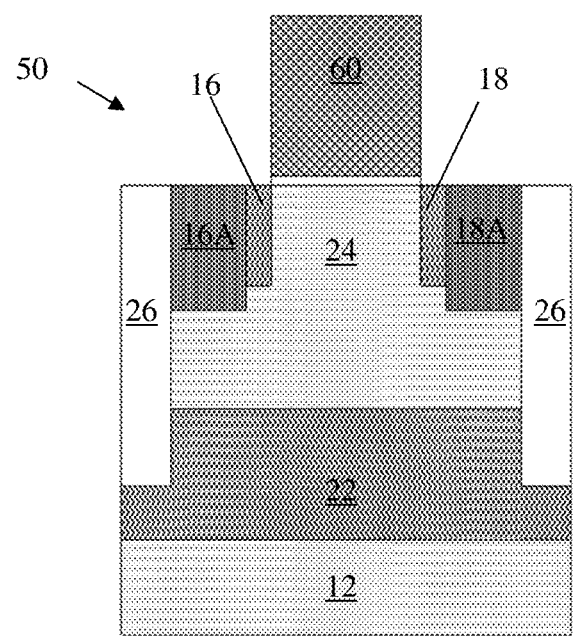
FIG. 32B is a schematic, cross-sectional illustration of a MOS device with metal silicided junction partially contacting the body region according to an embodiment of the present invention.

FIG. 32B is a schematic, cross-sectional illustration of a MOS device 50 with metal silicided junction partially contacting to body 24 region according to an embodiment of the present invention. The metal silicide regions 16A and 18A may contact the body 24 region near the sides of the source 16 and drain 18 region, respectively. Alternatively, the metal silicide 16A is formed only on the source side 16 (not shown). The Schottky junction formed by metal silicide region 16A and the body 24 may facilitate the majority carrier recombination.

Figure 32C:
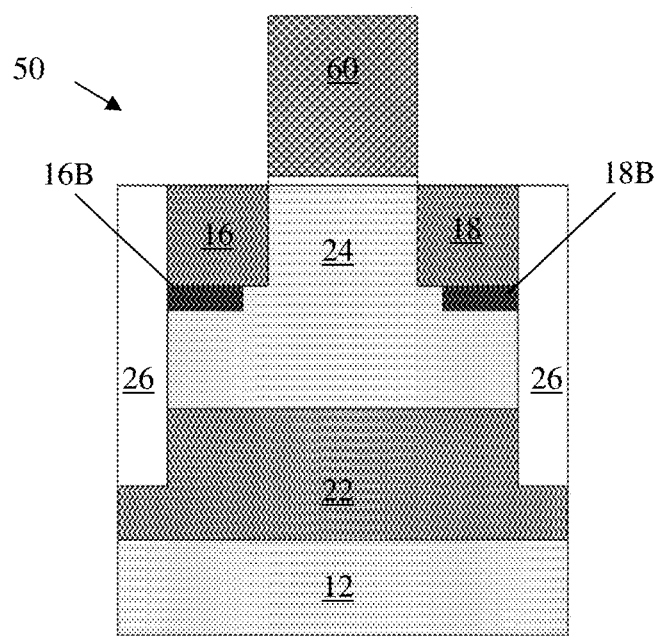
FIG. 32C is a schematic, cross-sectional illustration of a MOS device with junction with energy band offset compared to body region according to an embodiment of the present invention.

FIG. 32C is a schematic, cross-sectional illustration of a MOS device 50 with junction with energy band offset compared to body region according to an embodiment of the present invention. The energy band offset regions 16B and 18B may contact the body 24 region near the bottoms of the source 16 and drain 18 regions. Alternatively, the energy band offset region 16B may be formed only the source 16 side (not shown). For an n-type channel MOS, the valence band offset material is embedded in the source 16 and the drain 18 for the excess majority carrier (holes) to be preferentially evacuated through the source 16. For a p-type channel MOS, the conduction band offset material is embedded in the source 16 and the drain 18 for the excess majority carrier (electrons) to be preferentially evacuated through the source 16.

Figure 32D:
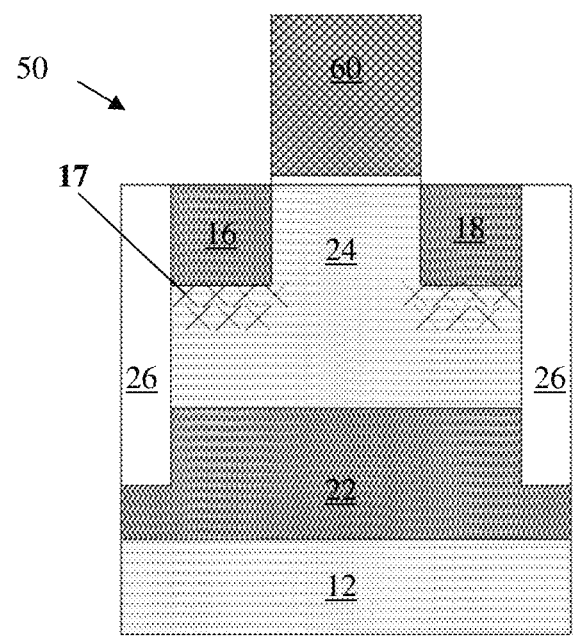
FIG. 32D is a schematic, cross-sectional illustration of a MOS device with recombination centers disposed near the junction according to an embodiment of the present invention.

FIG. 32D is a schematic, cross-sectional illustration of a MOS device 50 with recombination centers 17 disposed near the junction between source 16 and body 24 and, optionally, between drain 18 and body 24 according to an embodiment of the present invention. One general approach is by doping with deep level impurities, such as gold or platinum. Another general approach is to introduce crystallinity damage through ion implantation through such as Si, Ge, or Ar implantation. Another general approach is by using radiation damage to produce defects in the silicon crystal lattice structure.

The charge recombination regions explained in FIG. 32A to FIG. 32D can be symmetrically formed at both the source 16 and the drain 18 for process convenience. However, these charge recombination regions may also be formed only at the source side region in order to inhibit drive current degradation and junction leakage occurring near the drain side.

Figure 52:
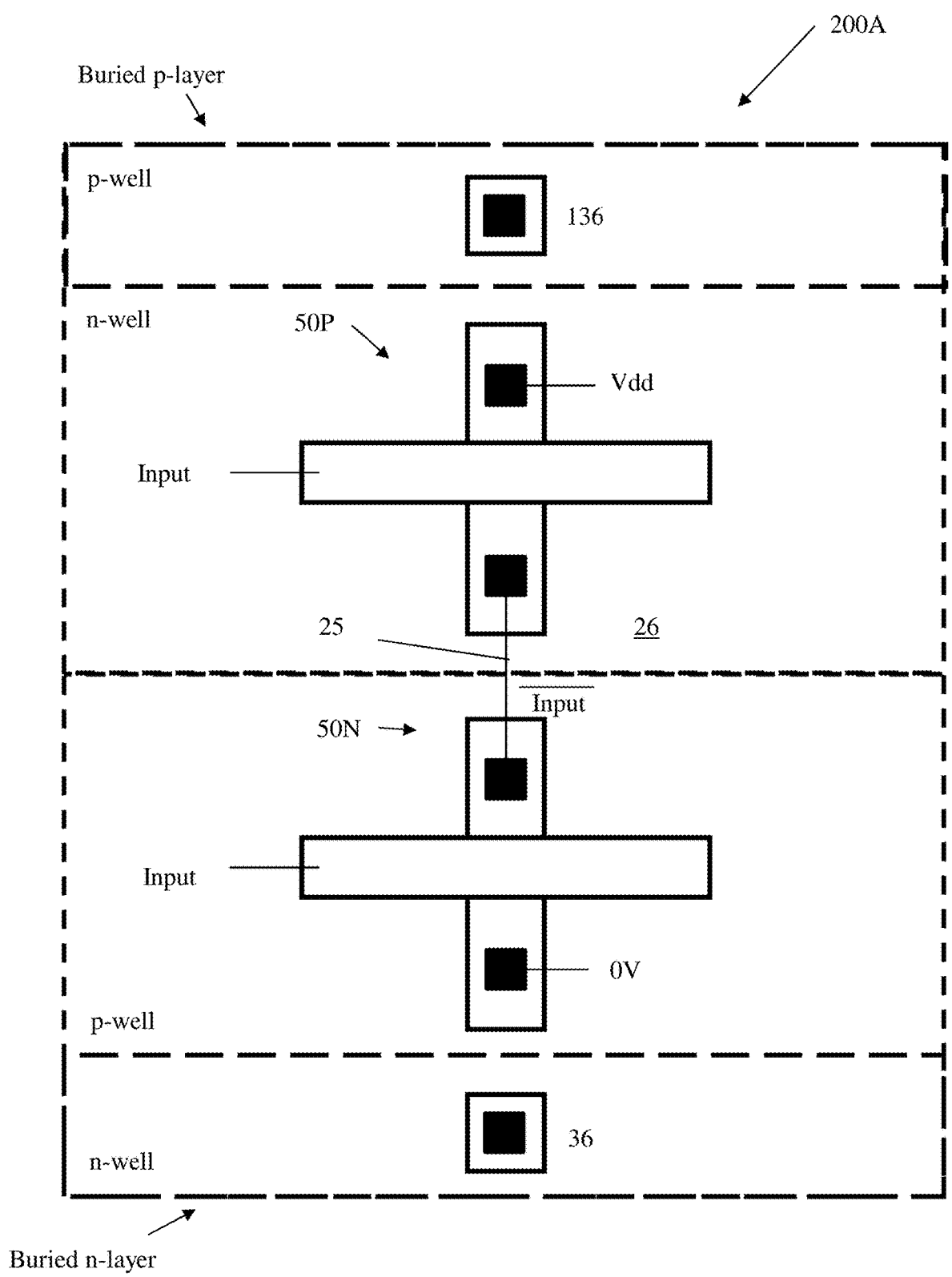
FIG. 52 illustrates an inverter constructed using a MOS device having increased on-state current according to an embodiment of the present invention.

FIG. 52 illustrates an inverter gate 200A constructed from transistors 50 having increased on-state current. Inverter gate 200A includes n-channel transistor 50N and p-channel transistor 50P. The n-channel transistor 50N comprises a p-type body 24 (n-channel transistor 50N is located within p-well in FIG. 11), while the p-channel transistor 50P comprises an n-type body 124 (p-channel transistor 50P is located within n-well in FIG. 10). FIG. 52 also shows that the n-channel transistor 50N is located within buried n-well layer and the p-channel transistor 50P is located within buried p-well layer. FIG. 52 also illustrates the buried n-well layer of n-channel transistor 50N is then connected through buried n-well tap 36, while the buried p-well layer of p-channel transistor 50P is connected through buried p-well tap 136. It is important to note that the conductivity of the buried layer tap is the same as the conductivity of the transistor 50 having increased on-state current. In a conventional CMOS circuit, the tap layer and the transistor have different conductivity type. For example, a conventional n-channel transistor is paired with a p-type tap, and a conventional p-channel transistor is paired with an n-type tap.

The n-channel transistor 50N is located within a buried n-well layer and the p-channel transistor 50P is located within a buried p-well layer. In another embodiment, the buried n-well layer can be embedded inside another well region (see for example FIG. 3).

Figure 53:
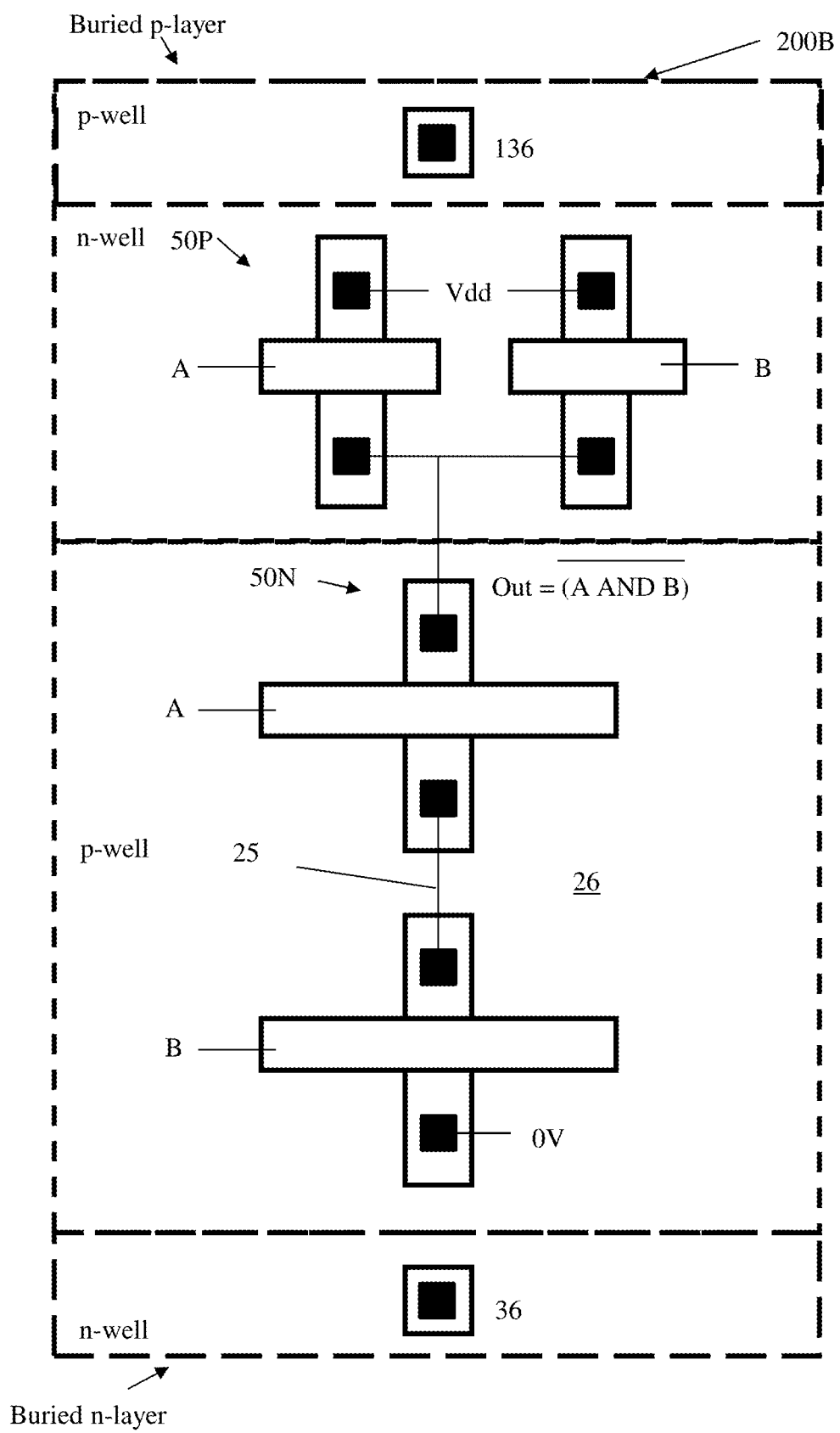
FIG. 53 illustrates a two-input NAND gate constructed using a MOS device having increased on-state current according to an embodiment of the present invention.

Another example of how transistors 50 having boosted on-state current may be used to construct logic gates is shown in FIG. 53, where an example of a two-input NAND gate 200B constructed from boosted transistors 50 is shown. A two-input NAND gate is constructed from two p-channel transistors 50P in parallel, with two n-channel transistors 50N in series. As shown in FIG. 53, the two boosted n-channel transistors 50N in series are separated by an isolation region 26 and connected through a conductive layer (for example, a metal layer shown as wire 25 in FIG. 53). In a conventional CMOS circuit, the two n-channel transistors share a common diffusion region and not separated by an isolation region. Similar to the inverter gate example shown in FIG. 52, the n-channel transistors 50N are paired with an n-type tap 36, and the p-channel transistors 50P are paired with a p-type tap 136.

Figure 54:
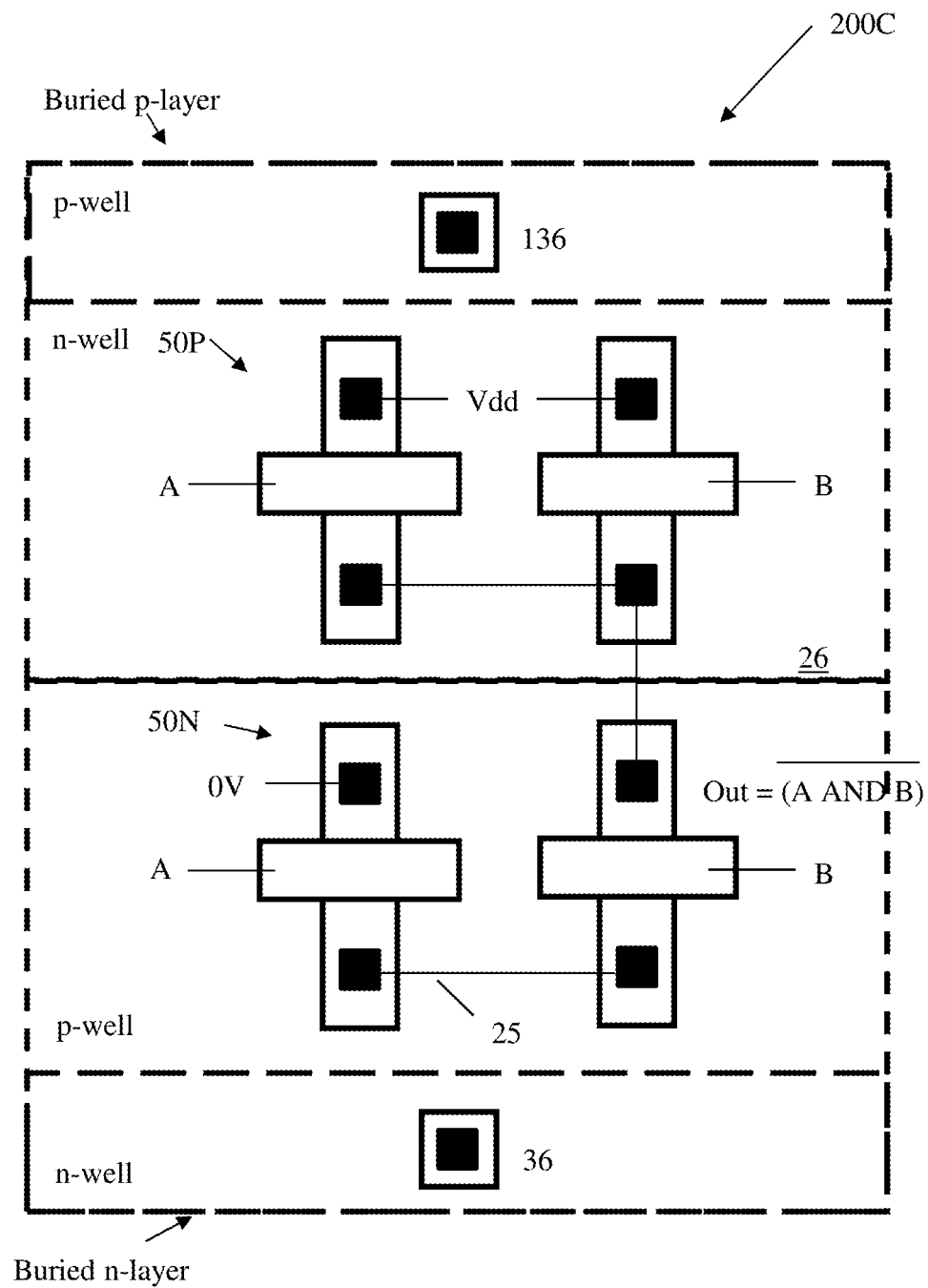
FIG. 54 illustrates a two-input NAND gate constructed using a MOS device having increased on-state current according to another embodiment of the present invention.

FIG. 54 illustrates another exemplary embodiment of a two-input NAND gate 200C comprising two p-channel transistors 50P in parallel and two n-channel transistors 50N in series. The two n-channel transistors in series are separated by an isolation region 26 and connected through a conductive layer (for example, a metal layer shown as wire 25 in FIG. 54) and is positioned side-by-side to reduce the height of the two-input NAND gate. Similarly, the n-channel transistors 50N are paired with an n-type tap 36, and the p-channel transistors 50P are paired with a p-type tap 136.

Figure 55:
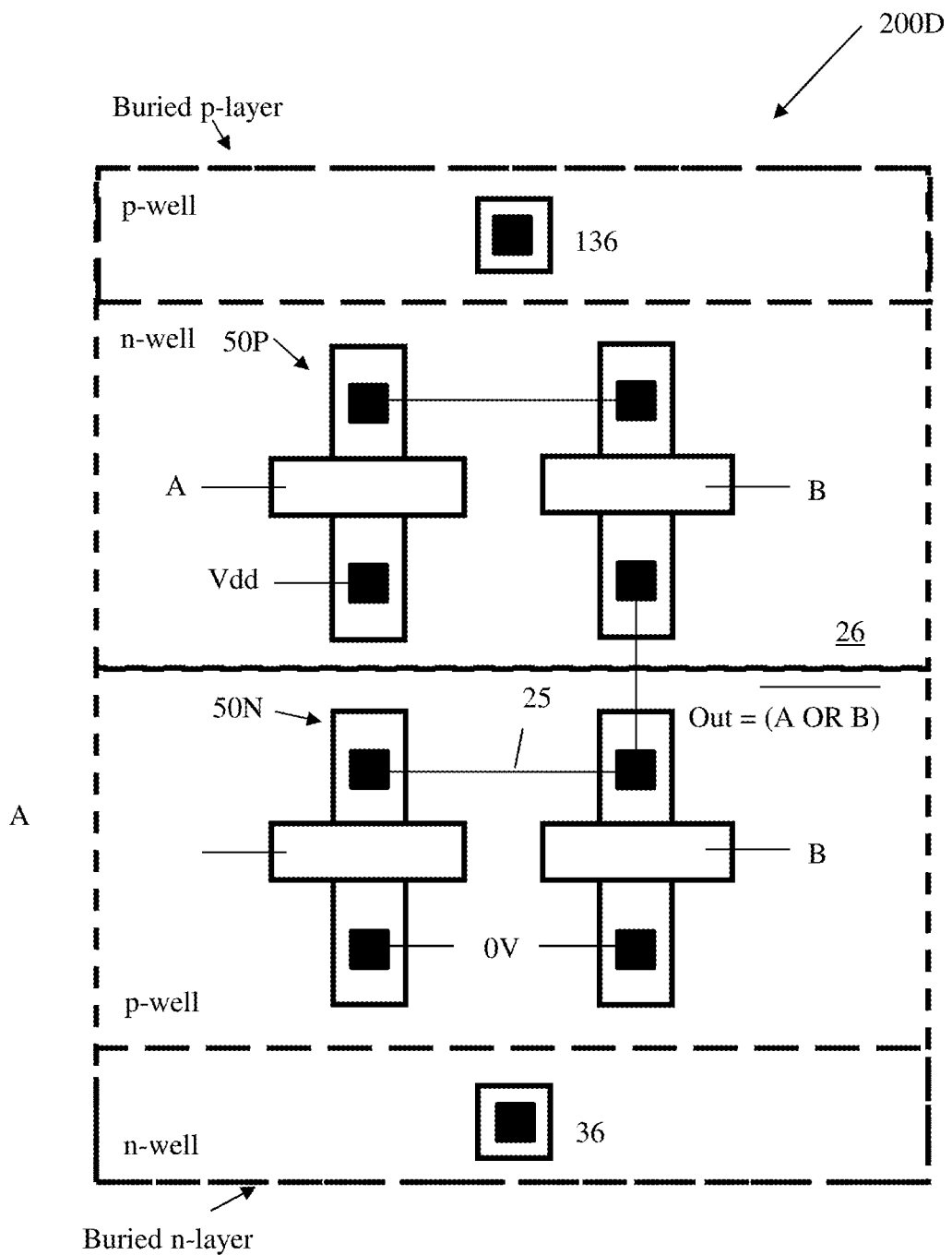
FIG. 55 illustrates a two-input NOR gate constructed using a MOS device having increased on-state current according to an embodiment of the present invention.

Another exemplary embodiment of a logic gate constructed using transistors 50 having boosted on-state current is shown in FIG. 55, where an example of a two-input NOR gate 200D constructed from boosted transistors 50 is shown. A two-input NOR gate 200D is constructed from two n-channel transistors 50N in parallel, and two p-channel transistors 50P in series. As shown in FIG. 55, the two p-channel transistors 50P in series are separated by an isolation region 26 and connected through a conductive layer (for example, a metal layer shown as wire 25 in FIG. 55). The n-channel transistors 50N are paired with an n-type tap 36, and the p-channel transistors 50P are paired with a p-type tap 136.

Figure 56:
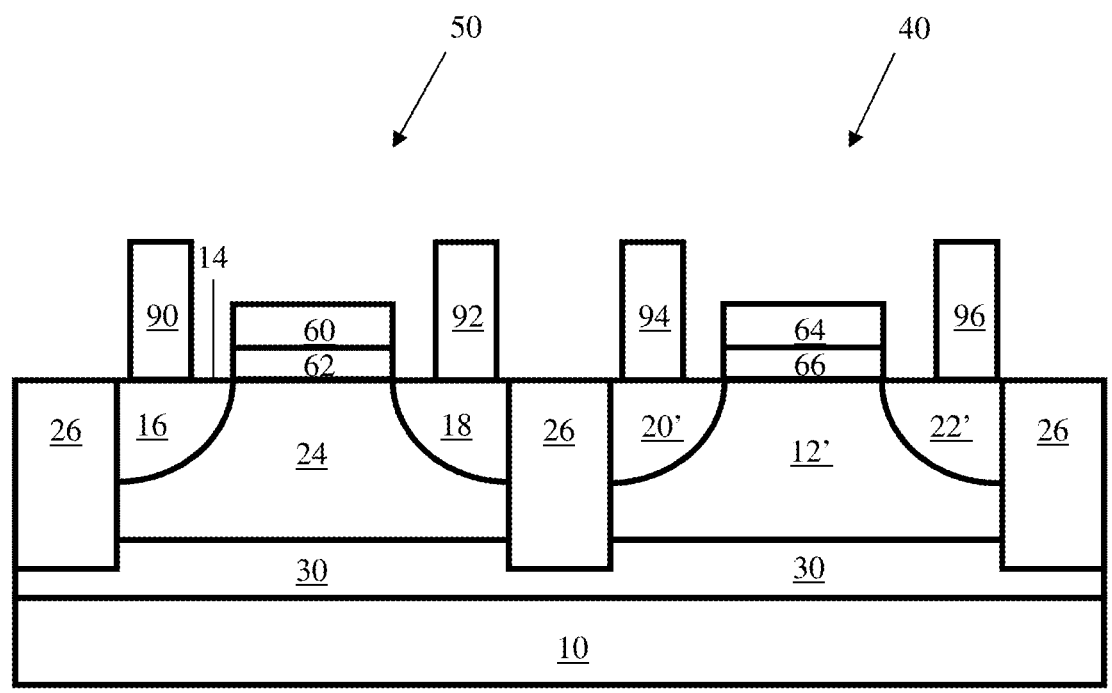
FIG. 56 illustrates a MOS device having increased on-state current and a conventional MOS device, where the well of the conventional MOS device is electrically connected to the buried well layer of the MOS device having increased on-state current, according to an embodiment of the present invention.

FIG. 56 illustrates two transistors, a transistor 50 having a boosted on-state current, and a MOS transistor 40. Transistor 50 comprises body 24 having a first conductivity type, source and drain regions (16 and 18) having a second conductivity type, and a buried layer 30 having a second conductivity type. As has been described, with buried layer 30 being properly biased, transistor 50 can have an increased on-state current, while maintaining the same off-state current.

Transistor 40 is a MOS transistor having different conductivity type as boosted transistor 50. For example, if boosted transistor 50 is an n-channel MOS, then transistor 40 is a p-channel MOS. Transistor 40 comprises well 12' having a second conductivity type and source and drain regions 20' and 22' having first conductivity type. The well 12' of the transistor 40 and the buried layer 30 have the same conductivity type and therefore are electrically connected. The bias applied to the buried layer 30 of the boosted transistor 50 is then also applied to the well 12' of the transistor 40.

The example shown in FIG. 56 illustrates how a boosted transistor 50 may be used in conjunction with a MOS transistor 40 to modulate the performance of both transistors simultaneously. Biasing the buried layer 30 to boost the on-current of the transistor 50 will increase the strength of the transistor 50. Simultaneously, biasing the buried layer 30 will result in an increase of the threshold of the transistor 40, effectively reducing the strength of the transistor 40.

Characteristics of logic gates can be dynamically modified by combining transistors 50 with boosted on-current and regular MOS transistors 40, where the well 12' of the regular MOS transistors 40 is electrically connected to the buried layer of the transistors 50 having boosted on-state current. For example, an inverter can be constructed using transistors 50 and 40 as shown in FIG. 56. The switching point of the inverter can be modulated by biasing the buried layer 30.

Figure 57:
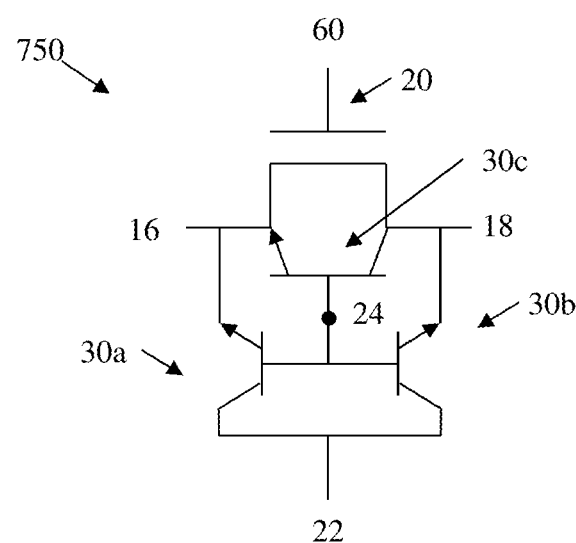
FIG. 57 illustrates an equivalent circuit representing a MOS device according to another embodiment of the present invention.

FIG. 57 illustrates an equivalent circuit representation of transistor 750, where there are two parallel paths for current flow from drain region to source region: MOS 20 and bipolar transistor 30c. The base of the bipolar transistor 30c can be modulated by applying a bias to the body region 24. The conductivity of the MOS 20 is modulated by the bias applied to the gate 60 and body 24, and the conductivity of the bipolar transistor 30c is modulated by the bias applied to the body 24.

Figure 58:
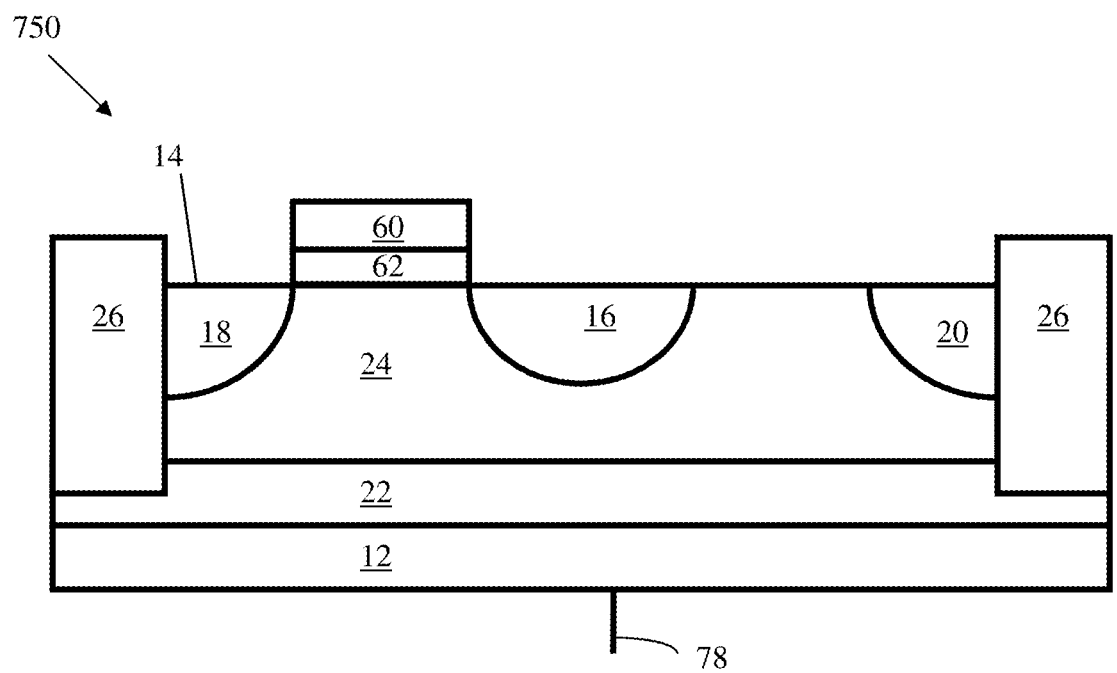
FIG. 58 illustrates a MOS device having a body tap current according to another embodiment of the present invention.

FIG. 58 illustrates an exemplary implementation of transistor 750 according to an embodiment of the present invention. Transistor 750 is similar to transistor 50, but with a body tap 20 having the same conductivity as body 24, where body tap 20 is used to bias the body 24.

Transistor 750 may be used to construct a logic gate, where the gate 60 and body 24 function as the input terminals of the gate. For example, an OR gate can be constructed using transistor 750, where a high conductivity through transistor 750 is obtained when both the input terminals (gate 60 and body 24) are both high. The transistor 750 is still conducting when one of the input terminals is high, as current will flow through either the MOS 30 or the bipolar transistor 30c. When both input terminals are low, the transistor 750 will not be conducting.

Transistor 750 may also be combined with an inverter to construct other logic gates. For example, although the OR gate described above will be conductive when either input terminal or both input terminals are high, the highest conductivity is obtained when both input terminals are high. Therefore, an inverter with a modulated switching point (for example, using the exemplary combination of boosted transistor 50 and a conventional MOS 40 as shown in FIG. 56) may be used in conjunction with transistor 750, so that the inverter is only switched when the conductivity of the transistor 750 is the highest. This, for example, may be used to construct a NAND gate.

Figure 59:
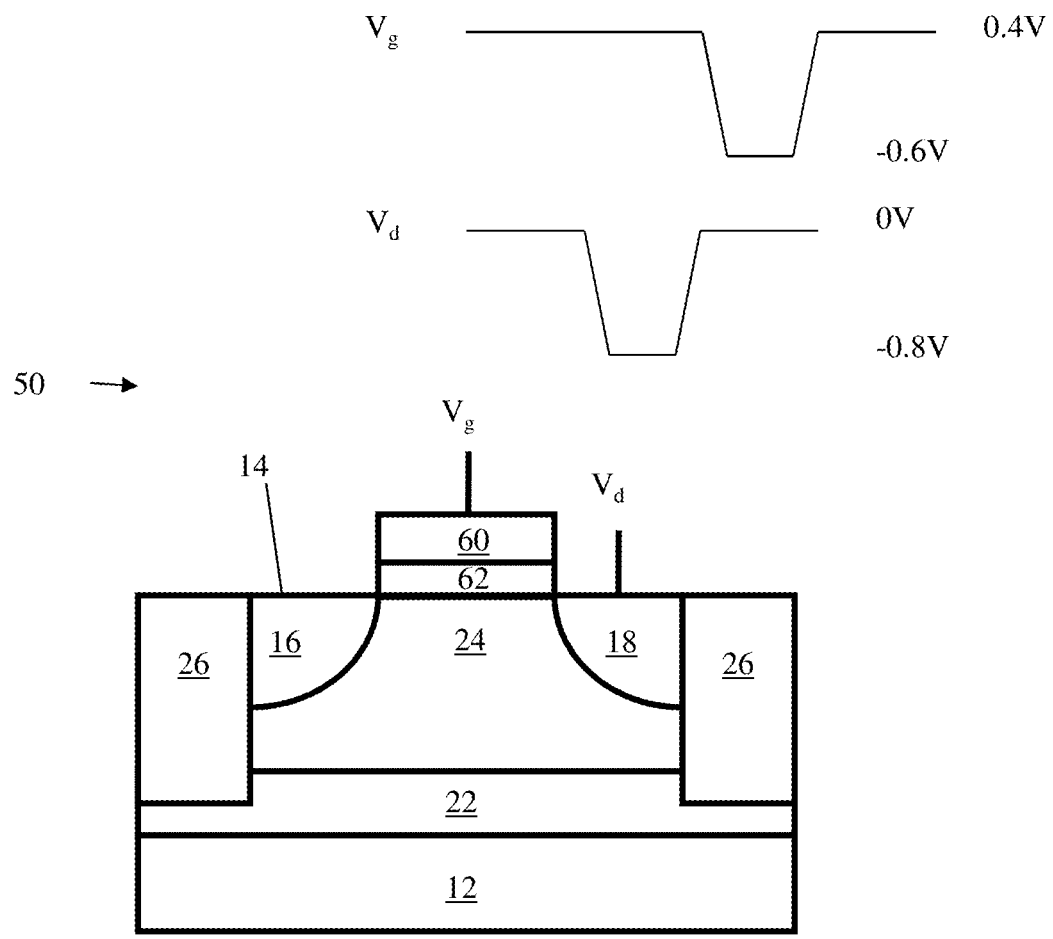
FIG. 59 illustrates a flip flop constructed using a semiconductor device according to an embodiment of the present invention.

FIG. 59 illustrates an example of semiconductor device 50 used as a flip flop according to an embodiment of the present invention. By applying negative voltage pulses to the gate 60 and drain 18 terminals, the state of the semiconductor device 50 will alternate between low and high states.

Non-volatile memory devices, such as flash erasable programmable read only memory (Flash EPROM) devices, retain stored data even in the absence of power supplied thereto. Unfortunately, non-volatile memory devices typically operate more slowly than volatile memory devices. Furthermore, operation of non-volatile memory devices typically requires a higher voltage (higher voltage than the core logic transistor operating voltage). Therefore an integrated circuit comprising Flash memory devices typically requires high voltage transistors. This introduces challenges especially that the core logic transistor operating voltage is continuously being scaled to lower voltage (for example 1.0V or less), see for example "Embedded Nonvolatile Memories: A Key Enabler for Distributed Intelligence", K. Baker, pp. 1-4, 2012 4th IEEE International Memory Workshop (IMW), which is hereby incorporated herein, in its entirety, by reference thereto. Therefore, it is desired to have a non-volatile memory cell with reduced operating voltage.

Figure 33A:
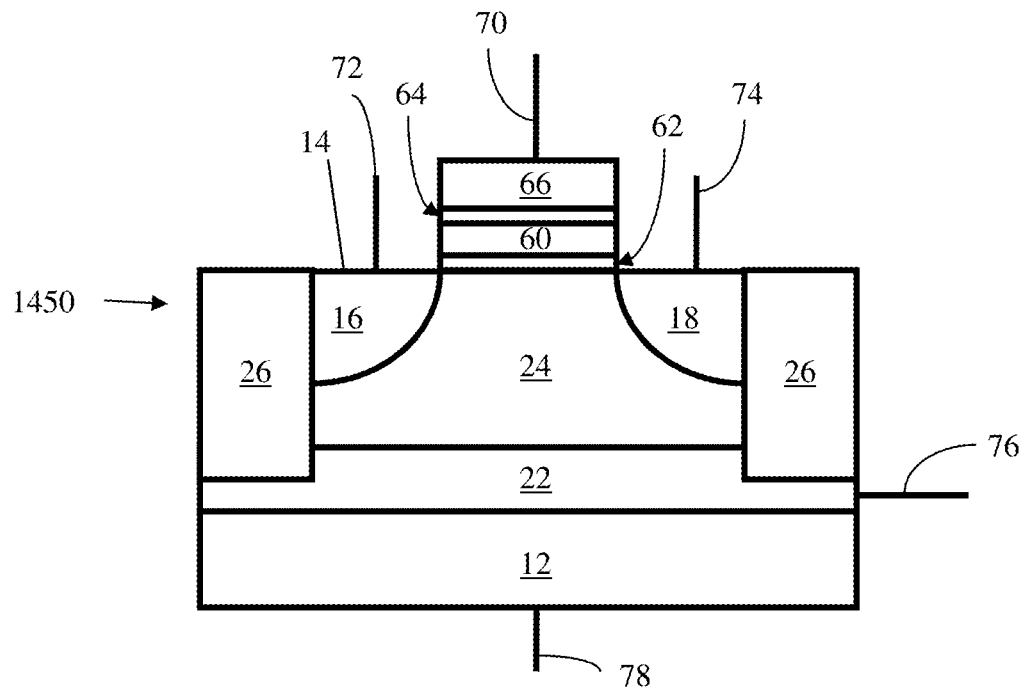
FIG. 33A is a schematic, cross-sectional illustration of a memory cell according to an embodiment of the present invention.

FIG. 33A illustrates a schematic cross-sectional view of a memory cell 1450 according to an embodiment of the present invention.

The cell 1450 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art. Alternatively, first and second regions 16 and 18 are formed by a selective epitaxial growth process formed on the material making up substrate 12, according to any of epitaxial growth processes known and typically used in the art.

Figure 33B:
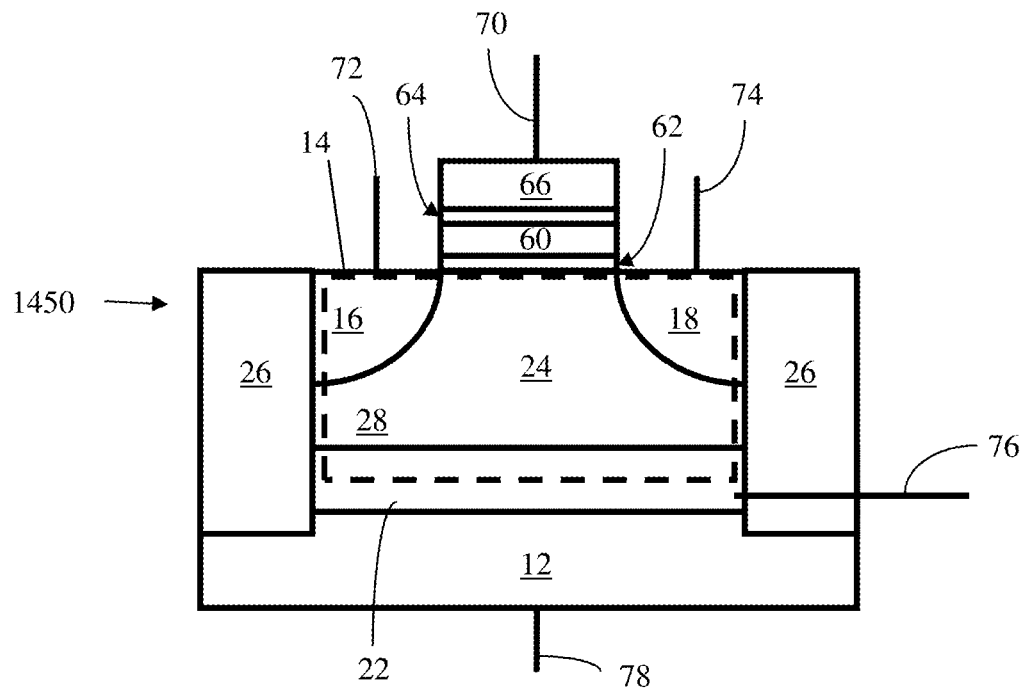
FIG. 33B is a schematic, cross-sectional illustration of a memory cell according to another embodiment of the present invention.

A buried layer 22 of the second conductivity type is also provided in the substrate 12, buried in the substrate 12, as shown. Region 22 is also formed by an ion implantation process on the material of substrate 12. A floating body region 24 of a first conductivity type is bounded by surface 14, first and second regions 16, 18 and insulating layers 26 (e.g. shallow trench isolation (STI)), which may be made of silicon oxide, for example. Insulating layers 26 insulate cell 1450 from neighboring cells 1450 when multiple cells 1450 are joined to make a memory device. The bottom of insulating layer 26 may reside inside the buried region 22 allowing buried region 22 to be continuous as shown in FIG. 33A. Alternatively, the bottom of insulating layer 26 may reside below the buried region 22 as shown in the cross-sectional view of another embodiment of memory cell 1450 in FIG. 33B. This requires a shallower insulating layer 28 (shown in dashed lines in FIG. 33B), which insulates the floating body region 24, but allows the buried layer 22 to be continuous in the perpendicular direction of the cross-sectional view shown in FIG. 33B. For simplicity, only memory cell 1450 with continuous buried region 22 in all directions will be shown from hereon.

A floating gate or trapping layer 60 is positioned in between the regions 16 and 18, and above the surface 14. Trapping layer/floating gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. Floating gate/trapping layer 60 may be made of polysilicon material. If a trapping layer is chosen, the trapping layer may be made from silicon nitride or silicon nanocrystal, etc. (for example as described in "Flash Memory Cell—An Overview", Pavan, P. et al., Proceedings of the IEEE 85 no. 8, 1997, pp. 1248-1271, "NROM™—a new technology for non-volatile memory products", Bloom, I. et. al., Solid-State Electronics, vol. 46, issue 11, November 2002, pp. 1757-1763 and "Scalability of split-gate charge trap memories down to 20 nm for low-power embedded memories", Masoero, L. et. al., 2011 International Electron Devices Meeting, 9.5, which are all hereby incorporated herein, in their entireties, by reference thereto). Whether a floating gate 60 or a trapping layer 60 is used, the function is the same, in that they hold data in the absence of power. The primary difference between the floating gate 60 and the trapping layer 60 is that the floating gate 60 is a conductor, while the trapping layer 60 is an insulator layer. Thus, typically one or the other of trapping layer 60 and floating gate 60 are employed in device 1450, but not both.

A control gate 66 is positioned above floating gate/trapping layer 60 and insulated therefrom by insulating layer 64 such that floating gate/trapping layer 60 is positioned between insulating layer 62 and surface 14 underlying floating gate/trapping layer 60, and insulating layer 64 and control gate 66 positioned above floating gate/trapping layer 60, as shown. Control gate 66 is capacitively coupled to floating gate/trapping layer 60. Control gate 66 is typically made of polysilicon material or metal gate electrode, such as tungsten, tantalum, titanium and their nitrides. The relationship between the floating gate/trapping layer 60 and control gate 66 is similar to that of a non-volatile stacked gate floating gate/trapping layer memory cell. The floating gate/trapping layer 60 functions to store non-volatile memory data and the control gate 66 is used for memory cell selection.

Figure 33C:
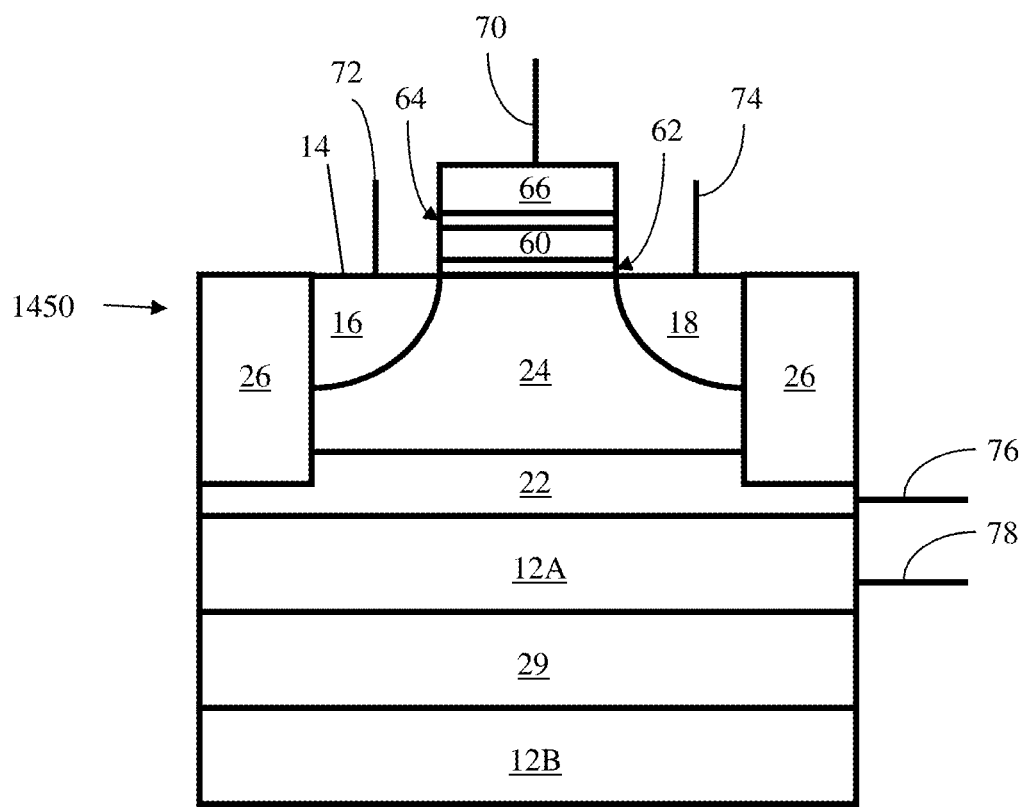
FIG. 33C is a schematic, cross-sectional illustration of a memory cell according to another embodiment of the present invention.

In some embodiments of the invention, substrate 12 can be the bulk material of the semiconductor wafer. In another embodiment shown in FIG. 33C, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to 12A. To simplify the description, the substrate 12 will usually be drawn as the semiconductor bulk material as it is in FIG. 33A.

The cell 1450 in FIGS. 33A-33D includes five terminals: word line (WL) terminal 70, source line (SL) terminal 72, bit line (BL) terminal 74, buried layer (BNL for buried n-type layer or BPL for buried p-type layer) terminal 76, and substrate terminal 78. Terminal 70 is connected to control gate 66. Terminal 72 is connected to first region 16 and terminal 74 is connected to second region 18. Alternatively, terminal 72 can be connected to second region 18 and terminal 74 can be connected to first region 16. Terminal 76 is connected to buried layer 22. Substrate terminal 78 is connected to substrate 12 below buried layer 22.

Figure 34A:
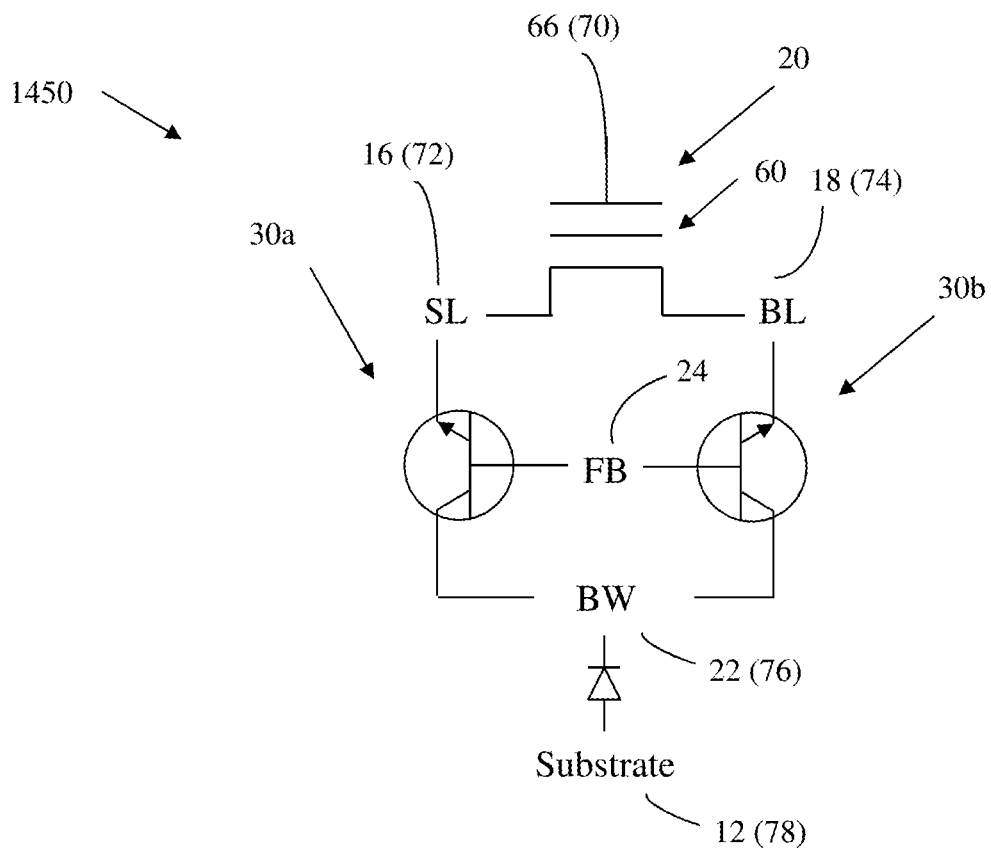
FIGS. 34A-34B schematically illustrate an equivalent circuit representation of the memory cells shown in FIGS. 33A-33C.
Figure 34B:
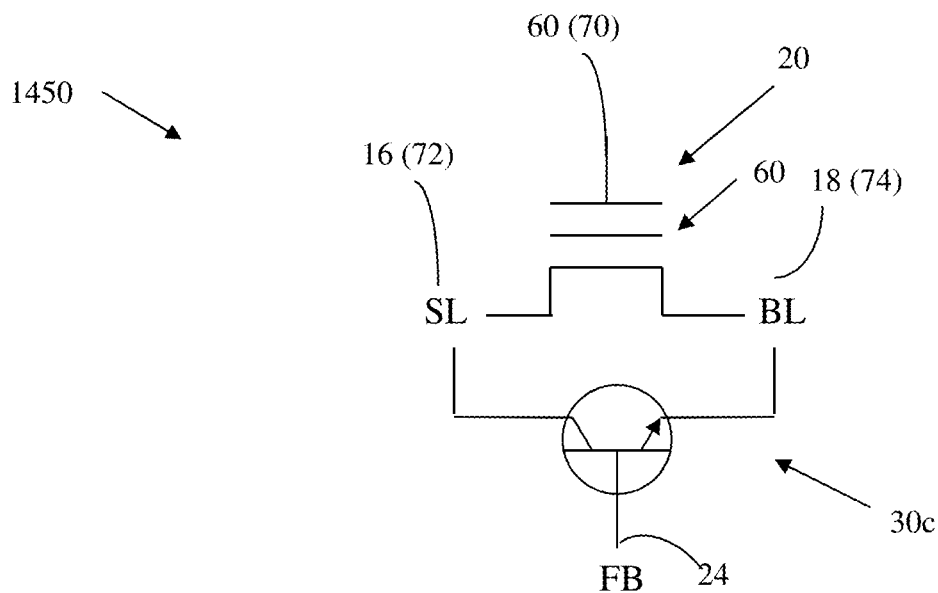

FIG. 34A illustrates an equivalent circuit representation of memory cell 1450. Inherent in cell 1450 is floating gate/trapping layer transistor 20 formed by source line region 16, floating gate or trapping layer 60, control gate 66, drain region 18, and floating body region 24, where the floating gate or trapping layer modulates the threshold voltage of the transistor 20, for example as described in "Flash Memory", edited by P. Cappelletti, C. Golla, P. Olivo, E. Zanoni, p. 6, which is hereby incorporated herein, in its entirety, by reference thereto. Similarly, bipolar transistors 30a and 30b formed by the buried layer 22, floating body region 24, and the source line region 16/drain region 18, respectively, are also inherent in cell 1450. In addition, bipolar transistor 30c formed by source line region 16, floating body region 24, and drain region 18 is also inherent in cell 1450, as shown in FIG. 34B.

Figure 35:
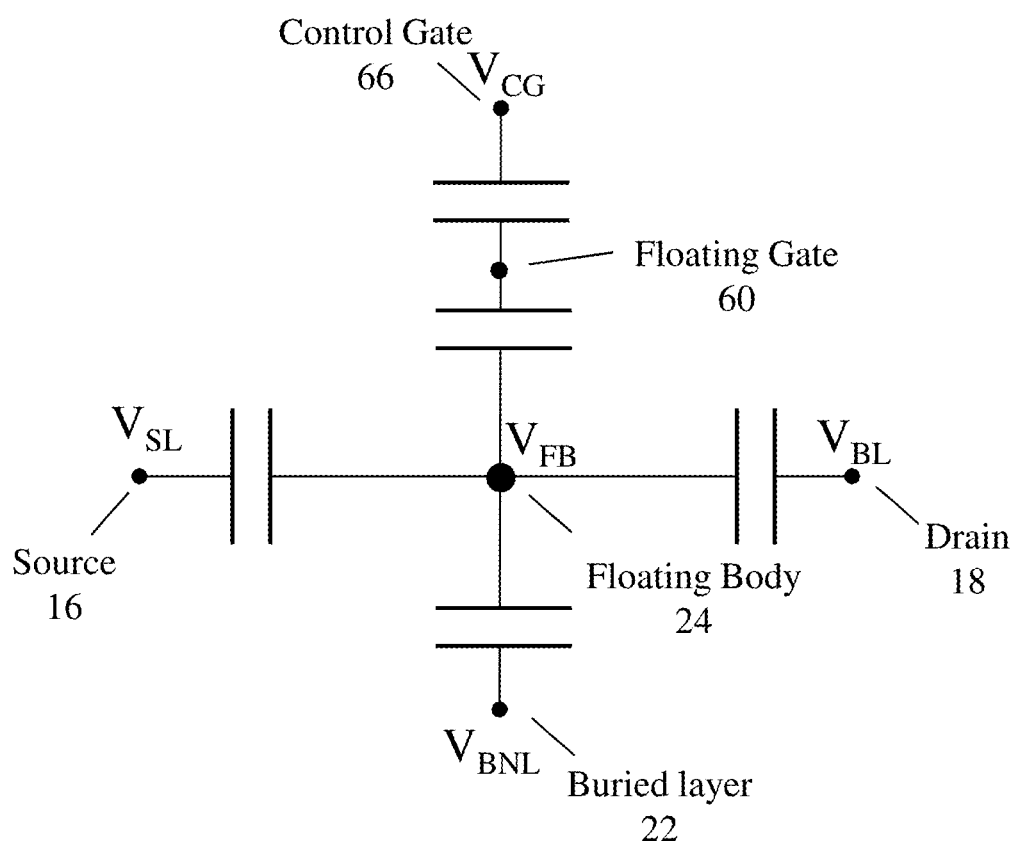
FIG. 35 schematically illustrates equivalent capacitor circuit representation of the memory cells shown in FIGS. 33A-33C.

FIG. 35 schematically illustrates an equivalent capacitor circuit representation of cell 1450 shown in FIGS. 33A-34. The body 24 potential ($V_{FB}$) is capacitively coupled with control gate 66 oxide capacitance, floating gate 60 oxide capacitance, source 16 side junction capacitance, drain 18 side junction capacitance, and buried layer 22 junction capacitance. Therefore, the control gate 66 voltage, source 16 voltage, drain 18 voltage, and buried layer 22 voltage can modulate the floating body 24 potential ($V_{FB}$).

Figure 36:
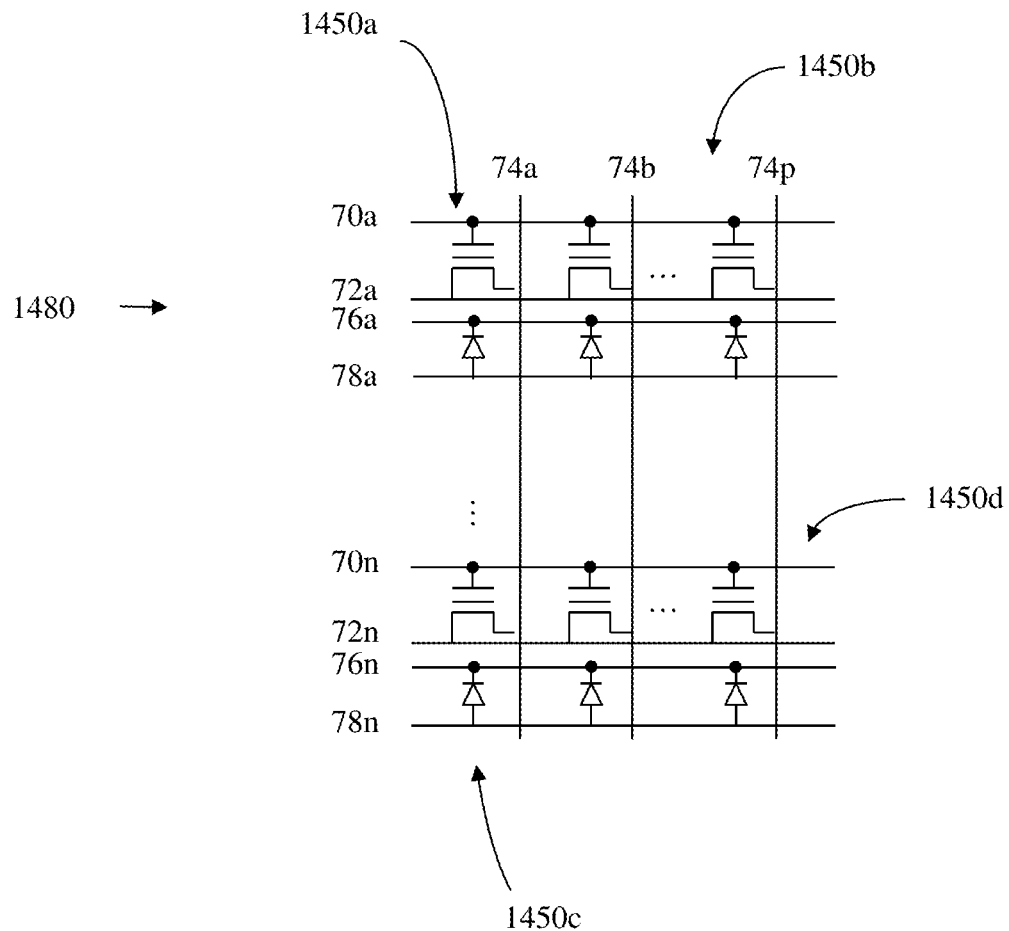
FIG. 36 schematically illustrates multiple cells of the type from any of FIGS. 33A-33C joined in an array according to an embodiment of the present invention.

FIG. 36 schematically illustrates an exemplary embodiment of a memory array 1480 of memory cells 1450 (four exemplary instances of memory cell 1450 being labeled as 1450a, 1450b, 1450c and 1450d) arranged in rows and columns. In many, but not all, of the figures where array 1480 appears, representative memory cell 1450a will be representative of a "selected" memory cell 1450 when the operation being described has one (or more in some embodiments) selected memory cells 1450. In such figures, representative memory cell 1450b will be representative of an unselected memory cell 1450 sharing the same row as selected representative memory cell 1450a, representative memory cell 1450c will be representative of an unselected memory cell 1450 sharing the same column as selected representative memory cell 1450a, and representative memory cell 1450d will be representative of a memory cell 1450 sharing neither a row or a column with selected representative memory cell 1450a.

Present in FIG. 36 are word lines 70a through 70n, source lines 72a through 72n, bit lines 74a through 74p, buried layer terminals 76a through 76n, and substrate terminal 78a through 78n (or just 78 when a common substrate terminal is used for all cells). Representation of the lines/terminal with letters a-n or a through p, includes not only embodiments which include literally twelve lines/terminals (i.e., a,b,c,d,e,f,g,h,i,j,k,l,m,n,o,p) or fourteen lines/terminals (i.e., a,b,c,d,e,f,g,h,i,j,k,l,m,n,o,p), but is meant to more generically represent a plurality of such line terminals, which can be less than twelve (i.e., as low as one or greater than twelve, thirteen or fourteen (much greater than fourteen up to any positive integer practical).

Each of the source lines 72a through 72n is associated with a single row of memory cells 1450 and is coupled to the source line region 16 of each memory cell 1450 in that row. Each of the bit lines 74a through 74p is associated with a single column of memory cells 1450 and is coupled to the bit line region 18 of each memory cell 1450 in that column.

Substrate 12 is present at all locations under array 1480. Persons of ordinary skill in the art will appreciate that one or more substrate terminals 78 may be present in one or more locations. Such skilled persons will also appreciate that although array 1480 is shown in FIG. 36 as a single continuous array, many other organizations and layouts are possible. For example, word lines may be segmented or buffered, bit lines may be segmented or buffered, source lines may be segmented or buffered, the array 1480 may be broken into two or more sub-arrays, control circuits such as word decoders, column decoders, segmentation devices, sense amplifiers, write amplifiers may be arrayed around array 1480 or inserted between sub-arrays of array 1480. Thus the present invention is not limited to the exemplary embodiments, features, design options, etc., shown and described.

Several operations can be performed to memory cell 1450, such as: write logic-0, write logic-1, and read. The operation of the memory cell 1450 will be described using an n-channel device as an example.

Figure 37A:
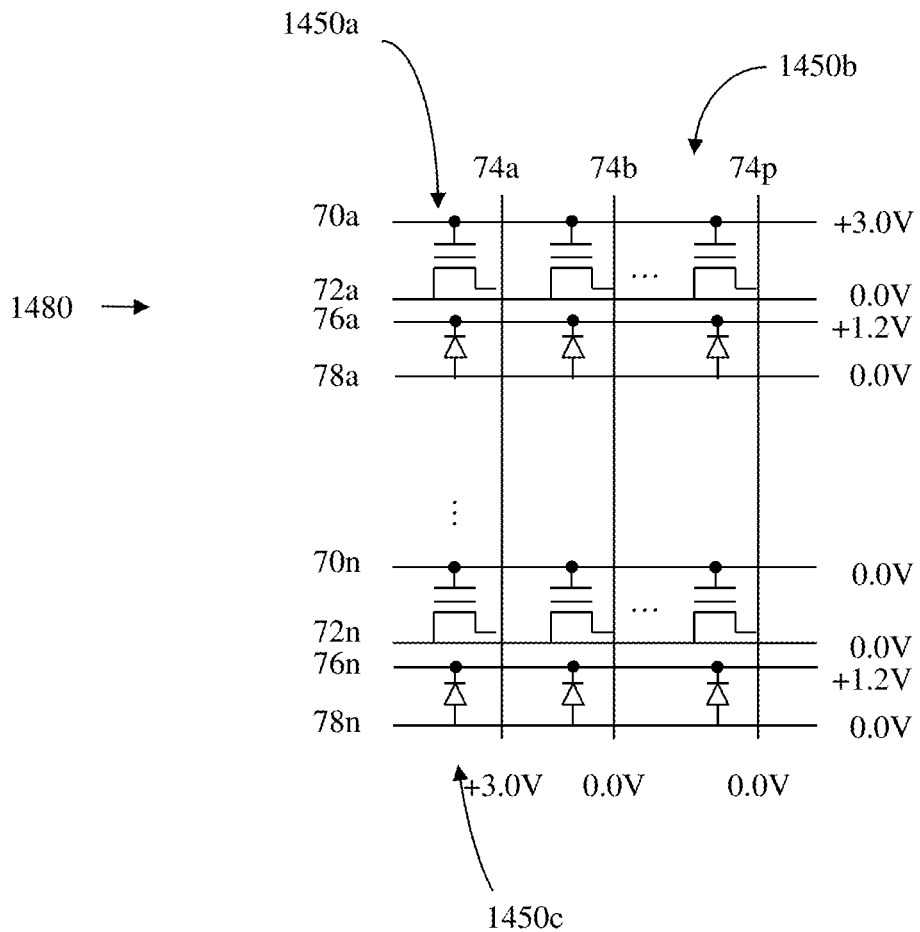
FIGS. 37A-37B illustrate bias conditions applied on the terminals of a memory cell of FIG. 36 to perform a write logic-0 operation.
Figure 37B:
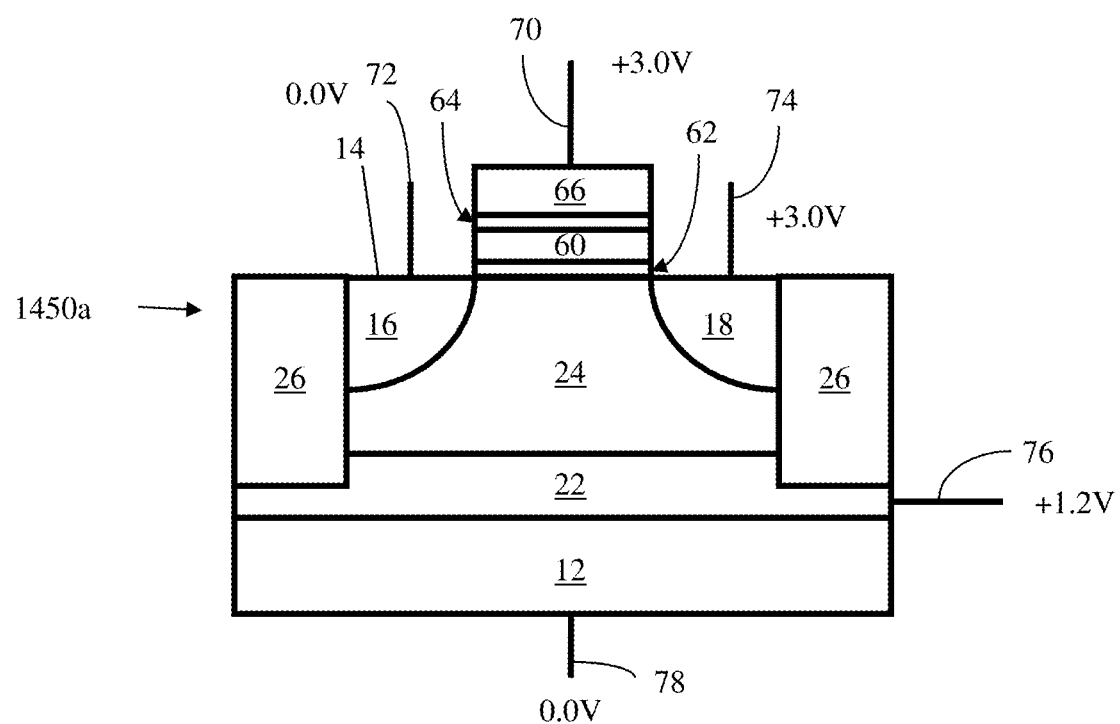

FIG. 37A is a schematic view of a memory array 1480 showing exemplary bias conditions for performing a write logic-0 operation on the memory array 1480, according to an embodiment of the present invention. FIG. 37B shows exemplary bias conditions applied to a selected memory cell 1450a during the write logic-0 operation noted with regard to array 1480 in FIG. 37A. The write logic-0 operation corresponds to injecting electrons into the floating gate 60 by a channel hot electron injection mechanism.

The following bias conditions can be applied to the selected memory cell 1450a for write logic-0 operation as described with reference to FIG. 37B: a positive voltage is applied to the control gate 66 (through WL terminal 70), a positive voltage is applied to the drain region 18 (through BL terminal 74), about zero voltage is applied to the source line region 16 (through SL terminal 72), a positive voltage is applied to the buried layer 22 (through BNL terminal 76), and about zero voltage is applied to the substrate 12 (through substrate terminal 78).

In one particular non-limiting embodiment, about +3.0 volts is applied to WL terminal 70, about +3.0 volts is applied to BL terminal 74, about 0.0 volts is applied to SL terminal 72, about +1.2 volts is applied to BNL terminal 76, and about 0.0 volts is applied to substrate terminal 78.

The positive bias on the control gate 66 (through WL terminal 70) and drain region 18 (through BL terminal 74) will increase the potential of the floating body region 24 through capacitive coupling. Alternatively, the positive bias on the control gate 66 (through the WL terminal 70) and the drain region 18 (through the BL terminal 74) generates electron hole pairs near the junction between the drain region 18 and the floating body region 24 through impact ionization, which injects holes to the floating body region 24 and increases the floating body 24 potential.

When the buried layer 22 (through BNL terminal 76) is positively biased and the potential of the floating body region 24 induced by the capacitive coupling and/or the hole supply due to impact ionization becomes greater than the potential required to turn on the vertical bipolar transistor 30a, then electrons will flow from the emitter region (source region 16) to the collector region (buried layer 22). If the positive potential applied on the buried layer 22 is sufficient to cause impact ionization, electron hole pairs are generated near a junction between the floating body 24 and the buried layer 22. The impact ionization rate as a function of the electric field is for example described in "Physics of Semiconductor Devices", Sze S. M. and Ng K. K., which is hereby incorporated herein, in its entirety, by reference thereto.

Figure 38:
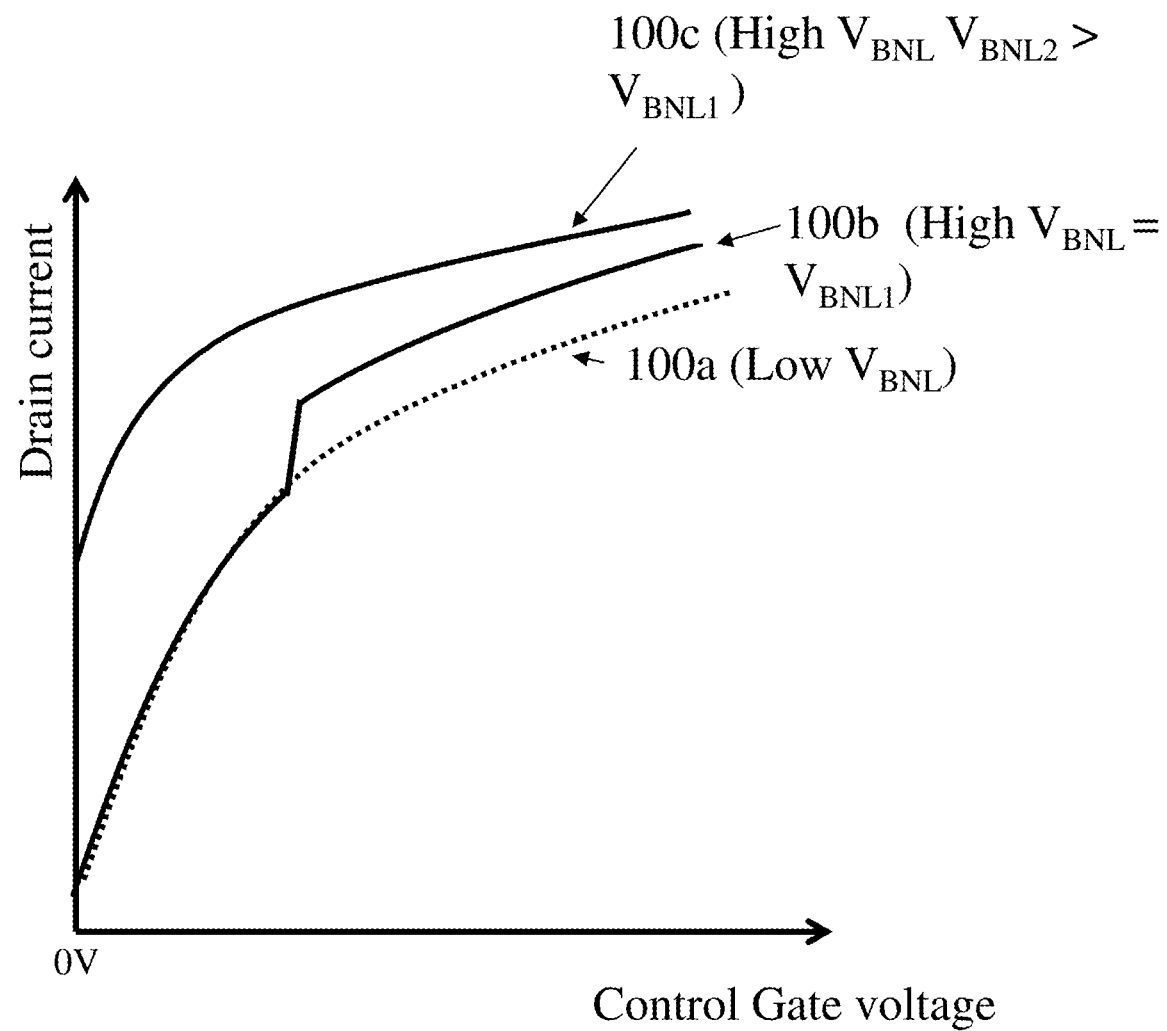
FIG. 38 illustrates drain current versus control gate voltage characteristics for various voltages applied to a buried layer, representing a memory cell according to an embodiment of the present invention.

The generated electrons are collected to the positively biased buried layer 22, while the generated holes flows into the floating body 24. The generated holes become the base current of the lateral bipolar device 30c and turn the bipolar device 30c on. As a result, a higher current flows through the cell 1450 (from the BL terminal 74 to the SL terminal 72) compared to when the BNL terminal 76 is grounded. The higher current is a sum of the transistor 20 current and the lateral bipolar device 30c current. As shown in FIG. 38, the cell 1450 current is boosted higher compared to the cell 1450 current when the BNL terminal 76 is grounded (or at a positive potential not sufficient to cause impact ionization). The electron flow through the cell 1450 (from the SL terminal 72 to the BL terminal 74) then creates electron hole pairs near the junction between the drain region 18 and the floating body region 24. Some of the generated electrons are attracted by the vertical electrical field due to the positive voltage applied to the control gate 66 (through the WL terminal 70), negatively charging the floating gate 60.

The write logic-0 operation (the injection of electrons to the floating gate 60) is enhanced through the application of positive bias to the buried layer 22 (through the BNL terminal 76) due to the higher current flow (from the BL terminal 74 to the SL terminal 72) as shown in FIG. 38. The increased efficiency of the logic-0 operation may be used to increase the speed of the logic-0 operation, or to lower the voltage applied to the drain region 18 and/or the control gate 66, reducing the operating power of the non-volatile memory cell 1450.

If the positive bias applied to the buried layer 22 is too high, the vertical bipolar transistor 30a and the lateral bipolar transistor 30c can be turned on even when the gate voltage is zero. In this case, the lateral bipolar transistor 30c of the unselected cell 1450c of FIG. 37A is turned on, which results in electron hole pair generation near the junction between the drain region 18 and the floating body region 24 of the unselected cell. The electron-hole pair may cause undesired write '0' to the unselected cell 1450c. To avoid the undesired write '0', the positive bias applied to the buried layer 22 may be chosen to activate the lateral bipolar transistor of selected cell 1450a but not activate the lateral bipolar transistor of bit line disturbed cells such as unselected cell 1450c of FIG. 37A.

Figure 39:
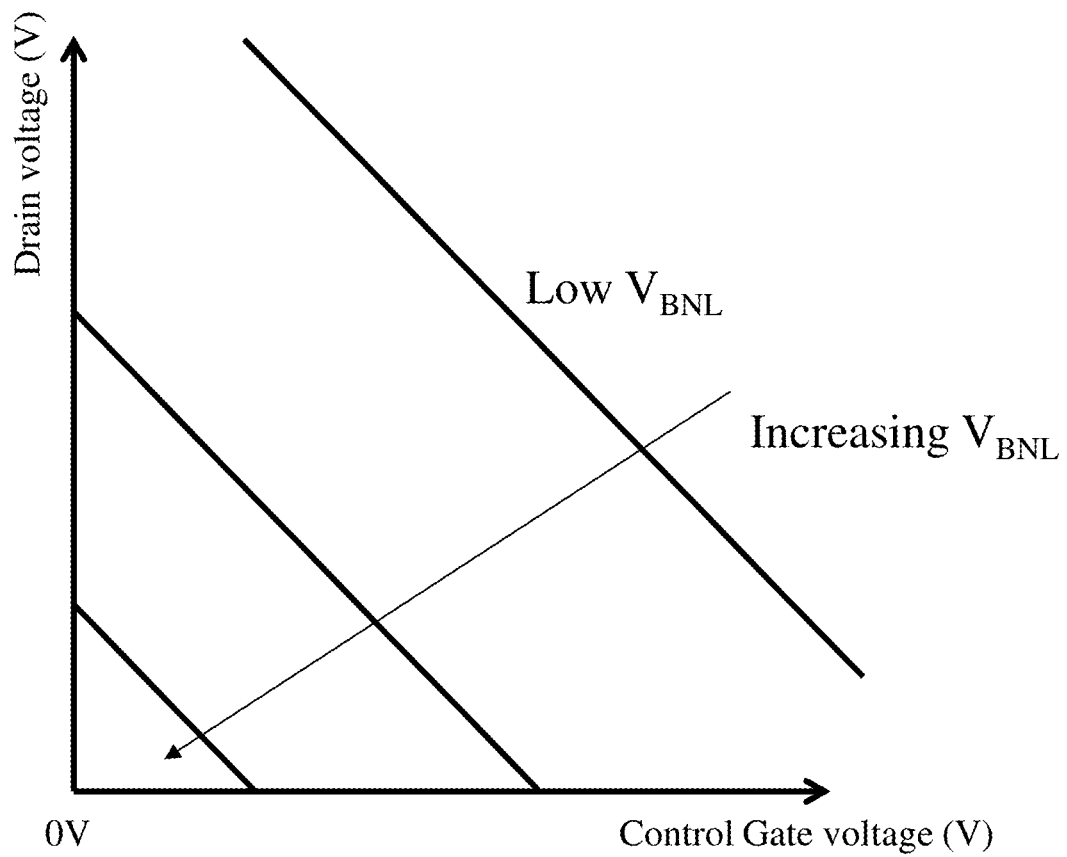
FIG. 39 illustrates minimum gate and drain voltage to activate a lateral BJT for different voltages applied to a buried layer, representing a memory cell according to an embodiment of the present invention.

FIG. 39 represents the drain 18 voltage and control gate 66 voltage that results in turning on the vertical bipolar device 30a and enhances the write logic-0 operation. In other words, the lines indicate the minimum control gate 66 voltage and drain 18 voltage to activate the lateral bipolar device 30c at a given buried layer 22 voltage. The voltages at upper and right region of the line causes the lateral bipolar device 30c to turn on.

Figure 40A:
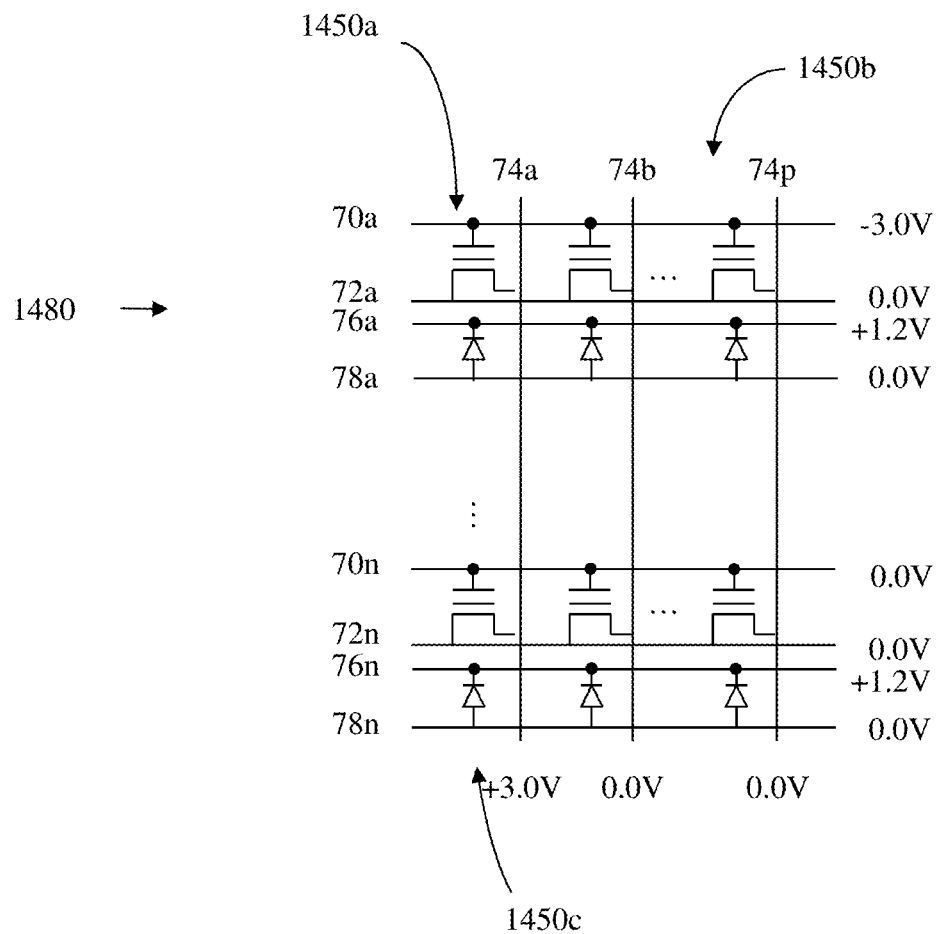
FIGS. 40A-40B illustrate bias conditions applied on the terminals of a memory cell of FIG. 36 to perform a write logic-1 operation.
Figure 40B:
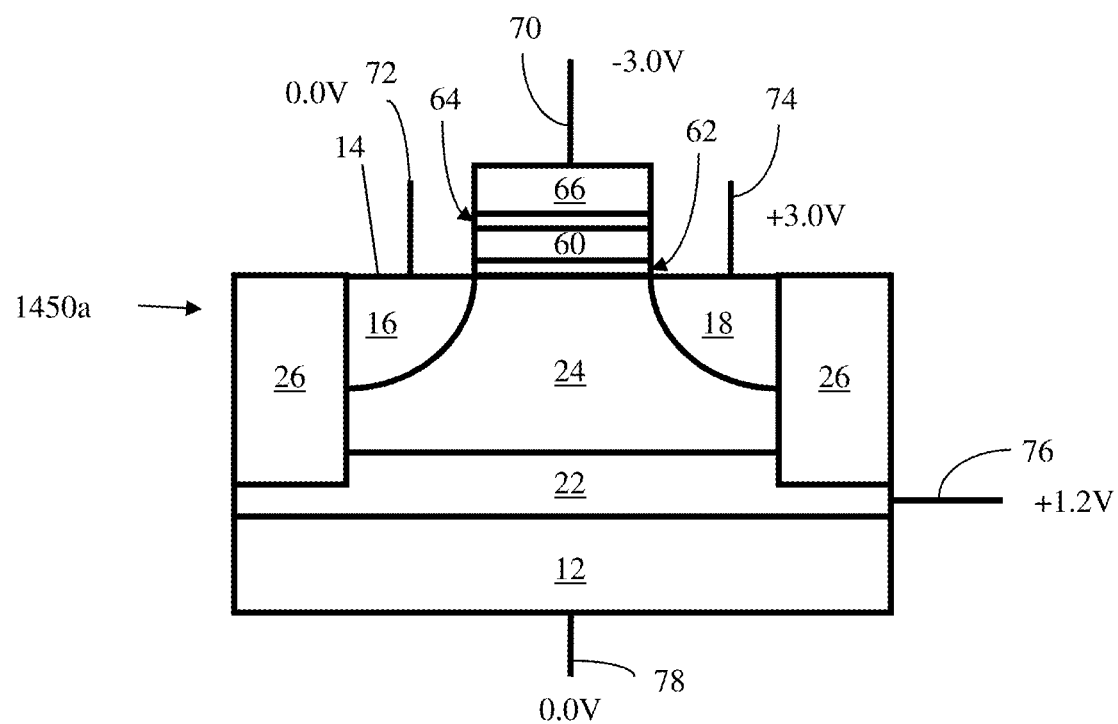

FIG. 40A is a schematic view of a memory array 1480 showing exemplary bias conditions for performing a write logic-1 operation on the memory array 1480, according to an embodiment of the present invention. FIG. 40B shows exemplary bias conditions applied to a selected memory cell 1450a during the write logic-1 operation noted with regard to array 1480 in FIG. 40A.

The following bias conditions can be applied to memory cell 1450 for a write logic-1 operation as described with reference to FIG. 40B: a negative voltage is applied to the control gate 66 (through WL terminal 70), a positive voltage is applied to the drain region 18 (through BL terminal 74), about zero voltage is applied to the source line region 16 (through SL terminal 72), a positive voltage is applied to the buried layer 22 (through BNL terminal 76), and about zero voltage is applied to the substrate 12 (through substrate terminal 78).

In one particular non-limiting embodiment, about −3.0 volts is applied to WL terminal 70, about +3.0 volts is applied to BL terminal 74, about 0.0 volts is applied to SL terminal 72, about +1.2 volts is applied to BNL terminal 76, and about 0.0 volts is applied to substrate terminal 78.

The negative bias on the control gate 66 (through the WL terminal 70) and the drain region 18 (through the BL terminal 74) causes band-to-band tunneling, which is also referred to as Gate Induced Drain Leakage (GIDL), which injects holes to the floating body region 24 and increases the floating body 24 potential.

When the buried layer 22 (through BNL terminal 76) is positively biased and the potential of the floating body region 24 induced by the hole supply due to GIDL becomes greater than the potential required to turn on the vertical bipolar transistor 30a, then electrons will flow from the emitter region (source region 16) to the collector region (buried layer 22). If the positive potential applied on the buried layer 22 is sufficient to cause impact ionization, electron hole pairs are generated near a junction between the floating body 24 and the buried layer 22. The generated electrons are collected to the positively biased buried layer 22, while the generated holes flows into the floating body 24. The generated holes become the base current of the lateral bipolar device 30c and turn the bipolar device 30c on. As a result, current will flow through the cell 1450 (from the BL terminal 74 to the SL terminal 72). If the lateral bipolar device 30c is not turned on, there is normally very small current flow from the BL terminal 74 to the SL terminal 72 because of the negative voltage applied to the control gate 66 (through the WL terminal 70). The electron flow through the cell 1450 (from the SL terminal 72 to the BL terminal 74) then creates electron hole pairs near the junction between the drain region 18 and the floating body region 24. Some of the generated holes are then attracted by the vertical electrical field due to the negative voltage applied to the control gate 66 (through the WL terminal 70), positively charging the floating gate 60.

The write logic-1 operation (the injection of holes to the floating gate 60) is enhanced through the application of positive bias to the buried layer 22 (through the BNL terminal 76) due to the activation of the bipolar device 30c (which in turn is a result of the turning on of the vertical bipolar device 30a and/or 30b). The increased efficiency of the logic-1 operation may be used to increase the speed of the logic-1 operation, or to lower the voltage applied to the drain region 18 and/or the control gate 66, reducing the operating power of the non-volatile memory cell 1450. The lowered voltage applied to the control gate 66 can mitigate soft write logic-1 issues in the word line disturbed cell such as the unselected cell 1450b of FIG. 40A. The write logic-1 operation using hot hole injection mechanism may be used for bit-selective write logic-1 operation.

Figure 41A:
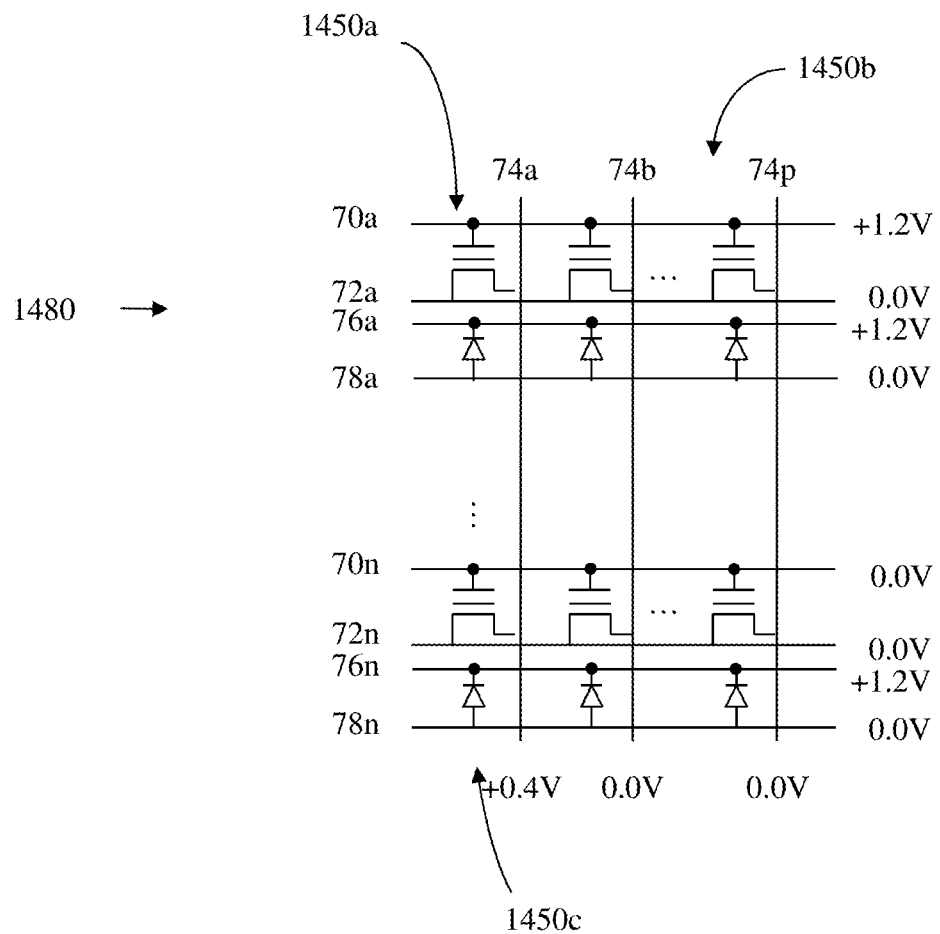
FIGS. 41A-41B illustrate bias conditions applied on the terminals of a memory cell of FIG. 36 to perform a read operation.
Figure 41B:
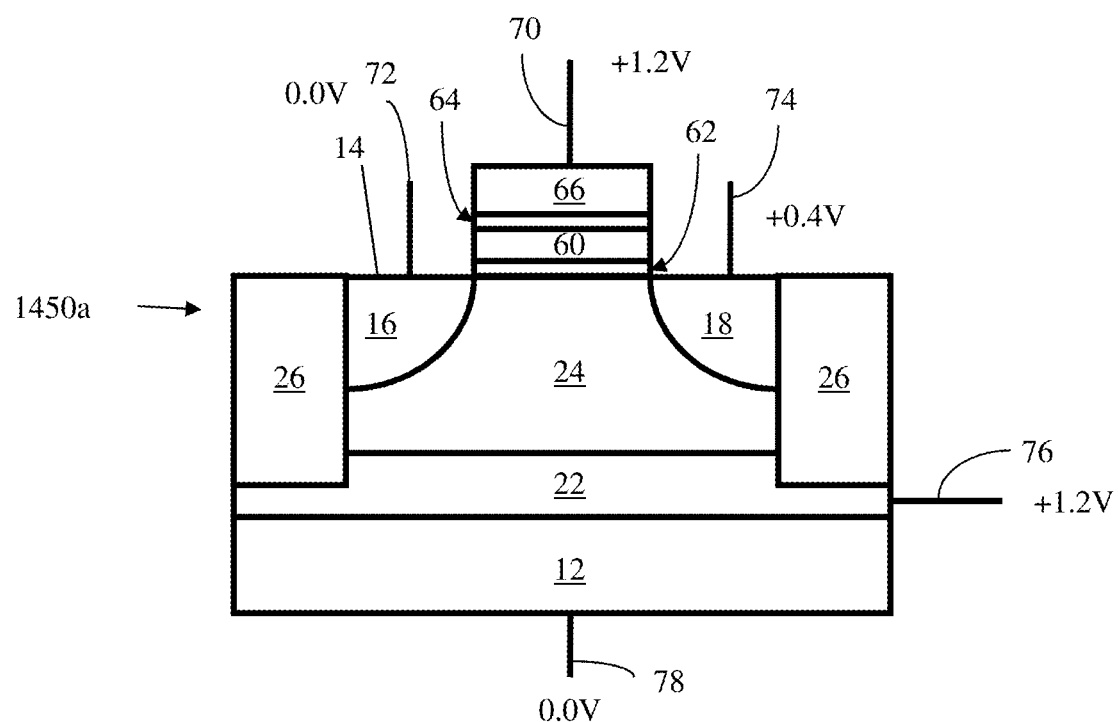

FIG. 41A is a schematic view of a memory array 1480 showing exemplary bias conditions for performing a read operation on the memory array 1480, according to an embodiment of the present invention. FIG. 41B shows exemplary bias conditions applied to a selected memory cell 1450a during the read operation noted with regard to array 1480 in FIG. 41A.

FIG. 41B illustrates a read operation applied to the memory cell 1450a, where the following bias conditions are applied: a positive voltage is applied to the control gate 66

(through the WL terminal 70), a positive voltage lower than the positive voltage applied to the control gate 66 is applied to the drain region 18 during write logic-1 and/or logic-0 operation is applied to the drain region 18 (through the BL terminal 74), zero voltage is applied to the source region 16 (through the SL terminal 72), zero voltage or positive voltage is applied to the buried layer 22 (through the BNL terminal 76), and zero voltage is applied to the substrate terminal 78.

In one particular non-limiting embodiment, about +1.2 volts is applied to WL terminal 70, about +0.4 volts is applied to BL terminal 74, about 0.0 volts is applied to SL terminal 72, about +1.2 volts is applied to BNL terminal 76, and about 0.0 volts is applied to substrate terminal 78.

Figure 42:
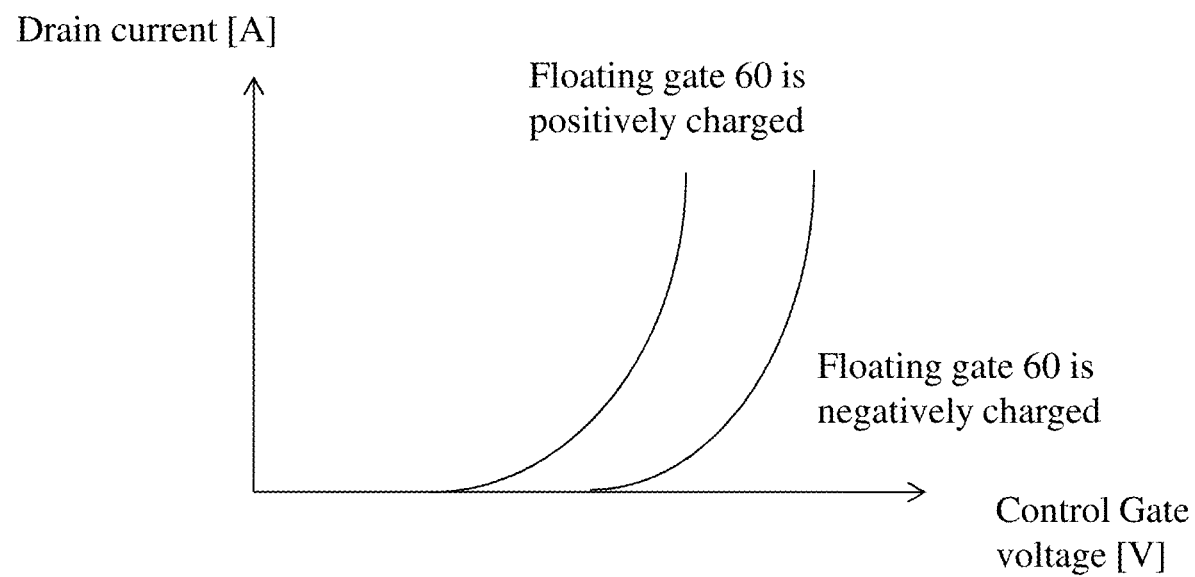
FIG. 42 illustrates drain current versus control gate characteristics during a read operation performed to a memory cell according to an embodiment of the present invention.

The charge in the floating gate 60 modulates the current flow through the memory cell 1450a. FIG. 42 illustrates the drain current-gate voltage (Id-Vg) relationship of the memory cell 1450 in both logic-1 (when the floating gate or trapping layer 60 is positively charged) and logic-0 (when the floating gate or trapping layer 60 is negatively charged). The memory cell 1450 has a lower threshold voltage (gate voltage when the cell 1450 or transistor 20 is turned on) when cell 1450 is in logic-1 state compared to when memory cell 1450 is in logic-0 state. In one embodiment, the voltage applied to the drain region 18 is lower than the voltage required to turn on the lateral bipolar device 30c to suppress the current flow (from the BL terminal 74 to the SL terminal 72) when the memory cell 1450 is in logic-0 state. In another embodiment, a higher voltage may be applied to the drain region 18 to increase the current flow through the memory cell 1450 (from the BL terminal 74 to the SL terminal 72).

Figure 43:
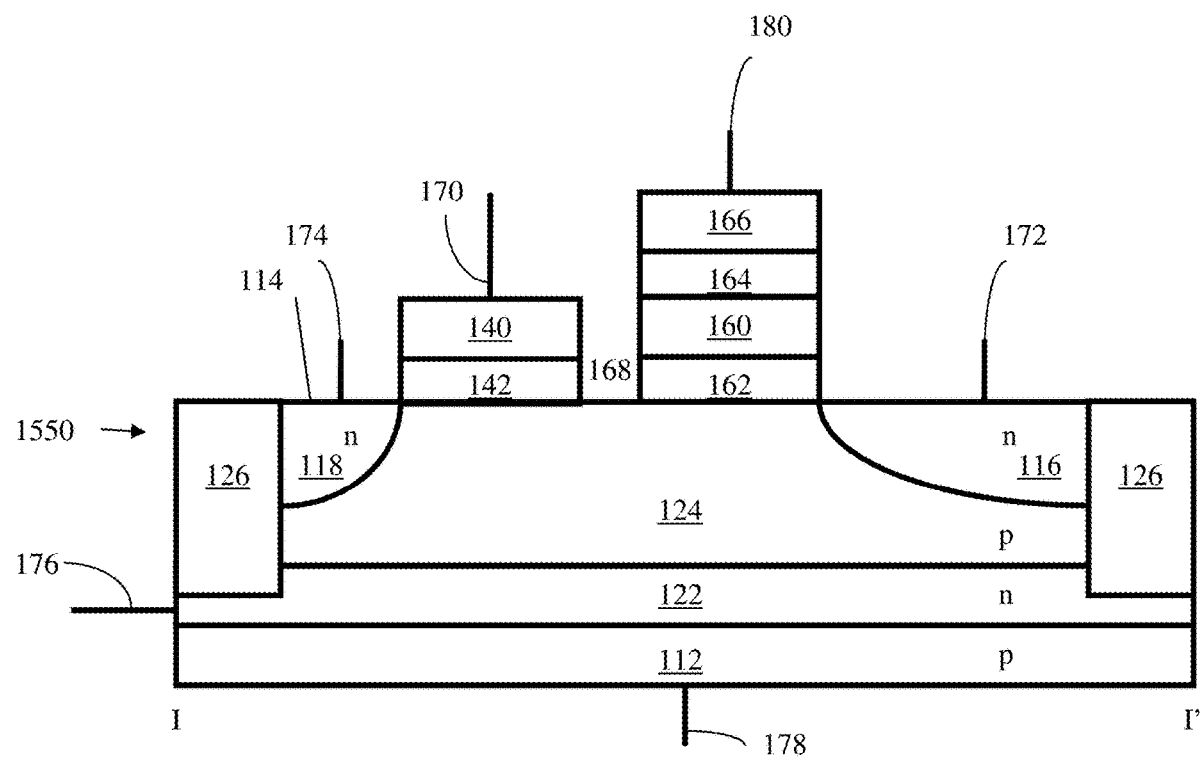
FIG. 43 is a schematic, cross-sectional illustration of a memory cell according to another embodiment of the present invention.

FIG. 43 illustrates a cross-sectional view of another embodiment of memory cell 1550 according to the present invention, which adds a select gate 140 to the memory cell 1450. The select gate 140 is spaced apart from the floating gate or trapping layer 160 (shown as the gap region 168) and is positioned in between the bit line region 118 and the insulating gap region 168, and above the floating body region 124. The select gate 140 is insulated from floating body region 124 by an insulating layer 142. Insulating layer 142 may be made of silicon oxide and/or other dielectric materials, including high-K dielectric materials, such as, but not limited to, tantalum peroxide, titanium oxide, zirconium oxide, hafnium oxide, and/or aluminum oxide. The select gate 140 may be made of, for example, polysilicon material or metal gate electrode, such as tungsten, tantalum, titanium and their nitrides.

In FIG. 43, the source line region 116 is shown to have a larger area than the bit line region 118, which results in a higher coupling ratio between the source line region 116 and the floating gate or trapping layer 160. In another embodiment, the area of the source line region 116 and bit line region 118 may be the same.

Memory cell 1550 includes six terminals: word line (WL) terminal 170, control gate (CG) terminal 180, source line (SL) terminal 172, bit line (BL) terminal 174, buried layer (BNL for buried n-type layer or BPL for buried p-type layer) terminal 176, and substrate terminal 178. Terminal 170 is connected to select gate 140. Terminal 172 is connected to source line region 116 and terminal 174 is connected to bit line region 118. Alternatively, terminal 172 can be connected to bit line region 118 and terminal 174 can be connected to source line region 116. Terminal 176 is connected to buried layer 122. Substrate terminal 178 is connected to substrate 112 below buried layer 122 and terminal 180 is connected to control gate 166. Control gate 166 is positioned above floating gate/trapping layer 160 and insulated therefrom by insulating layer 164 such that floating gate/trapping layer 160 is positioned between insulating layer 162 and surface 14 underlying floating gate/trapping layer 160, and insulating layer 164 and control gate 166 positioned above floating gate/trapping layer 60, as shown. Control gate 66 is capacitively coupled to floating gate/trapping layer 60.

Application of back bias to buried layer 122 (through BNL or BPL terminal 176), which turns on the vertical bipolar devices formed by source line region 116 or bit line region 118, floating body region 124, and buried layer region 122, may be used to enhance the write operations performed to memory cell 1550.

Several operations can be performed to memory cell 1550, such as: write logic-0, write logic-1, and read. The operation of the memory cell 1550 will be described using an n-channel device as an example. The write operations will be described using active low biasing scheme, where the voltage applied to the selected BL terminal 74a is lower than the voltage applied to the unselected BL terminals (for example 74b, 74c, etc.)

Figure 44:
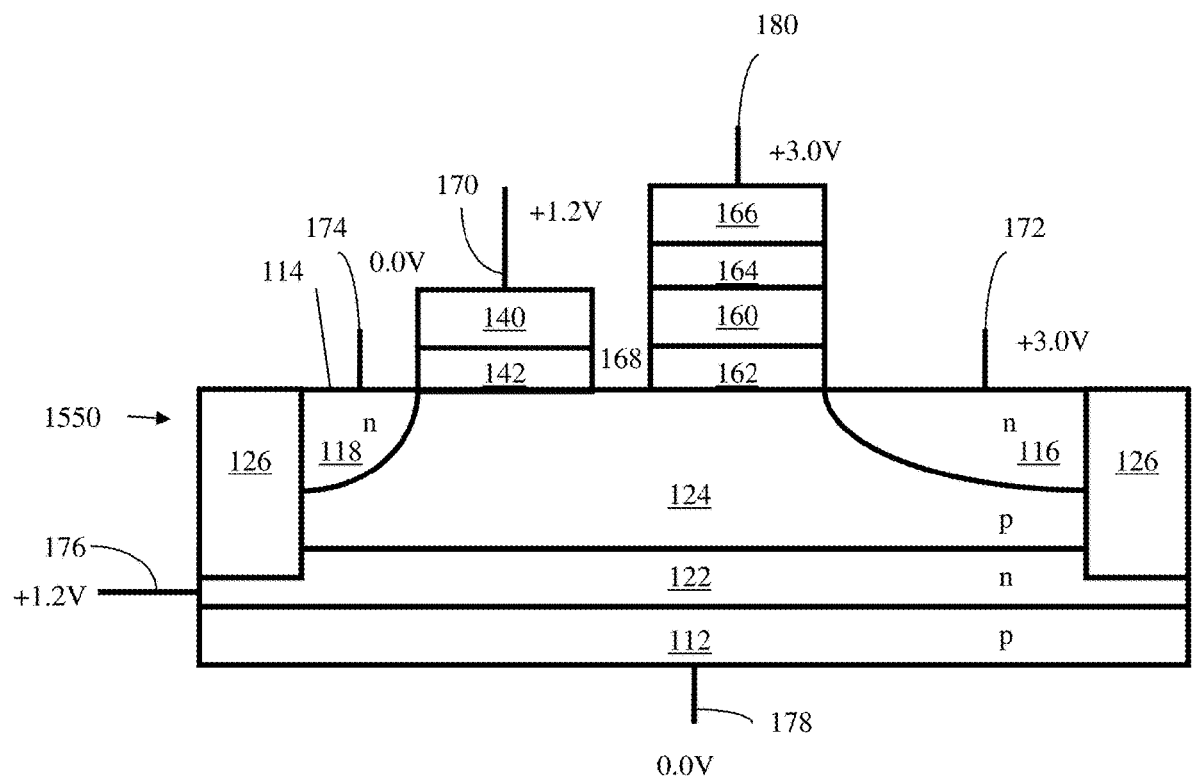
FIG. 44 illustrates bias conditions applied on the terminals of the memory cell shown in FIG. 43 to perform a write logic-0 operation.

The following bias conditions can be applied to the selected memory cell 1550a for write logic-0 operation as described with reference to FIG. 44: a positive voltage is applied to the select gate 140 (through WL terminal 170), a positive voltage is applied to the control gate 166 (through CG terminal 180), a positive voltage is applied to the source line region 116 (through SL terminal 172), about zero voltage is applied to the bit line region 118 (through BL terminal 174), a positive voltage is applied to the buried layer 122 (through BNL terminal 176), and about zero voltage is applied to the substrate 112 (through substrate terminal 178).

In one particular non-limiting embodiment, about +1.2 volts is applied to the WL terminal 170, about +3.0 volts is applied to CG terminal 180, about +3.0 volts is applied to SL terminal 172, about 0.0 volts is applied to BL terminal 174, about +1.2 volts is applied to BNL terminal 176, and about 0.0 volts is applied to substrate terminal 178.

Similar to cell 1450, the application of a positive bias on the control gate 166 (through CG terminal 180) and source line region 116 (through SL terminal 172) will increase the potential of the floating body region 124 through capacitive coupling and/or the hole supply due to impact ionization. This in turn turns on the bipolar device (formed by the bit line region 118, floating body region 124, and buried layer 122), which subsequently increases the current flow through the cell 1550 (from the SL terminal 172 to the BL terminal 174), compared to when the BNL terminal 176 is grounded. The electron flow from the BL terminal 174 to the SL terminal 172 then creates electron hole pairs near the junction between the source line region 116 and the floating body region 124. Some of the generated electrons are attracted by the vertical electrical field due to the positive voltage applied to the control gate 166 (through the CG terminal 180), which negatively charge the floating gate or trapping layer 160.

Figure 45:
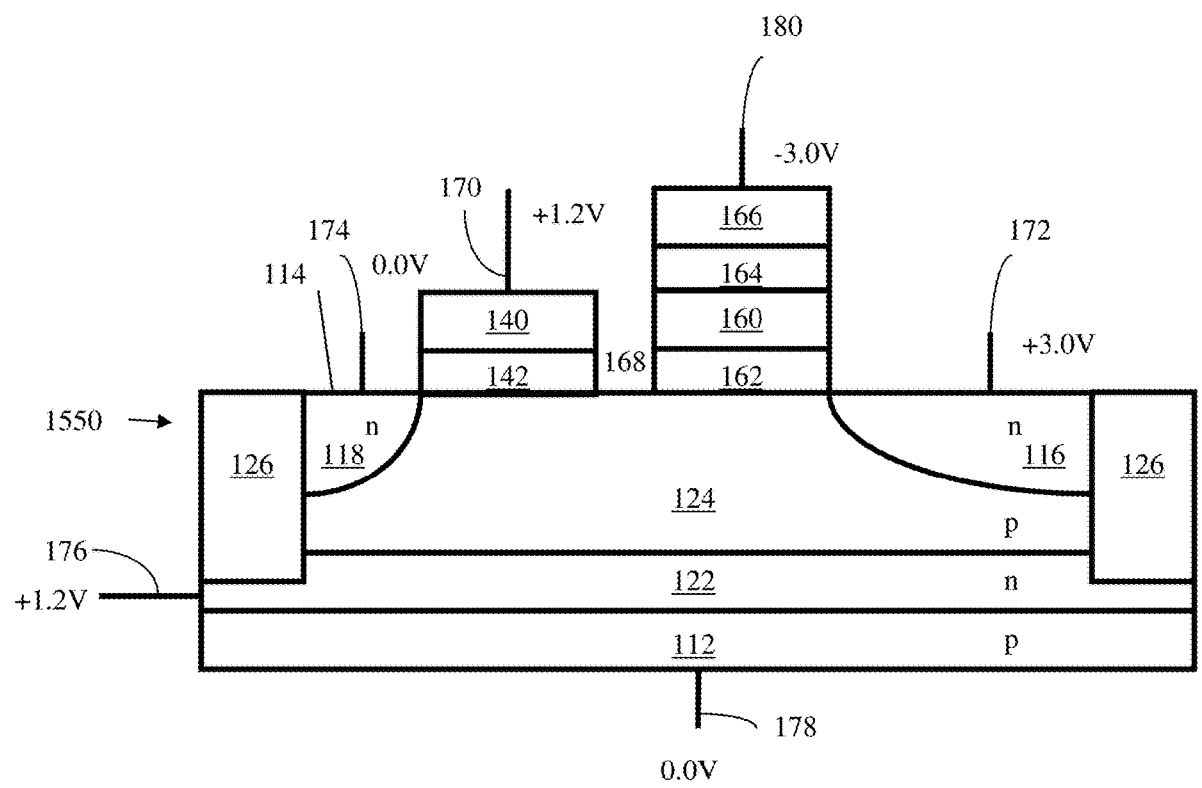
FIG. 45 illustrates bias conditions applied on the terminals of the memory cell shown in FIG. 43 to perform a write logic-1 operation.

FIG. 45 illustrates the bias conditions applied to the selected memory cell 1550 for a write logic-1 operation: a positive voltage is applied to the select gate 140 (through WL terminal 170), a negative voltage is applied to the control gate 166 (through CG terminal 180), a positive voltage is applied to the source line region 116 (through SL terminal 172), about zero voltage is applied to the bit line region 118 (through BL terminal 174), a positive voltage is applied to the buried layer 122 (through BNL terminal 176), and about zero voltage is applied to the substrate 112 (through substrate terminal 178).

In one particular non-limiting embodiment, about +1.2 volts is applied to the WL terminal 170, about −3.0 volts is applied to CG terminal 180, about +3.0 volts is applied to SL terminal 172, about 0.0 volts is applied to BL terminal 174, about +1.2 volts is applied to BNL terminal 176, and about 0.0 volts is applied to substrate terminal 178.

The negative bias on the control gate 166 (through the CG terminal 180) and the positive bias on the source line region 116 (through the SL terminal 172) causes band-to-band tunneling, which is also referred to as Gate Induced Drain Leakage (GIDL), which injects holes to the floating body region 124 and increases the floating body 124 potential. This in turn turns on the bipolar device (formed by the bit line region 118, floating body region 124, and buried layer 122), which subsequently increases the current flow through the cell 1550 (from the SL terminal 172 to the BL terminal 174), compared to when the BNL terminal 176 is grounded. The electron flow from the BL terminal 174 to the SL terminal 172 then creates electron hole pairs near the junction between the source line region 116 and the floating body region 124. Some of the generated holes are attracted by the vertical electrical field due to the negative voltage applied to the control gate 166 (through the CG terminal 180), positively charging the floating gate or trapping layer 160.

Figure 46:
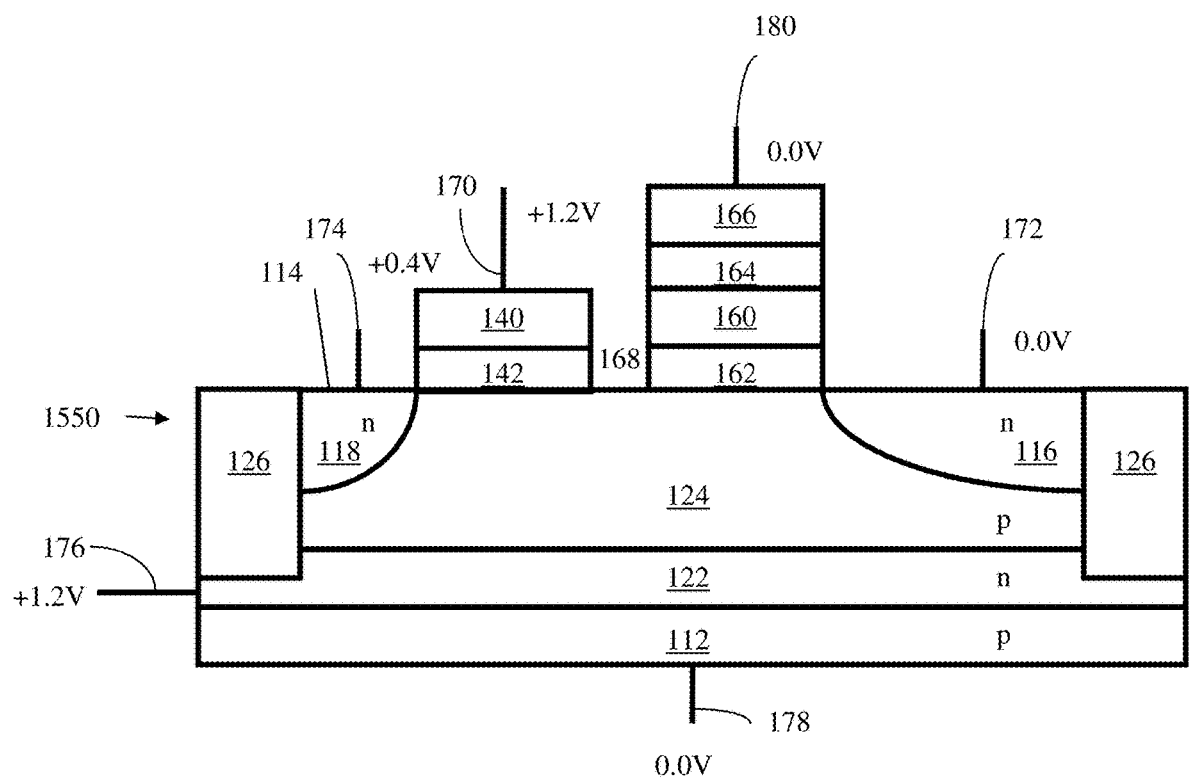
FIG. 46 illustrates bias conditions applied on the terminals of a memory cell shown in FIG. 43 to perform a read operation.

FIG. 46 illustrates the bias conditions applied to the selected memory cell 1550 for a read operation: a positive voltage is applied to the select gate 140 (through WL terminal 170), zero or a positive voltage is applied to the control gate 166 (through CG terminal 180), about zero voltage is applied to the source line region 116 (through SL terminal 172), a positive voltage is applied to the bit line region 118 (through BL terminal 174), a positive voltage is applied to the buried layer 122 (through BNL terminal 176), and about zero voltage is applied to the substrate 112 (through substrate terminal 178).

In one particular non-limiting embodiment, about +1.2 volts is applied to the WL terminal 170, about 0.0 volts is applied to CG terminal 180, about 0.0 volts is applied to SL terminal 172, about +0.4 volts is applied to BL terminal 174, about +1.2 volts is applied to BNL terminal 176, and about 0.0 volts is applied to substrate terminal 178.

Figure 47:
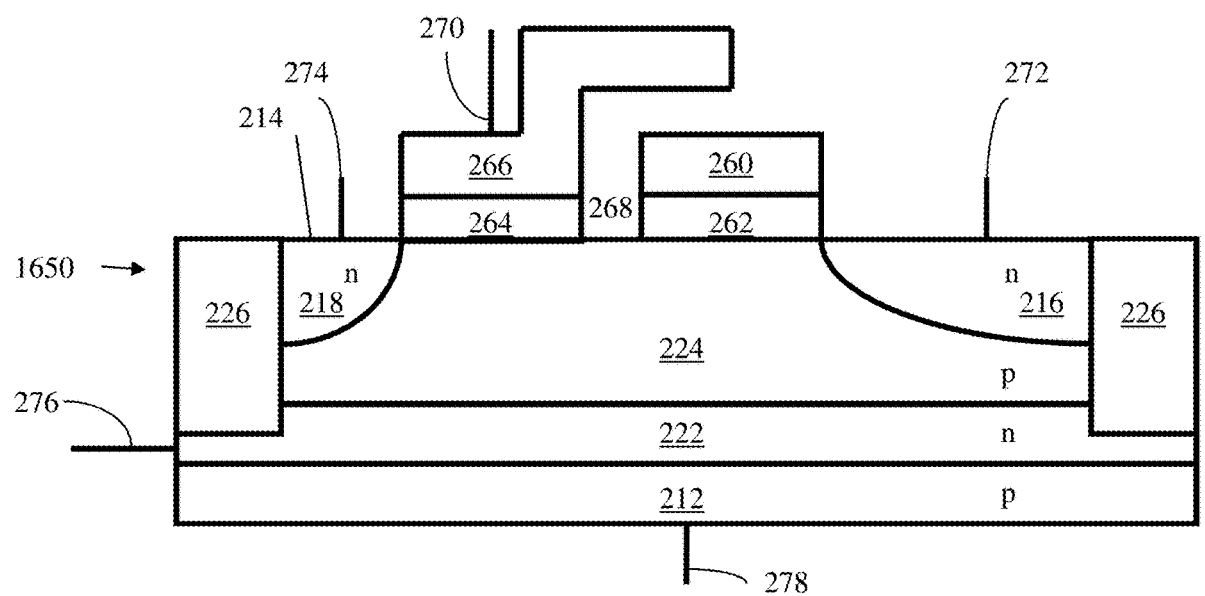
FIG. 47 is a schematic, cross-sectional illustration of a memory cell according to another embodiment of the present invention.

FIG. 47 illustrates a schematic cross-sectional view of a memory cell 1650 according to another embodiment of the present invention. Memory cell 1650 is similar to memory cell 1550, but where the select gate 140 and control gate 166 (of memory cell 1550) are merged into control gate 266. The select gate 266 may have overlap (partially or complete) with the floating gate or trapping layer 260. The select gate 266 may be made of, for example, polysilicon material or metal gate electrode, such as tungsten, tantalum, titanium and their nitrides.

In FIG. 47, the source line region 216 is shown to have a larger area than the bit line region 218, which results in a higher coupling ratio between the source line region 216 and the floating gate or trapping layer 260. In another embodiment, the area of the source line region 216 and bit line region 218 may be the same.

Memory cell 1650 includes five terminals: word line (WL) terminal 270, source line (SL) terminal 272, bit line (BL) terminal 274, buried layer (BNL for buried n-type layer or BPL for buried p-type layer) terminal 276, and substrate terminal 278. Terminal 170 is connected to select gate 266. Terminal 272 is connected to source line region 216 and terminal 274 is connected to bit line region 218. Alternatively, terminal 272 can be connected to bit line region 218 and terminal 274 can be connected to source line region 216. Terminal 276 is connected to buried layer 222. Substrate terminal 278 is connected to substrate 212 below buried layer 222.

Application to back bias to buried layer 222 (through BNL or BPL terminal 276), which turns on the vertical bipolar devices formed by source line region 216 or bit line region 218, floating body region 224, and buried layer region 222, may be used to enhance the write operations performed to memory cell 1650.

Several operations can be performed to memory cell 1650, such as: write logic-0, write logic-1, and read. The operation of the memory cell 1650 will be described using an n-channel device as an example. The write operations will be described using an active low biasing scheme, where the voltage applied to the selected BL terminal 74a is lower than the voltage applied to the unselected BL terminals (for example 74b, 74c, etc.)

Figure 48:
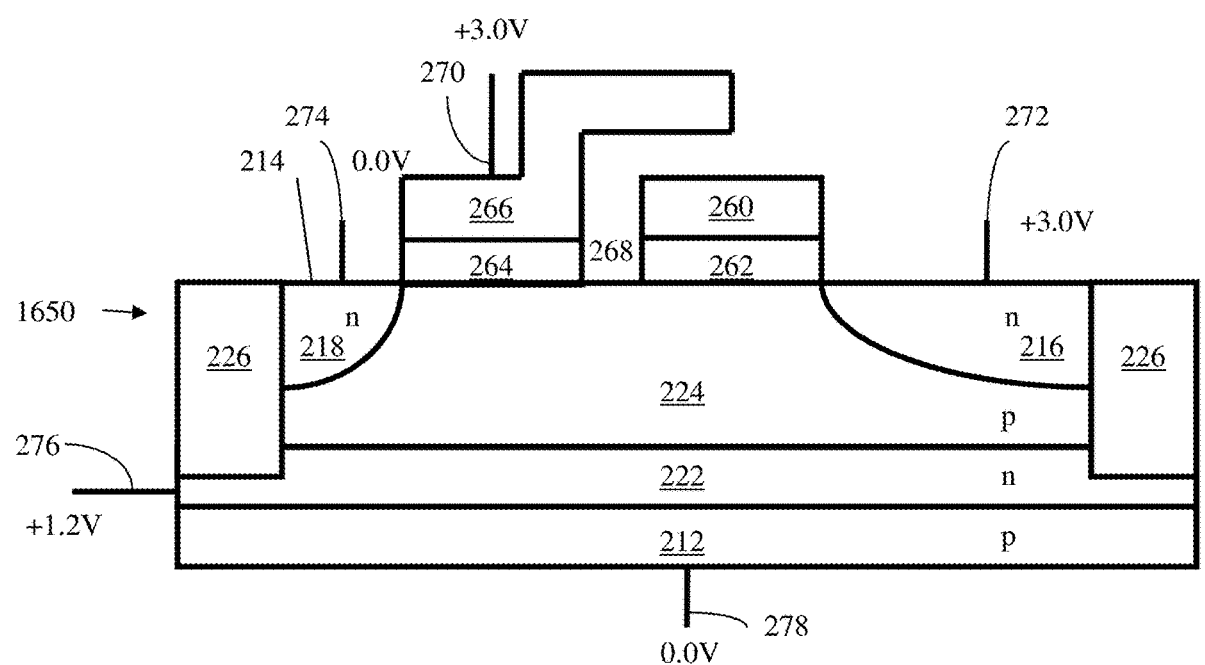
FIG. 48 illustrates bias conditions applied on the terminals of the memory cell shown in FIG. 47 to perform a write logic-0 operation.

The following bias conditions can be applied to the selected memory cell 1650 for a write logic-0 operation as described with reference to FIG. 48: a positive voltage is applied to the select gate 266 (through WL terminal 270), a positive voltage is applied to the source line region 216 (through SL terminal 272), about zero voltage is applied to the bit line region 218 (through BL terminal 274), a positive voltage is applied to the buried layer 222 (through BNL terminal 276), and about zero voltage is applied to the substrate 212 (through substrate terminal 278).

In one particular non-limiting embodiment, about +3.0 volts is applied to the WL terminal 270, about +3.0 volts is applied to SL terminal 272, about 0.0 volts is applied to BL terminal 274, about +1.2 volts is applied to BNL terminal 276, and about 0.0 volts is applied to substrate terminal 278.

Following the same principles as those of cells 1450 and 1550, the application of a positive bias on the control gate 266 (through WL terminal 270) and source line region 216 (through SL terminal 272) will increase the potential of the floating body region 224 through capacitive coupling and/or the hole supply due to impact ionization. This in turn turns on the bipolar device (formed by the bit line region 218, floating body region 224, and buried layer 222), which subsequently increases the current flow through the cell 1650 (from the SL terminal 272 to the BL terminal 274), compared to when the BNL terminal 276 is grounded. The electron flow from the BL terminal 274 to the SL terminal 272 then creates electron hole pairs near the junction between the source line region 216 and the floating body region 224. Some of the generated electrons are attracted by the vertical electrical field due to the positive voltage applied to the control gate 266 (through the WL terminal 270), negatively charging the floating gate or trapping layer 260.

Figure 49:
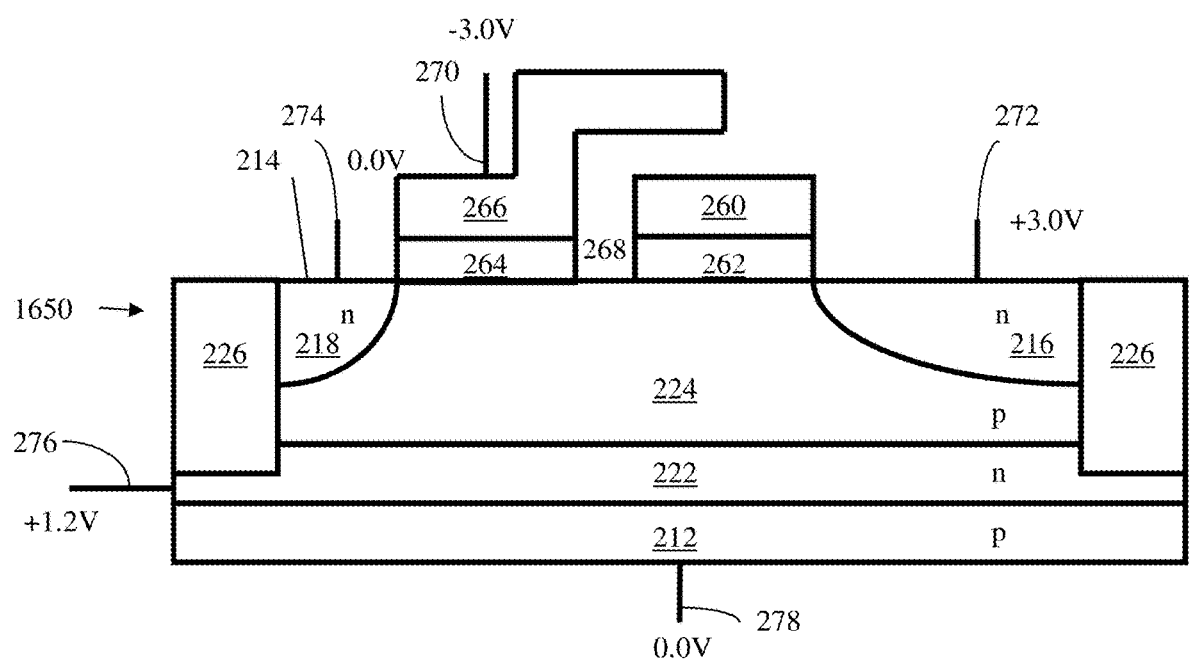
FIG. 49 illustrates bias conditions applied on the terminals of the memory cell shown in FIG. 47 to perform a write logic-1 operation.

FIG. 49 illustrates an example of bias conditions applied to the selected memory cell 1650 for write logic-1 operation: a negative voltage is applied to the control gate 266 (through WL terminal 270), a positive voltage is applied to the source line region 216 (through SL terminal 272), about zero voltage is applied to the bit line region 218 (through BL terminal 274), a positive voltage is applied to the buried layer 222 (through BNL terminal 276), and about zero voltage is applied to the substrate 212 (through substrate terminal 278).

In one particular non-limiting embodiment, about −3.0 volts is applied to the WL terminal 270, about +3.0 volts is applied to SL terminal 272, about 0.0 volts is applied to BL terminal 274, about +1.2 volts is applied to BNL terminal 276, and about 0.0 volts is applied to substrate terminal 278.

The negative bias on the control gate 266 (through the WL terminal 270) and the source line region 216 (through the SL terminal 272) causes band-to-band tunneling, which is also referred to as Gate Induced Drain Leakage (GIDL), which injects holes to the floating body region 224 and increases the floating body 224 potential. This in turn turns on the bipolar device (formed by the bit line region 218, floating body region 224, and buried layer 222), which subsequently increases the current flow through the cell 1650 (from the SL terminal 272 to the BL terminal 274), compared to when the BNL terminal 276 is grounded. The electron flow from the BL terminal 274 to the SL terminal 272 then creates electron hole pairs near the junction between the source line region 216 and the floating body region 224. Some of the generated holes are attracted by the vertical electrical field due to the negative voltage applied to the control gate 266 (through the WL terminal 270), positively charging the floating gate or trapping layer 260.

Figure 50:
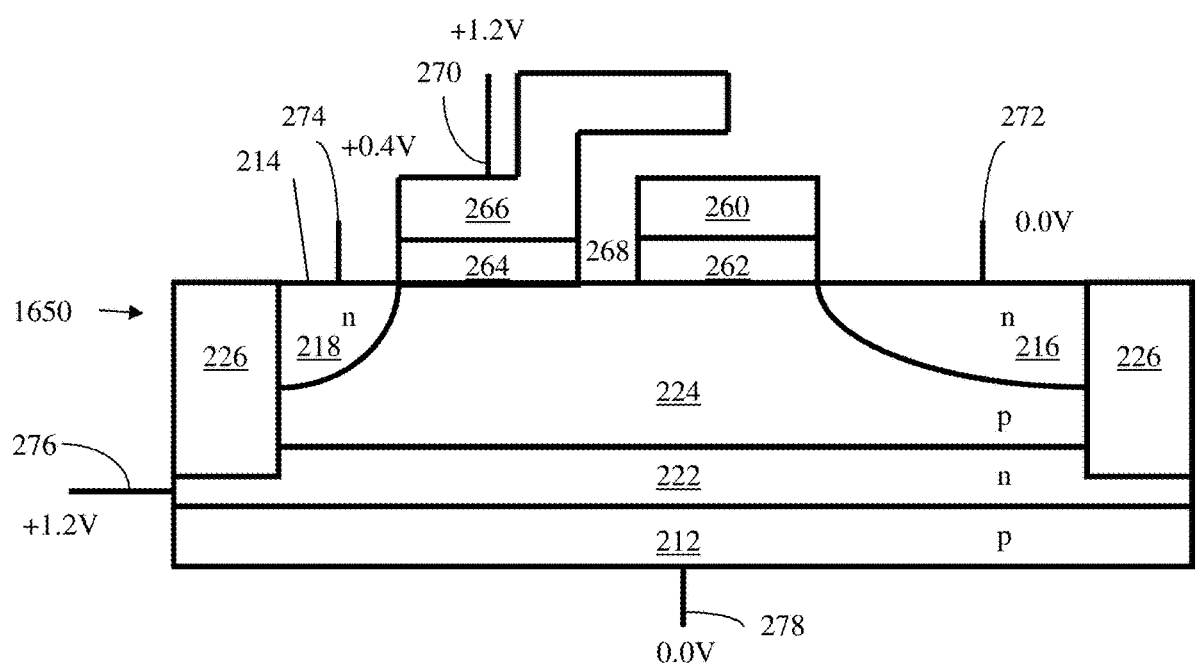
FIG. 50 illustrates bias conditions applied on the terminals of the memory cell shown in FIG. 47 to perform a read operation.

FIG. 50 illustrates an example of bias conditions applied to the selected memory cell 1650 for a read operation: a positive voltage is applied to the control gate 266 (through WL terminal 270), about zero voltage is applied to the source line region 216 (through SL terminal 272), a positive voltage is applied to the bit line region 218 (through BL terminal 274), a positive voltage is applied to the buried layer 222 (through BNL terminal 276), and about zero voltage is applied to the substrate 212 (through substrate terminal 278).

In one particular non-limiting embodiment, about +1.2 volts is applied to the WL terminal 270, about 0.0 volts is applied to SL terminal 272, about +0.4 volts is applied to BL terminal 274, about +1.2 volts is applied to BNL terminal 276, and about 0.0 volts is applied to substrate terminal 278.

Figure 51:
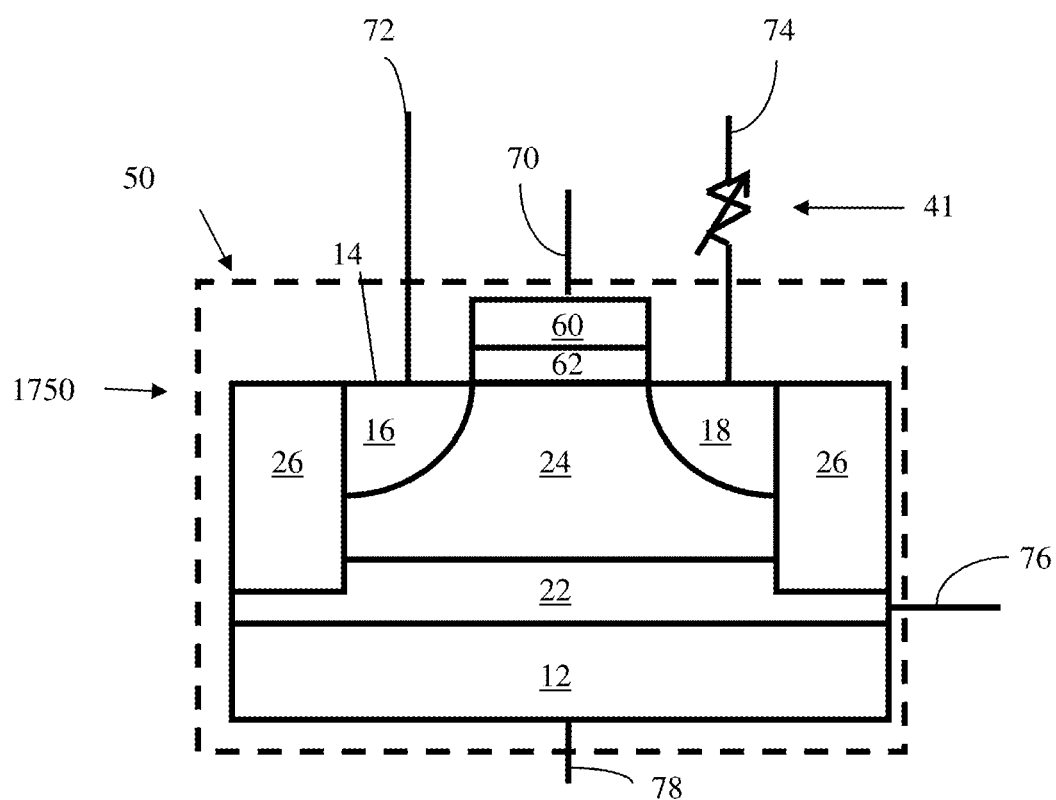
FIG. 51 is a schematic, cross-sectional illustration of a non-volatile memory cell comprising a resistive change element according to another embodiment of the present invention.

FIG. 51 illustrates a schematic cross-sectional view of a memory cell 1750 according to another embodiment of the present invention. Memory cell 1750 is a non-volatile memory cell comprising a resistive change element 41. The resistive change element 41 is shown as a variable resistor, and may be formed from phase change memory material such as a chalcogenide or conductive bridging memory or metal oxide memory, and may take the form of metal-insulator-metal structure, in which transition metal oxide or perovskite metal oxide is used in conjunction with any reasonably good conductors, for example as described in "Overview of Phase-Change Chalcogenide Non-volatile Memory Technology", S. Hudgens and b. Johnson, MRS Bulletin, vol. 29, issue 11, November 2004, p. 829-832, "Phase Change Memory", Wong, H.-S. P. et al., Proceedings of the IEEE, vol. 98, no. 12, December 2010, pp. 2201-2227, "Nanoionics-based resistive switching memories", R. Waser and M. Aono, Nature Materials, vol. 6, November 2007, pp. 833-840, and "Metal-Oxide RRAM", Wong, H.-S. P. et. al., Proceedings of the IEEE, vol. 100, no. 6, June 2012, pp. 1951-1970, all of which are hereby incorporated herein, in their entireties, by reference thereto. The resistive change element 41 is connected to the source or drain region 16 or 18 of the MOS device 50 having a buried layer 22, typically through a conductive element (for example via and metal used to form semiconductor circuits). MOS device 50 is used as a select device for the resistive change element 41.

The state of the memory cell 1750 is determined by the resistivity of the resistive change element 41. The resistive change element 41 is written (from a low resistivity state to a high resistivity state and vice versa) by flowing an electrical current through the resistive change element 41. In the case of phase change materials, this involves the change of the crystallinity of the chalcogenide materials from crystalline state to amorphous state, while in metal oxide materials, this typically involves the annihilation of conductive filaments.

Similar to memory cells 1450-1650, application of back bias to buried layer 22 of the MOS device 50 may turn on the vertical bipolar devices formed by source region 16 or drain region 18, body region 24, and buried layer 22, and enhance the current flow through the MOS device 50. As a result, the write operations of the memory cell 1750 may be enhanced. The increased efficiency of the write operations may be used to increase the operating speed, or to lower the voltage applied for the write operations, reducing the operating power of the non-volatile memory cell 1750.

A resistive change element 41 oftentimes requires a forming process to be performed prior to the initial operation. The forming operation requires a higher voltage or current. Clearly, it is desired to reduce the voltage or current necessary for the forming process. Application of back bias to buried layer 22 of the MOS device 50 enhances the current flow through the MOS device 50 and therefore increases the efficiency of the forming process, thereby relatively reducing the amount of voltage or current that would otherwise be necessary to perform the forming operation.

From the foregoing it can also be seen that a non-volatile memory cell having reduced operating voltage through the application of a back bias has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope of the invention as claimed.

That which is claimed is:

1. A method of selectively operating a semiconductor device as a semiconductor memory device or a transistor with increased on-state drain current, said method comprising:

providing said semiconductor device comprising a substrate having a first conductivity type selected from p-type conductivity type and n-type conductivity type; a buried layer having a second conductivity type selected from said p-type conductivity type and said n-type conductivity type and being different from said first conductivity type; a body having said first conductivity type; a source region and a drain region each having said second conductivity type and being separated by said body; and a gate positioned in between said source region and said drain region; and selectively operating said semiconductor device as said semiconductor memory device or said transistor, wherein said selectively operating comprises:

applying a relatively low voltage to said buried layer to operate said semiconductor device as an ordinary transistor formed by said source region, said gate and said drain region;

applying a relatively high voltage to said buried layer to operate said semiconductor device as said semiconductor memory device, wherein said semiconductor memory device has at least two stable states; and applying an intermediate high voltage higher than said relatively low voltage but lower than said relatively high voltage to said buried layer to operate said semiconductor device as said transistor with increased on-state drain current, said transistor with increased on-state current being formed by said source region, said gate and said drain region.

2. The method of claim 1, wherein said relatively high voltage is sufficiently high to turn on a vertical bipolar junction transistor (BJT) formed by said buried layer, said body and one of said source region or said drain region.

3. The method of claim 2, wherein said intermediate high voltage summed with a voltage applied to said gate is sufficiently high to turn on a vertical bipolar junction transistor (BJT) formed by said buried layer, said body and one of said source region or said drain region.

4. The method of claim 3, wherein said turn on of said vertical BJT acts as a base current for a lateral BJT formed by said source region, said body and said drain region, turning on said lateral BJT and resulting in increased on-state drain current.

5. The method of claim 3, wherein an off-state current, when said intermediate high voltage is applied, is the same as when zero voltage is applied to said buried layer.

6. The method of claim 1, comprising applying zero voltage to said gate and applying said intermediate high voltage to said drain region, resulting in turning off a MOS transistor formed by said source region, said gate, said drain region and said body; and turning on a lateral bipolar junction transistor (BJT) formed by said source region, said body and said drain region.

7. The method of claim 6, wherein switching between on and off of said MOS transistor is controlled by voltage applied to said gate.

8. The method of claim 1, further comprising modulating voltage applied to said buried layer to adjust and trim a skew of said transistor.

9. The method of claim 4, further comprising modulating voltage applied to said buried layer to compensate for change in temperature of said semiconductor device in order to comply with shifts in gate and drain voltages required to turn on said lateral BJT.

10. The method of claim 1, wherein said semiconductor device further comprises a body contact that can be selectively connected to or isolated from said body;
wherein connection to or isolation of said body contact to or from said body is modulated by an amount of voltage applied to said buried layer.

11. The method of claim 10, wherein application of a voltage greater than or equal to a separating threshold voltage to said buried layer forms a depletion region sufficient to isolate said body contact from said body.

12. The method of claim 11, wherein application of a voltage greater than or equal to a separating threshold voltage to said buried layer extends a boundary of said depletion region beyond a bottom of an insulating layer separating said body contact from said body.

13. The method of claim 1, further comprising providing a recombination region in said semiconductor device to reduce transient time between on and off states of said semiconductor device.

* * * * *